US009261310B2

(12) United States Patent
Fried

(10) Patent No.: US 9,261,310 B2
(45) Date of Patent: Feb. 16, 2016

(54) GAS COOLED CONDENSERS FOR LOOP HEAT PIPE LIKE ENCLOSURE COOLING

(71) Applicant: Stephen Fried, Kingston, MA (US)

(72) Inventor: Stephen Fried, Kingston, MA (US)

(*) Notice: Subject to any disclaimer, the term of this patent is extended or adjusted under 35 U.S.C. 154(b) by 298 days.

(21) Appl. No.: 13/863,379

(22) Filed: Apr. 15, 2013

(65) Prior Publication Data

US 2013/0228313 A1 Sep. 5, 2013

Related U.S. Application Data

(63) Continuation of application No. 13/068,029, filed on May 2, 2011, now Pat. No. 8,422,218, which is a continuation-in-part of application No. 12/103,695, filed on Apr. 15, 2008, now Pat. No. 7,957,132.

(60) Provisional application No. 60/923,588, filed on Apr. 16, 2007.

(51) Int. Cl.
*H05K 7/20* (2006.01)
*G06F 1/20* (2006.01)
*F28D 15/02* (2006.01)

(52) U.S. Cl.
CPC ........ *F28D 15/0266* (2013.01); *H05K 7/20336* (2013.01); *H05K 7/20809* (2013.01); *B60L 2240/36* (2013.01)

(58) Field of Classification Search
CPC . F28D 15/043; F28D 15/0266; H05K 7/2029; H05K 7/20336; H05K 7/20672; H05K 7/20809
See application file for complete search history.

(56) References Cited

U.S. PATENT DOCUMENTS

| | | | | |
|---|---|---|---|---|
| 4,515,209 A * | 5/1985 | Maidanik et al. | ........ | 165/104.22 |
| 6,227,288 B1 * | 5/2001 | Gluck et al. | ............. | 165/104.26 |
| 6,810,946 B2 * | 11/2004 | Hoang | ...................... | 165/104.26 |
| 6,889,754 B2 * | 5/2005 | Kroliczek et al. | ........ | 165/104.26 |
| 7,957,132 B2 * | 6/2011 | Fried | ........................ | 361/679.47 |
| 8,422,218 B2 * | 4/2013 | Fried et al. | ............... | 361/679.47 |
| 8,705,236 B2 * | 4/2014 | Uchida et al. | ................. | 361/700 |

(Continued)

FOREIGN PATENT DOCUMENTS

WO WO 2014102402 A1 * 7/2014 .............. F28D 15/04

OTHER PUBLICATIONS

Maydanik, Yury F. et al. "Loop Heat Pipes for Cooling Systems of Servers", IEEE Transactions on Components and Packaging Technologies, vol. 33, No. 2, Jun. 2010, pp. 416-423.*

*Primary Examiner* — Robert J Hoffberg
(74) *Attorney, Agent, or Firm* — Michael Rios

(57) ABSTRACT

A cooling device includes an enclosure housing, an external heat rejection device, a primary cooling system including a loop heat pipe like (LHPL) device. The LHPL device includes an evaporator module, a condenser module, a vapor line, a liquid return line, and a working fluid having a liquid phase and a vapor phase. The evaporator module includes a component-evaporator heat spreader, an evaporator body, and an evaporator-component clamping mean. The evaporator body includes an evaporator outer shell, a working fluid inlet port, several different types of compensation chamber, a working fluid exit port, and an evaporator wick having vapor escape channels. The condenser module includes a condenser coolant inlet, a condenser coolant exit, a condenser condensation channel, a condensation channel working fluid inlet, a condensation channel working fluid exit, and a condensation channel-coolant thermal interface further comprises a coolant passageway.

20 Claims, 39 Drawing Sheets

(56) References Cited

U.S. PATENT DOCUMENTS

2012/0137718 A1* 6/2012 Uchida et al. ............... 62/259.2
2012/0198859 A1* 8/2012 Sepulveda et al. ............... 62/3.1
2013/0206369 A1* 8/2013 Lin et al. .................. 165/104.26
2014/0190667 A1* 7/2014 McGlen et al. .......... 165/104.26

* cited by examiner

GAS COOLED CONDENSERS FOR LOOP HEAT PIPE LIKE ENCLOSURE COOLING

CROSS REFERENCE TO RELATED APPLICATIONS

This application is a second Continuation-in-Part filed on Apr. 15, 2013 of a first Continuation-in-Part of U.S. application Ser. No. 13/068,029, filed on May 2, 2011, now issued as U.S. Pat. No. 8,442,218, issued on Apr. 16, 2013, which claimed priority to U.S. application Ser. No. 12/103,695, filed on Apr. 15, 2008, now issued as U.S. Pat. No. 7,957,132, issued on Jun. 7, 2011, which claimed priority to U.S. Provisional Application 60/923,588, filed on April 16, 2007; the first Continuation-in-Part of U.S. application Ser. No. 13/068, 029, claims priority to U.S. Provisional Application 61/327, 659, filed on May 24, 2010; the disclosures of which are hereby incorporated by reference in their entireties.

TECHNICAL FIELD

The disclosure relates generally to devices and methods for cooling electronics housed in enclosures and specifically to loop heat pipe like devices.

BACKGROUND

A way that may be employed to efficiently cool servers found in data centers as well as workstations that contain electronics housed in enclosures which employ Loop Heat Pipes, Capillary Pumped Loops and similar passive heat transfer technologies to cool the primary heat loads in such enclosures and which may also employ a combination of other methods to cool the secondary heat loads produced by the devices in these enclosures. We refer to devices which combine features of Loop Heat Pipes, Capillary Pumped Loops and Advanced Loop Heat Pipes as Loop Heat Pipe Like (LHPL) devices.

The cooling of electronics housed in enclosures has for many years been dominated by methods that were much more concerned about getting the job done than the energy it took to get the job done. Methods for improving the efficiency of electronic cooling using passive heat transfer such as heat pipes have been available since at least the Manhattan project, yet have only become inexpensive with the advent of commodity CPUs that rejected 40 or more Watts. These standard heat pipes are typically used to distribute heat from intense electronic sources that employ heat spreaders to reduce the intensity which then use heat pipes to distribute rejected heat to a set of fins. The main purpose of the heat pipes was to reduce the thermal resistance of the thermal conduction path between the heat spreader and the midpoint of the fins. In the case of air cooled LHPLs, they often end up doing the same thing, except that they make it possible to move the heat to locations where there is little room for large fins to room in enclosures where there is much more room for a large set of fins, or to a location along one of the walls of the enclosure making it possible to remove the heat using less powerful fans and rejecting the heat outside of the enclosure before it can recirculate heating the air coming into the enclosure. There are other advantages to using LHPL devices that include removing heat from very intense sources that can't be effectively cooled by ordinary heat pipes as well as the ability to replace air with a liquid coolant, which can reduce the thermal resistance of air cooled devices by a factor of 3 or more. This disclosure employs passive closed loop heat transfer devices that can dramatically improve not only the energy efficiency of electronic cooling but also makes it possible to cool devices that reject 500 or more Watts mounted on densely packed printed circuit boards and in the case of a data center reduce the energy required to cool it by 80% or more!

The devices at the heart of this disclosure are Loop Heat Pipes, Capillary Pumped Loops and derivatives of Loop Heat Pipes that can include devices like pumps in the condenser lines that reduce the temperature of the devices being cooled. We lump all these devices together into a category we define as Loop Heat Pipe Like (LHPL).

In general the LHPLs employed provide the best energy efficiency of any electronic cooling device ever invented. Not only are they passive, but their ability to reject heat to new locations is often measured in meters while employing condenser pipes (often less than 3 mm) that make it possible for them to move heat out of congested spaces to condensers that may reject heat to condensers that feature large heat transfer areas rejected to coolants such as air and water. And it is this ability to transport heat to new locations in an enclosure and then pass it through a reasonably long pipe to a condenser which employs a large heat transfer area that makes it possible to efficiently transfer the heat being rejected by tiny hot spots in semiconductors to secondary coolants that remove the heat to cooling loops that ultimately reject waste heat to the outside world. It is also this ability to distribute the primary heat load over large areas that makes it possible to create very efficient counter flow heat exchangers that retain the quality of the heat and make the total heat transfer process so efficient. It is the low total thermal resistances of these devices that make it possible to produce LHPLs whose overall thermal resistance is only 0.15° C./Watt and that have a heat transfer coefficient of 0.15° C./(Wcm$^2$). In the case of a 100 Watt CPU whose LHP condenser was cooled by water at 30° C. the output from the condenser turned out to be 47° C. with the CPU running at a heat spreader temperature of 59° C. Translated into practical terms, employed in the 1 U rack mount chassis that dominate modern data centers, this device makes it possible to remove the heat directly from a server housed in a rack cabinet and move it directly back to the cooling tower in the data center. In the process, the noisy fans in the racks that produce many points of failure and may consume as much as 30% of the energy being used by servers along with the main CRAC unit blowers and water chillers that consume 35% of the total power employed by the data center end-up getting cut out of the cooling process. The temperature we chose to cool these LHPs with, 30° C. was chosen based on ASHRAE tables, and the performance of commercially available evaporative cooling towers. This temperature turns out to be the temperature of the coolant that this type of cooling tower will produce running in Atlanta, Ga. on the hottest and most humid day of the year. A quick comparison of the power consumption at institutions like Lawrence Livermore National Labs suggests that:

TABLE 1 Electronics 50% Water Chiller 25% Air Blower 10% 1 U fans 9% UPS 5% Lighting 1% changes to this:

TABLE-US-00002 Electronics 83% 1 U fans 1.6% Cooling Tower Pump and fan 5% UPS 8.3% Lighting 1.6%

Which is to say the total power consumed by the data center goes down by 40%.

The same energy benefits that accrue to data center cooling also accrue to the general cooling of all electronic enclosures that are air cooled, but to a lesser extent, for the simple reason that air is a much poorer heat transport medium than the chilled water that gets employed to move heat from servers that are cooled with it back to the water chiller or in the best case cooling case we have run up against, the data center cooling tower. At the head of the list of benefits in addition to reduced energy costs are huge reductions in noise, the elimination of heat arriving at the walls of enclosures that can be so hot that it is almost possible to get burned touching them, the frequent failure of rotating cooling components including fans and pumps (in the case of pumped liquid cooling) which now occur so often that the systems that employ them have to mount them so that they can be easily swapped out without turning the machine off along with the ability to reject heat loads from devices that produced 500 or more Watts and to cool efficient devices such as CPUs and GPUs mounted in laptops where improved energy efficiency can improve battery life.

To appreciate the benefits of employing LHPLs to cool electronic enclosures, including air and water cooled electronic devices used to do everything from control the operation of space vehicles to reject heat to the cooling towers of data centers, it is first necessary to recite the goals of this disclosure, which were to efficiently cool electronic enclosures in which semiconductor devices that rejected large quantities of heat (greater than 50 Watts) mounted on densely packed PCBs along with devices that shared the same enclosures that rejected the balance of the heat but did not provide a dense source of heat. In the case of air cooled enclosures housed in rack mounted chassis, we wanted to make the first goal achievable while at the same time improving the quality of heat being rejected to the data centers CRAC system. In cases where liquid cooling, including chilled water was available on the data center floor, our goal was to reject high quality heat all the way back to the data center cooling tower, on a year round basis in most localities in the world. To achieve these goals, we employed LHPLs, some of whose other outstanding properties in addition to the fact that they are passive devices, turns out to be that the eliminate most of the electric motors, fans, blowers, compressors and other rotating devices found in servers and throughout the data center that end up making noise, contribute to frequent server failures and cost money to maintain and operate.

These goals don't get met without skepticism from prior art and other technologies, so we will now address the advantages of our approach in detail, while at the same time laying out the critical items that need to be overcome to reach our goals.

There are a large number of technologies that have been recently investigated whose main purpose has been to improve the heat transfer capabilities of devices that may be used to cool semiconductor devices that reject large quantities of heat. LHPLs continue to remain as good as or better than these other devices. We will examine just a couple of the higher end sensibly cooled heat exchange technologies: microchannels and jet impingement. Microchannels require a liquid under pressure, usually pump driven and drive the liquid across a channel which extracts heat from the processor's heat spreader. The contact areas that may be achieved with these devices is less than the wick areas provided by LHPLs which means to provide equivalent cooling, they need to make up for the fact that LHPLs absorb a factor of 100 as much heat per gram of coolant than they typically do. As a consequence, they end-up leaving the region of the device at higher velocities and at much colder temperatures. It is also very difficult for them to provide uniform cooling across the entire heat spreader for the simple reason that they do not uniformly expose the heat spreader to a uniform flow. Jet impingement, on the other hand does expose the surface to a more uniform flow, but because of a characteristics of the way in which jets interact with surfaces along with the fact that the heated water has to be quickly removed from the region of contact, a fair amount of mixing goes on, again reducing the temperature of the resulting effluent. The heat transfer coefficient of the LHPs employed in our experiments was $0.15°$ C./Wcm$^2$. This state of the art performance makes it possible to cool semiconductor dies whose are 1 inch squared and reject as much as a kilowatt. It is possible that jet impingement may be able to cool devices that reject more power, simply because of the energy that they may eject into the flow employing pumps. But, for now at least, what we have just demonstrated is that for all of the semiconductor devices that are available or likely to become available, this technology not only may reject as much energy as the competitors, but do it without requiring additional energy and at the same time producing effluents whose heat quality is excellent.

The critical role that LHPLs perform in the removal of heat from hot semiconductors, is they make it possible to remove large quantities of it, using small devices that can be packed into small locations and while at the same time providing rejection distances that make it possible to locate large efficient condensers that may employ counter-flow designs at locations in the electronic enclosure where that heat can be exchanged with either air or water. That being said, the next most important feature of the technology that this disclosure brings to the table is methods that make it possible to maintain the quality of that heat as long as possible, whether it be exchanger with air or a chilled liquid. This is a crucial part of the design approach to the heat transfer problem that we have taken.

The method we will use to greatly improve the overall coefficient of performance (COP) of the data centers cooling is by eliminating the majority of the motors typically employed to cool a data center. For this feat to be realized, it becomes important to maintain the quality of the heat being rejected by the rack cabinets that the data center may use to contain its server units.

One of the big problems in energy conservation is underestimating the important role that the quality of the heat being rejected to the final cooling device in major thermodynamic systems plays in the overall cost of buying and operating such systems. Reducing the quality of the heat too much in the case of coal fired power plants results in the sulfuric acid condensing out in them so fast that they have to be frequently replaced. In the case of a clean large multi-megawatt fuel cell power plant, extracting too much energy from the exhaust flow ends up driving the cost of the energy and the fan required to cool the plant up to the point where the savings get lost. The implication for data center cooling is, keep the quality of the heat up, unless you want to spend a lot of money rejecting it at the cooling tower. In existing systems, the cost of rejecting it at the cooling tower consumes 25% of the cost of running the data center, i.e., running a water chiller.

The naive approach to the use of passive heat devices suggests that like the extra cooling loops that currently consume close to 35% of the energy required to run a data center, simply stringing a series of these devices in a row, ought to be able to solve the cooling problem, without even using a cooling tower. As it turns out, a sequence of such devices will operate less efficiently than a single large Loop Heat Pipe, whose condenser line moves the heat the same distance, simply because a sequence of these devices will end up losing energy at each point of contact that connects the devices. And, since the effective driving range of the LHPs used to cool the semiconductor devices we are working with is several meters, the bottom line is that unless the cooling tower you are planning to use is in the immediate vicinity of the server you are cooling, stringing passive device together does not buy very much, but does just like the sequence of cooling loops currently employed, does dramatically degrade the heat you are attempting to reject. So, the ground rule for employing LHPLs employed to cool semiconductors turns out to be, exchange the energy with another secondary coolant, preferable one in the liquid state, as quickly as possible, if your goal is to use that coolant to drive a cooling tower directly, or to employ that heat in a cogeneration scheme or if it is simply to return air to a CRAC units heat exchanger at the highest possible temperature, thereby improving the efficiency of even an air cooled data center.

Having rejected the heat from the primary heat load in our electronic enclosure with the highest possible quality to either an air or in the case of a liquid, most likely chilled water, our goal now becomes to move it to the outside world with the smallest loss in energy. However, while doing that, we also need to consider how our LHPL primary heat removal solution interacts with the rest of the devices we use to gather up heat from the enclosure.

In data centers in which the average rack cabinet only consumed 5 KW, the fans on the rear of rack cabinets were a convenient way to help cool the contents. However, their main function at today's power levels of 20+ KW is mostly to hide the unsightly cables that drape the servers contained in the cabinet. A significant portion of the air being drawn through a typical rack cabinet ends up being drawn around the stack of server chassis within and often the asymmetric flows within the cabinet can result in eddies that circle back to the front of the cabinet near the top, heat up the top servers by as much as 15 degrees F. To get around that problem fans can be added to the top of the rack cabinet and baffles inserted between the servers and the side panels. A better way to employ such fans, is simply to insert a duct in the cabinet that can be used to gather up all the air from the rack mounted chassis and exhaust it out the rear of the cabinet by connecting it the fans on the rear door or out the top using fans mounted on the top panel or possibly to the CRAC units return air flow ducting. To make sure that this duct does what it is intended to do, a mechanism has been provided in the disclosure to seal the chassis to the duct and at the same time make sure that in the event that a chassis is not installed the duct does not leak. Furthermore, to help solve the problem of potential leaks in situations where direct chilled water is being employed within the rack cabinets, the duct can be used to contain the chilled water manifolds that serve the rack mount chassis. Finally, to make it possible for the air being removed from the rack to be reused without having to make the long trip back to the CRAC units blower, simply inserting chilled water air heat exchangers in the exit path from the rack mount chassis to the duct, makes it possible to eject the air from the cabinet at the ambient air temperature of the room. This strategy has a number of benefits of other approaches to the cooling of high power rack mount chassis that employ water cooled air heat exchangers within the rack cabinet. Besides taking up much less space in the rack cabinet, and making it possible to employ distributed heat exchangers whose total area is much larger than the ones employed by other solutions, it also reduces the total high speed fetch that the air has to make. And in the process, the amount of energy that gets injected into air flow ends up being minimized.

Reducing the energy employed moving air is one of our overall goals. When we have to do it, our goal is to move the air the smallest distance at the smallest possible speed that gets the cooling job done. The reason for this is quite simple, energy losses due to drag scale as the velocity of the air cubed multiplied by the distance it travels. Keeping the velocity and distance down, makes an enormous difference in the energy consumed by the fans driving the serves, rack cabinets and the data center itself. The technology we employ cuts down on these losses three different ways. First, when exchanging energy between air and either the primary coolant being chilled in a condenser, or a chilled liquid that is cooling it, employing finned condensers that have large areas, which our technology enables by doing things like moving the heat being rejected out of tight spaces, ends up reducing the velocity of the air required. Next, by moving air the smallest distances possible, which we make possible by picking up secondary heat sources in 1 U sealed rack mount chassis (which reduces the distance and velocity needed) or by cutting down on the distance that air needs to flow at high velocities when it is being cooled by a negative pressure duct, or by completely eliminating the need for the air to travel back to the data center's air heat exchanger, we make large reductions in the amount of energy that needs to employed by air fans and blowers. This strategy plays an important role in our energy conservation effort, and is embodied in both our sealed chassis and sealed duct designs.

The final energy reduction principle that needs to be taken into account that out embodiment improves is water condensation. In some data centers, as much as 40% of the energy being employed by water chillers gets used to remove (by condensation) water vapor from the cooling flow which then, apparently needs to get added back into the flow to keep IT people wandering through the data center happy. It turns out that there no longer is an electrical static discharge (ESD) requirement on the minimum air content of the air being employed in data centers, which basically means that keeping the relative humidity below the point where condensation occurs in the equipment can now be achieved by simply making sure the dew point of the air in the systems being cooled is less than the temperature of the liquid coolant being employed to cool systems, saving roughly 10% of the energy employed to cool some data centers, especially those in humid localities.

Our sealed chassis embodiments make this possible by keeping the dew point of the air inside of the rack mount chassis below the temperature of the coldest liquid coolant employed. This is simply accomplished in an embodiment in which we pass slightly pressurized air through a cold trap that removes excess water from it before slowly bleeding it into the "sealed" chassis, that are allowed to slowly leak air back to the ambient, at a rate that guarantees that the average air content of the chassis remains dry enough to avoid condensing if and when it comes into contact with chilled surfaces.

When it comes to cooling air cooled enclosures in general, LHPLs make it possible to make great strides in efficient uniformly distributed air cooling, by the simple act of placing the LHPL condenser at the point in the chassis where the air flow is normally exhausted out of the chassis. In the two enclosures we have studied, 1 U rack mount chassis and desktop cooled chassis, the fans that are employed on the exterior surfaces of these chassis have provided high enough flow rates to in the case of a 1 U chassis only require a single blower (already employed to pull air out of the chassis) to cool a pair of 120 Watt processors (it normally takes four to eight 1 U fans to accomplish the same task) and a single 120 mm fan running at just 1800 RPM to cool a 500 Watt CPU sitting in either the PCIe bus of the system. In all of the chassis we have examined, including the 4 U chassis employed to cool four to eight Opteron multi-core processors, the existing fans on the rear wall of the chassis that we have examined have more than enough cooling fans to make it possible to cool all of the processors, without the need for CPU fans. Which is to say, all of the chassis tested, when their CPUs were cooled using LHPLs, could get by without the need for CPU cooling fans. Not only that, the CPUs that were being cooling in situations like the 4P/8P chassis, normally require very high air flow rates even with cooling fans that fit into 2 U tall spaces simply because the CPUs in the front row end up heating the air used to cool the rear row of processors. This problem goes away with LHPLs, making it possible to actually reduce the air flow rates on the rear wall while at the same time eliminating the four to eight fans typically used to cool processors. And, while we can't claim that air cooling does as good a job as water cooling, we have gone about as far as you can go with air cooling to maintain the quality of the heat being rejected. In addition to providing sealed ducts, more uniform distribution of cooling air across the chassis and the reduction of the ambient temperature within the chassis, we have also introduced LHPL condenser designs which employ counter-flow cooling, which results in increased exit flow air temperatures which in turn end up improving the efficiency of an air cooled data center's water chiller.

When it comes to liquid cooling, the embodiments provided make it possible to employ LHPL cooling with condensers that are either directly or indirectly cooled with chilled liquids including water, safely. A new method for interfacing all closed loop passive heat transfer devices to chilled liquids has been introduced which employs a cold plate along with what we call a cold spreader (that is thermally attached to the LHPL working fluid's condenser lines) that comes into contact with the cold plate when a rack mount chassis gets installed inside of a rack cabinet. This interface, while not quite as efficient as the directly cooled interface we are about to describe, in certain situations, like blade and COTS Single Board Computer (SBC) situations, makes it possible to cool these devices as well, without using the quick disconnects that direct chilled liquids require. To improve the quality of the heat being rejected by these split condensers, a counter-flow version is also embodied and examples are provided of how to employ the cold plates that are a component of a split condenser to also cool air that is either circulating within a sealed chassis or being passed through a chassis that is being evacuated either by internal fans or a negative pressure air duct.

The most efficient cooling that we believe can be obtained using LHPLs comes when they are cooled directly with chilled liquids housed in a sealed enclosure in which the remainder of the components within the enclosure are being cooled by either liquid cooled cold plates, air that is circulating about a chassis that includes cold plates that cool it and the PCBs in the chassis and that is driven by low energy fans or blowers or air that is being circulated through the sealed chassis that passes through a chilled liquid air heat exchanger that may be a part of a component that includes the LHPL's condenser. The condenser design that we created that did the best job of producing high temperature effluent employed counter-flow heat exchange and used a chilled water jacket that was made of a material that does not readily conduct heat in addition to employing a helical wire that was thermally attached to the serpentine shaped condenser pipe, forcing the liquid to take a longer path and simultaneously increasing turbulent flow.

The final claim in the disclosure is for a data center cooled with the afore mentioned devices in which the servers in the data center room is directly attached to the cooling tower, eliminating the need for air ducting, special insulation in the walls of the data center (to keep humid air out), the need for an air blower and finally the water chiller employed by the air blower, in localities in the United States, when on the hottest most humid days of the year, an evaporative cooling tower will return water to the data center room that is at least 30 C, which is to say for most locations as hot and humid as locations like Atlanta Ga., 365 days of the year.

Definitions Used

Loop Heat Pipe (LHP)

A Passive two phase heat transfer device that consists of an evaporator that contains a compensation chamber and a wick with escape channels on one side that receives heat from the device being cooled which causes a working fluid to change phase on the inside of the escape channel walls producing vapor phase coolant that leaves the evaporator passing through a vapor line to a condenser where the vapor passes through a condensation channel that may be cooled by a gas or liquid causing it to change phase back to a liquid and dumping the rejected heat into the cooling gas or liquid before it returns to the evaporator through a liquid return line that may pass through a compensation chamber located within the evaporator between the evaporator's inlet and the side of the wick facing the evaporator inlet. The device being cooled is typically thermally mounted to the evaporator shell which encloses the wick in the region of the wick that contains the escape channels.

Loop Heat Pipe Like (LHPL)

A device that may contain any of the ingredients of a Loop Heat Pipe or Capillary Pumped Loop as well as an additional derivative feature such as a pump at any point along its condenser path designed to either increase the working pressure of the working fluid leaving the pump or extending the length of the lines. An LHPL may contain one or more compensation chambers that can lay within the evaporator, attached to the evaporator, inline in the liquid return line or attached to the liquid return line at any point along it.

Capillary Pumped Loop (CPL)

A device that contains all of the ingredients of a Loop Heat Pipe but in which the compensation chamber is no longer situated within the evaporator between the inlet and the wick, but at some point along the liquid return line.

LHP Compensation Chamber

A volume situated between the liquid return line inlet of an LHPL evaporator module and the evaporator wick which distributes returning liquid to the wick and whose volume is large enough to impact the performance characteristics of the LHPL. See description of FIGS. 3 and 4.

Internal Compensation Chamber (ICC)

Identical to LHP Compensation Chamber, a volume placed along the liquid return path of an LHPL which is contained by the region within the evaporator module where returning liquid is received.

An Undeclared Compensation Chamber (UCC)

An ICC whose volume is too small to impact the performance of the LHPL. This can arise in situations where there is not enough room to place a large enough volume within the evaporator to compensate for the length of the vapor and liquid lines which prevents it from impacting the performance of the LHPL. See description of FIGS. 3 and 4 as well as detailed discussion of FIG. 4.

Liquid Return Path

The path that liquid returning from the condenser to the wick within the evaporator module takes which includes the liquid return line that connects the condensation channel exit with the evaporator inlet and the region between the evaporator module inlet and the exposed surface of the wick inside of the evaporator module body.

External Compensation Chamber(ECC)

A volume connected to the liquid return path which extends from the condenser outlet to the evaporator wick that connects a volume to either the liquid return line or to the evaporator shell using a small length of tubing. This is the form of a compensation chamber.(CC) that normally is associated with Capillary Pumped Loops (CPLs). See description of FIGS. 3 and 4.

An INLINE Compensation Chamber (ILCC)

A volume inserted into the liquid return line that is primarily used to compensate for the differences in the length of the lines used to interface evaporators and their condensers cooling a system that has several primary heat rejecting components. See description of FIGS. 3 and 4.

Standard Heat Pipe (HP)

A sealed tube that is lined with a wick that contains a working fluid that receives heat at one end called the evaporator, causing the working fluid in the wick to change phase and enter the empty center of the tube which allows the vapor produced by the heat to flow to the other end called the condenser where a coolant receives the heat and causes the working fluid to change back to a liquid which then gets carried by the wick lining the walls back to the evaporator end of the sealed tube.

Two Phase Passive Heat Transfer Cooling Devices

LHPs, LHPLs, CPLs, HP, Thermo siphon and any similar device

Two phase Heat Transfer Cooling Devices

Any device that is a member of the Two Phase Passive Heat Transfer class of devices plus any device that transfers heat between an evaporator and a condenser that employs a pump to affect the motion of the working fluid.

Primary Heat Load and Components

The devices within an enclosure whose cooling is facilitated by LHPL devices.

Secondary Heat Load and Components

The devices within an enclosure that are not being cooled using an LHPL device.

Thermally Attached

Techniques which connect a pair of thermally conducting devices together which improve heat transfer between the two such as soldering, the employment of heat conducting epoxies and thermal transfer products that use solids and pastes along with the use of clamping pressure and surfaces that are polished flat.

Heat Sink

A finned device made of a thermally conducting material such as copper which typically has solid "base plate" on one side to which a set of fins have been thermally attached, the base plate acting as a heat spreader that conducts incoming heat from the device being cooled to the fins which typically reject the heat passed to them to the air flowing through the fins.

Laminar Flow Disruptor

An obstacle placed along the wall or center line of a conduit carrying a gas or liquid which causes the boundary layer flow along a wall of the conduit to mix with the flow at the center of the conduit.

PCB

Printed Circuit Boards (PCB) are currently multi-layer devices consisting of insulating plastic materials that have circuits etched on both of their sides prior to being glued together using copper Vias that connect the etch on their surfaces together providing the "nets" that connect components soldered to the outer layers of the boards to each other. PCBs often employ extensive areas of copper plating that are used to provide the power and ground planes that are required to enable high speed circuits to function. A 12 layer PCB will often employ 6 of these copper ground planes, providing a mechanism for gathering secondary heat from components soldered to the board. These copper planes often play a crucial role in the cooling of the components that receive power and grand from them, by virtue of the fact that high power devices like CPUs can consume over 100 Amps at voltages of 1.2 volts (which is how said CPUs can end up rejecting over 100 Watts!) while often employ 1,000 or more pins that make connections between their BGAs (ball grid arrays) and the PCB which are made using said copper vias, half of which are used to provide the silicone die with power and ground. The Vias that connect these pins to the internal power and ground copper end up playing an important role in the cooling many high power circuits including MOSFETs, which makes it possible to collect rejected secondary heat by simply placing a cold beneath a PCB.

SUMMARY

Methods were disclosed which make it possible to employ Loop Heat Pipe, Capillary Pumped Loops and other passive closed loop heat transfer devices to cool electronic components housed in electronic enclosures, including rack mount chassis housed in rack cabinets, desktop computers, COTs computers, telecommunications equipment, electronics employed in vehicles and virtually any electronic enclosure one can imagine in which either a chilled gas or a chilled liquid can be provided to cool the enclosure.

The resulting methods made dramatic reductions in the amount of energy employed to cool electronic components housed in electronic enclosures while at the same time making dramatic improvements in other operating characteristics, including reliability, the amount of heat being reject to the outside world, the amount of noise produced, the size of the power supplies needed to power units, the cost to build and operate data centers and last but not least, the ability to cool very hot electronic devices housed in electronic enclosures that are densely packed.

The embodiments included designs for LHPL condensers, including air and water cooled condensers that employed counter-flow techniques, LHPL CPU heat spreaders, sealed chassis and sealed air ducts, methods for controlling the vapor content of air within sealed chassis, methods for connecting chilled liquid sources to condensers including split condensers that eliminate the need for quick disconnects and quick disconnects that are shielded from the chassis being cooled by a duct.

The methods included embodiments that make it possible to cool the majority of the data centers operating in the United States without having to employ either air blowers or air chillers 365 days of the year, reducing the acquisition costs significantly while at the same time reducing the energy consumed by 40% or more.

BRIEF DESCRIPTION OF THE DRAWINGS

The drawings are illustrative embodiments. The drawings are not necessarily to scale and certain features may be removed, exaggerated, moved, or partially sectioned for clearer illustration. The embodiments illustrated herein are not intended to limit or restrict the claims.

FIG. 14 demonstrates how it is possible to employ one or more Cylindrical evaporators mounted to a single heat spreader that receives heat from the device or devices being cooled and distributes this heat to one or more evaporators it is in thermal contact with.

DETAILED DESCRIPTION

Figure 1:
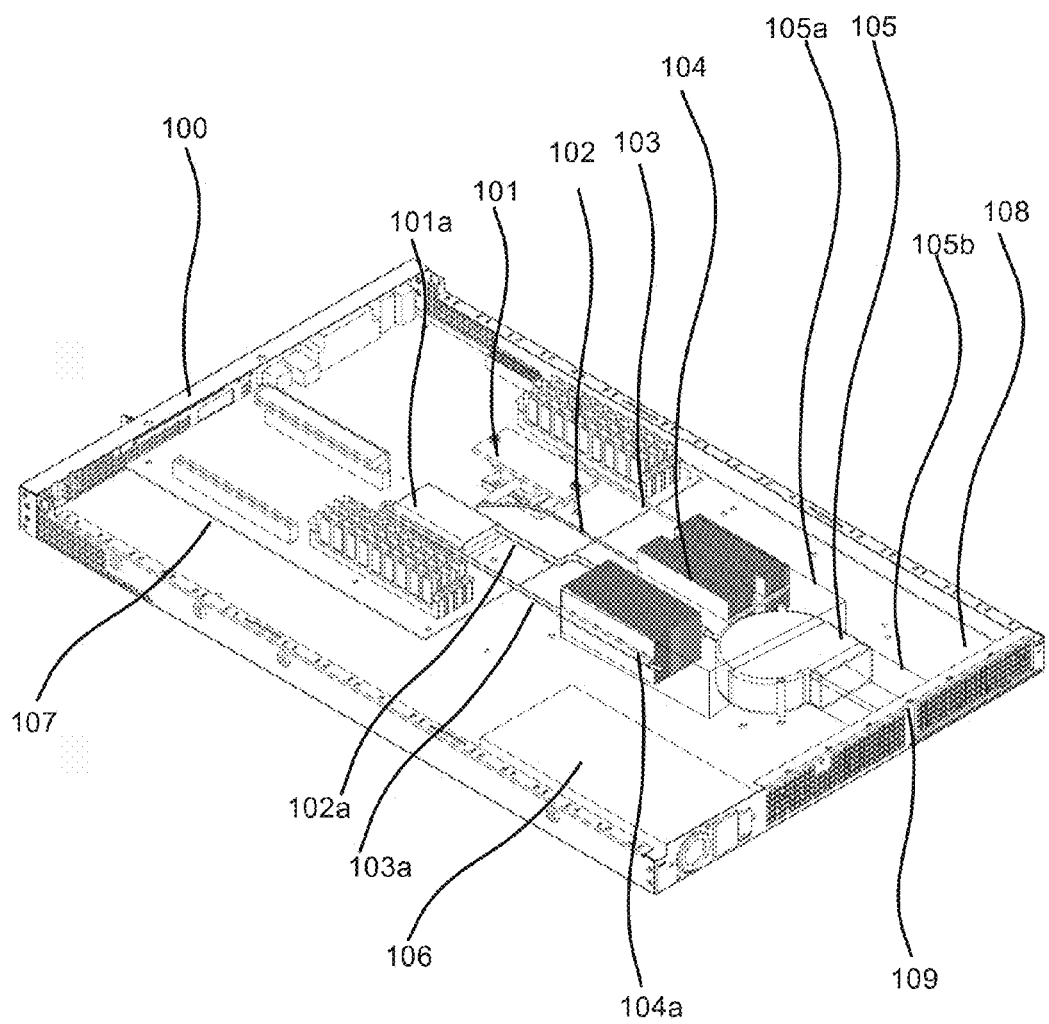
FIG. 1 is a perspective representation of an exemplary embodiment of an air cooled 1 U rack mount chassis that employs an Ammonia Nickel Loop Heat Pipes and a Copper Water Loop Heat Pipe to cool a pair of CPUs.
Figure 2:
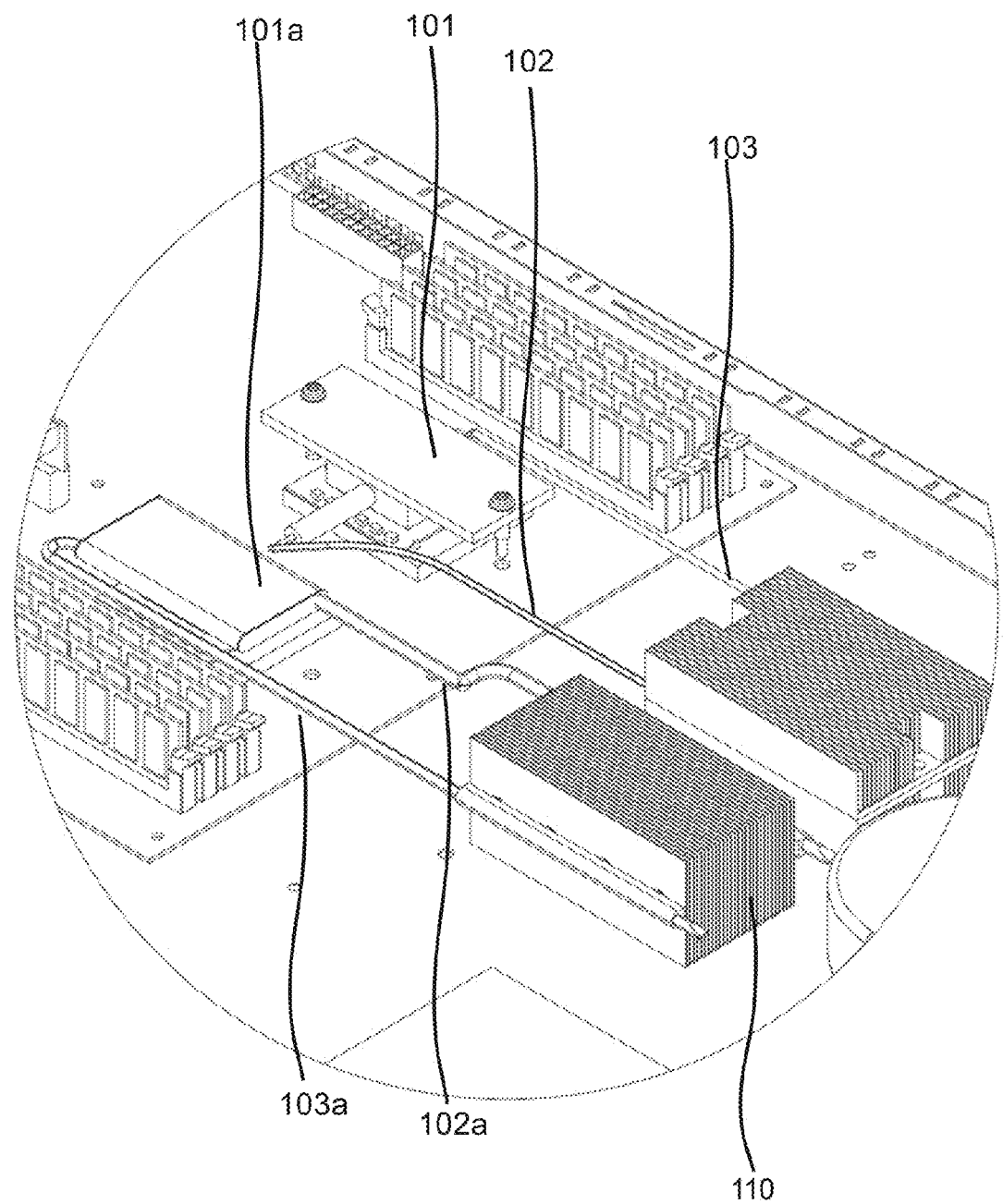
FIG. 2 is a perspective representation of the design shown in FIG. 1 shown in greater detail.

Referring in FIG. 1 of this disclosure, this figure provides a perspective representation of an exemplary embodiment of a "18 inch 1 U rack mount chassis" 100 that employs a pair of LHPLs to cool a pair of hot running CPUs. FIG. 2 are perspective representations of the same design shown in greater detail. Many of the drawings and figures include oblique perspective 3D views of full scale devices that we have experimented with or modeled and were designed to prove the concepts contained in this document. Frequent reference will be made to the specific exemplary embodiments presented of devices that demonstrate the principles claimed, but it is to be understood that the claims and inventions are not limited to the specific exemplary embodiments used to demonstrate the claims and concepts. Nor are the Loop Heat Pipe Like devices referred to limited to Loop Heat Pipes or for that matter the Ammonia Nickel Loop Heat pipes or Copper Water Loop Heat Pipes shown in the majority of the figures, but can include other Loop Heat Pipes made of different materials that employ different working fluids that have been described in prior art and publications as well as devices that don't either don't employ compensation chambers or whose compensation chambers are located outside of the evaporator along the liquid return path, including compensation chambers inserted in the liquid return line or connected to the liquid return line by a tube or connected by a tube to the evaporator module near the point where the liquid return line enters the evaporator module.

Contained within the 1 U rack mount chassis 100 is a pair of CPUs that are mounted on a PC server motherboard 107 that are being cooled by a pair of LHPs in this exemplary embodiment one of which is an exemplary embodiment of a high pressure LHP that employs a cylindrical shaped evaporator module and is employed with high pressure working fluids such as Ammonia, whose evaporator 101 is thermally attached to the CPU being cooled and whose working fluid is being cooled and condensed from a gas back into a liquid by the a condenser 104 using a cool gaseous flow that typically employs but is not restricted to air being pulled through the condenser fins by an "exit blower" 105 that is one of the devices normally employed to pull air through 1 U chassis. The device being used to pull air from a chassis can also be a 1 U fan or any other form of air moving device, even devices placed external to the 1 U chassis. This exemplary embodiment illustrates how the existing fan that comes with a 1 U chassis can also be used to cool a pair of CPUs using a condenser whose details are discussed below. This figure also calls out the condenser line 103 that returns the condensate back to the evaporator and the condenser line 102 that transports vapor from the evaporator to the condenser. The sharp angle shown in the drawing where the condenser line 102 attaches to the evaporator body 101, in the devices we used, was rounded. The second CPU is being cooled by a Copper Water LHP whose evaporator module 101a that feeds a vapor line 102a that transports the water vapor to its condenser 104a returning liquid water in line 103a. Future figures will detail the differences between both of the condenser designs, 104 and 104a detailed here. The particular air cooled condenser designs are especially good. In an ideal LHPL half of the thermal resistance is contributed by the evaporator and the other half by the condenser. However, this efficiency level can only be achieved by liquid cooled condensers. In air cooled condenser the heat has to travel a significant distance through a good conducting metal (typically copper) before it arrives at the midpoint of the fin that rejects the heat to air or a gas flowing between the fins. As a consequence, the thermal resistance of an air cooled will typically be a factor of 3 or more greater than a liquid cooled one, so it becomes important to minimize the thermal resistance of the condenser fins. This is accomplished by reducing the thermal resistance between the condenser tubing and the fins and to reduce the distance the heat has to travel to get to the fin midpoint. The designs shown both have especially low thermal resistance and are detailed below along with another trick used to improve their performance. This figure points out the differences between evaporator modules intended to handle working fluids that at the temperatures that most of the devices we plan to cool are either at high pressure like Ammonia which require cylindrical evaporators to contain the working fluid while working fluids that run in the vicinity of one atmosphere like water (which typically will be at pressures of half an atmosphere) can be handled by flat oval evaporators, providing of course that both types of evaporators are excellently sealed and do not permit even trace quantities of other chemicals to enter the device over the lifetime of the device. Also called out in this figure are the power supply 106, the rear wall of the 1 U chassis, 108, and the exhaust port employed by the blower, 109.

In this exemplary embodiment a single rear mounted exhaust device (blower) 105 is used to cool both processors eliminating the typical need for four and eight "1 U" CPU cooling fans that are normally needed to get the job done when heat sinks whose fin areas are a factor of two smaller that are mounted on top of the CPUs are used to cool the same CPUs. A pair of baffles, 105a and 105b are shown, the first coupling the blower 105 to a pair of condenser fin blocks each of which cool one of the two LHPs. The second baffle, 105b, couples the heated air leaving the blower to the rear exit port of the 1 U chassis, allowing the heated air to leave the chassis without recirculating within the chassis heating up the ambient air within the chassis, which if allowed, will end up reducing the delta T across the cooling fins which would increase the cooling air flow rate needed to get the same amount of cooling. In a typical installation, the chassis and blower would be arranged so that the blower was mounted up against the rear wall of the chassis eliminating the need for a second baffle. The reduction in components, points of failure, noise and the need for electrical power is made possible by the passive nature of the loop heat pipes employed along with the use of a condenser whose finned heat exchanger has a much larger area than the fins typically used to cool these CPUs when they are mounted on a base plate that sits on top of the CPUs. It is this increased fin area that dramatically reduces the need for high speed air to cool the CPUs. In the case of the Ammonia LHP, the rear region of the 1 U chassis is being accessed using LHP condenser tubing whose OD can be as small as 2.5 mm while the lines in the Copper Water device turn out to range from 4 to 5 mm. One of the primary benefits of this approach is the elimination of recirculation currents within the enclosure that mix the heated exhaust with the incoming cold air raising the ambient temperature of the air that cools the CPUs and other devices which in turn requires that the speed of the exhaust fans be increased to get the same amount of cooling for all of the devices held by the enclosure. In this implementation, the rotary cooling device used to cool the primary and secondary heat sources in many cases is one or more devices mounted at the rear or within the enclosure, and in this case these devices have been consolidated into a single device, providing an additional benefit to the approach.

The condenser 104 in FIG. 1 is the first of many exemplary embodiments of a two/three piece condenser design in which the bottom half of the condenser remains with the enclosure. This design employs modified CPU "heat sinks" which normally employ a thick copper base plate which acts like a heat spreader and which transfers the heat between the CPU it is attached to and the fins attached to the base plate. In this design a pair of these CPU heat sinks is employed. The top exchanger is modified so that it can be attached to the enclosure. Employing a pair of inexpensive commodity CPU heat sinks doubles the total fin area of a single CPU heat sink. When the CPU needs to be replaced, the top heat sink used to create the condenser is unbolted and removed. The condenser line typically takes a serpentine path. In the two piece version an identical path is hogged out of the base plates of the top and bottom heat sinks providing an excellent thermal interface. Alternatively, a pair of heat spreaders may be soldered to the condenser line providing a flat surface that conducts heat to the base plates that sandwich these spreaders. The spreaders add weight and reduce the thermal resistance of the design. The condenser 104*a* is detailed in FIG. 10 and employs a distribution network to spread the vapor being condensed over a set of thin high performance cooling fins.

FIG. 2 is a more detailed view of the exemplary embodiment shown in FIG. 1. In it we can now see all four of the condenser lines used to connect a pair of LHP evaporators with their condensers. In this figure the liquid return lines 103 and the vapor exhaust lines 102 can be clearly seen as well as the fins 110 at the bottom of the condenser.

Figure 3:
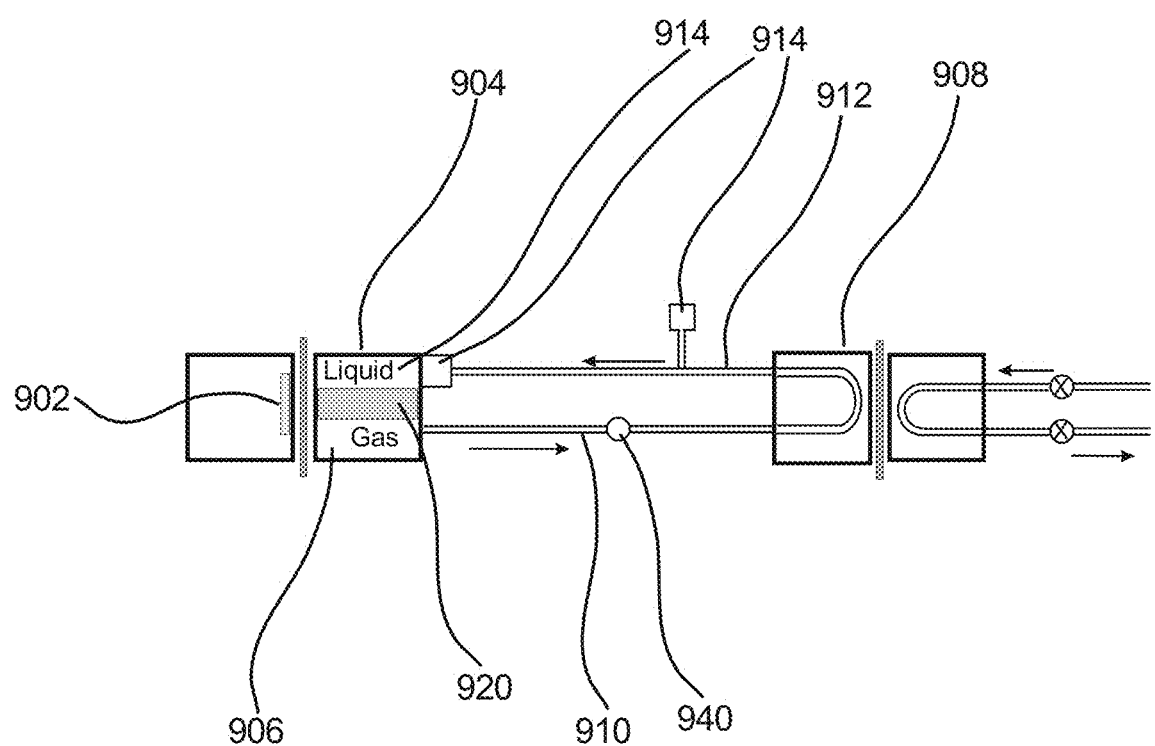
FIG. 3 is a schematic representation of a Loop Heat Pipe Like cooling device that employs a split condenser.

FIG. 3 is a schematic representation of the possible ways that an LHPL can be formed from the mixture of components found in three different Loop Heat Pipe Like devices. The original figure appears in the first provisional application and was used in the first granted patent edited by hand by the deceased patent attorney Ken Jarrell who took his life during the aftermath of the financial fiasco we are only now recovering from. Mr. Jarrell's hand edited version was cleaned up for this application by the author. This figure and the one following help to visualize possible variations of the components found in an LHPL including a new type of condenser which we called a split condenser. It does not include many of the possible exemplary embodiments, for example LHPL cooling devices that include one or more evaporators or condensers that share a common network of pipes that distribute working fluid vapor between evaporators and condensers as well as networks of liquid return line that return the output of one or more condensers to one or more evaporators.

A processor 902 or other device (not necessarily restricted to an electric heat source device) is thermally attached to an evaporator 904. A hot gas phase working fluid 906 exits the evaporator and travels to a condenser 908 via a first line 910. After the gas phase working fluid 906 moves through the condenser 908 it changes from a gas to a liquid and then returns to the evaporator 904 as a liquid using a second line 912. The condenser 908 produces the phase change by cooling the gas phase working fluid which results in the deposition of the heat carried by the working fluid into whatever coolant is used to cool the condenser. The split condenser shown is one of three basic designs that is encompassed by our first patent provisional application and was one of the types broken out by the USPTO as a separate invention. It is water cooled, and while many of the figures in this application continue to describe these devices, we are not detailing the liquid cooled portion of this split condenser, as we are primarily interested in exploring the other unique features of our cooling approach. The heat is transferred between the working fluid and another liquid coming into contact with a cold plate which is in turn in contact with the portion of the condenser that has the working fluid passing through it. We are presenting this figure here for the purpose of elucidating the combinations of features found in LHPL devices which we have defined as having features commonly found in Loop Heat Pipes, Capillary Pumped Loops as well as a device called an Advanced Loop Heat Pipe that employs a pump along with a condenser that can be broken into two pieces. This figure does not restrict LHPLs to devices that only employ water cooled split condensers: the condenser can also employ the other two cooling mechanisms claimed in the patent applications: forced convection whose coolant is either a liquid or gas. A plurality of compensation chambers 914 may be included in what the claims describe as the "liquid return path," which the independent claims define as the path that the liquid takes between the condenser outlet and the evaporator module wick. There are four different types of compensation chambers that an LHPL can have, one being an unclaimed compensation chamber, which turns out to be an internal compensation chamber whose size is too small to impact LHPL performance. This comes about because of the fact that some internal volume within the evaporator module is required to distribute the returning working fluid that enters the evaporator module through an inlet port that is smaller than the cross sectional area of the evaporator. As a consequence, the returning liquid needs to pass through a section of the evaporator where the liquid can expand out to cover the entire wick that it needs to come into contact with to flood the wick and this region by definition also forms a volume. The use of compensation chambers to differentiate the different types of LHPLs is in fact a rather strange situation, as the primary purpose of the compensation chamber is to modify the performance curve of both LHPs and CPLs as the devices approach full power and they carry out this mission using a volume, which in one case sits external to the liquid return path (CPL) or internal to the evaporator module (LHP). To this group we have added a third form, which is inline within the liquid return line. The second provisional application includes the concept of changing the volume of a liquid return line by either placing a CC in the line or possible adding volume by placing a serpentine in the line. In the embodiment illustrated, the evaporator 904 includes a mechanical pump 920, whose purpose is to reduce the pressure in the gas side of the evaporator module 904.

Typically, Loop Heat Pipes are differentiated from Capillary Pumped Loops by the location of the compensation chambers. More than one location and purpose for these devices was envisaged by the author when he wrote the first and second provisional applications. The compensation chamber can provide liquid to the evaporator when the device starts up, provide a location for water to accumulate outside of the condenser as the power being rejected increases allowing the boundary between the gas and liquid phase working fluid inside of the condensation channel to move towards the channel's exit wherein the available area within the condensation channel that converts gas to liquid increases improving the condensation process and helping in situations where there is not enough volume within the evaporator to provide an adequately large compensation chamber (due to the length of the vapor and liquid return lines) in evaporators whose length is not free to grow and finally making it possible to use inline compensation chambers that allow a single evaporator module design to be used with LHPLs whose evaporators and condensers are separated by a range of distances.

Figure 4:
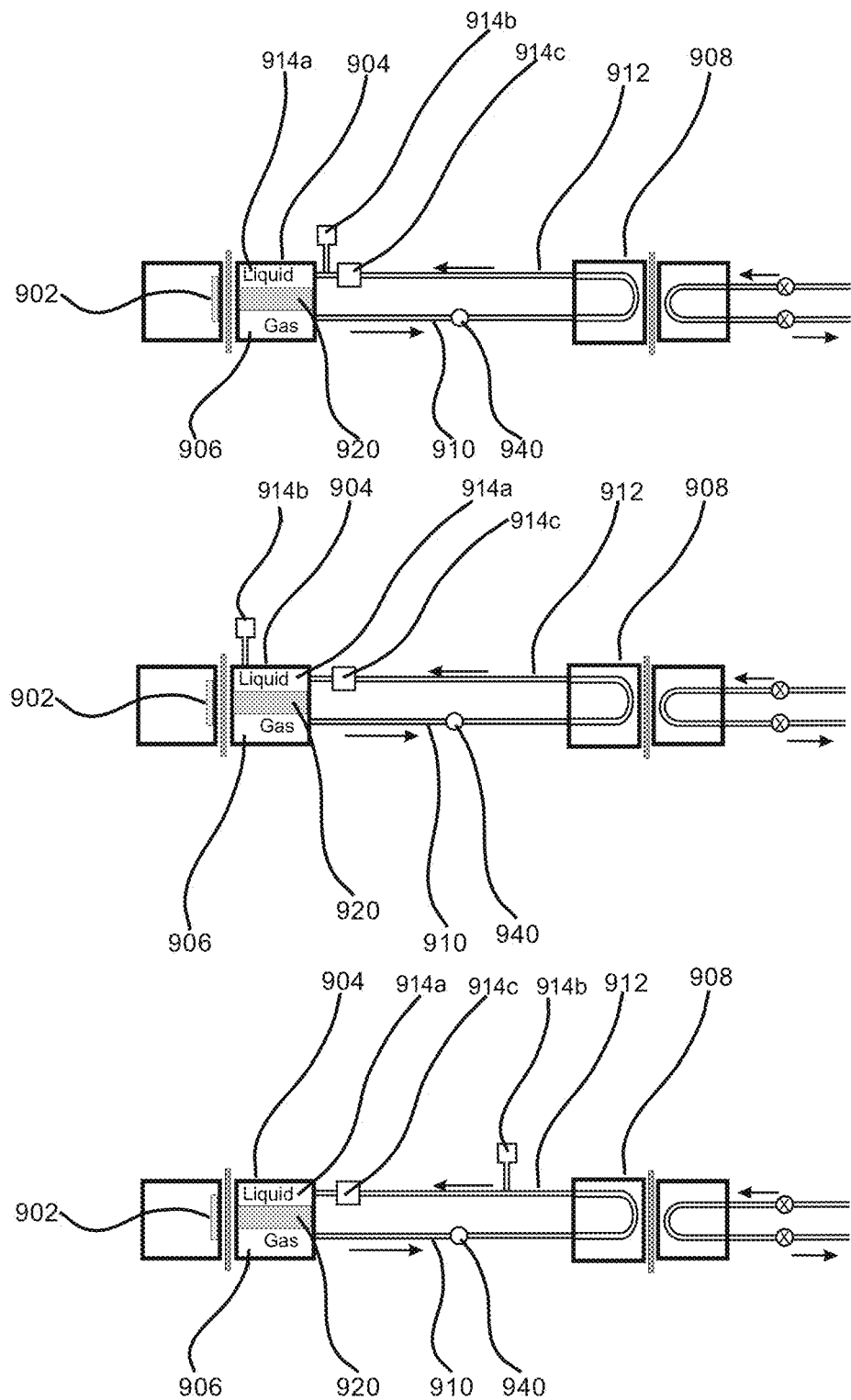
FIG. 4 is a schematic representation of the possible combinations of the components that can be employed to create a Loop Heat Pipe Like (LHPL) device.

In FIG. 4 we have drawn three of the many possible ways that compensation chambers can be located in and along the liquid return path employed by an LHPL. See also definitions. The three different types of compensation chambers drawn include Internal (914*a*), External (914*b*) and Inline (914*c*). FIG. 4 shows different locations for the placement of the three different forms of compensation chambers: within the evaporator shell, on the liquid return side of the evaporator 175, inline in the liquid return line 175*a*, and attached to the liquid return line 175*b*. Looking at FIG. 4, and the positioning of the wick 920 which separates the liquid from the gas phase working fluid, it becomes obvious for the wick to work properly, it is necessary for the liquid arriving at the wick to be able to spread easily over the entire surface of the wick that is exposed to the returning liquid. Ignoring the fact that it would be very difficult to construct an evaporator module that did not have a space between the evaporator shell 904 and the wick, what this implies that it would be very difficult to make a functioning evaporator that did not have a gap between the wick and the shell, and by definition, this gap produces a liquid storage volume whose volume is simply the size of the separation gap multiplied by the cross sectional area of the wick. Therefore, whether a compensation chamber is declared or not, there will always be an internal compensation located with an LHPL evaporator. In the cases where it is not declared in a patent, we have decided to include this form of CC in this patent application, calling it an "undeclared compensation chamber."

Figure 5:
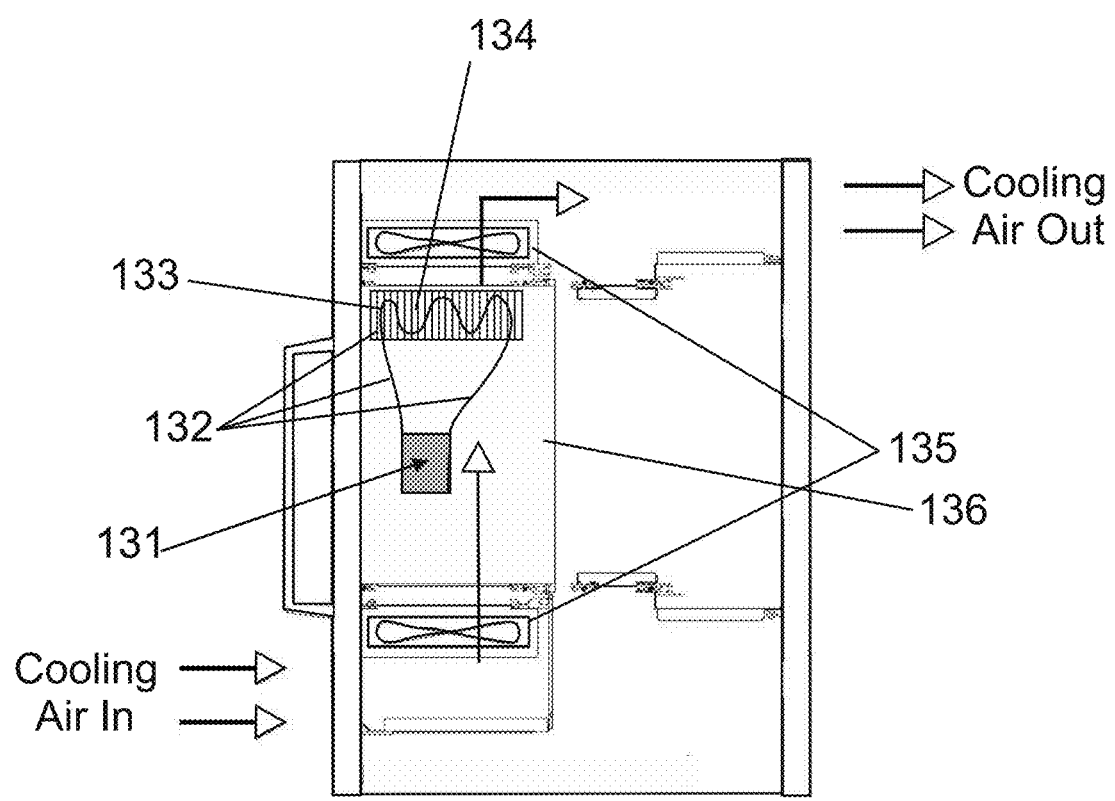
FIG. 5 is a sketch that demonstrates where to locate an LHP and its exit flow condenser used to cool SBC (single board computer) cards in a typical COTS (i.e. PICMG, VME or similar chassis) chassis that contains semiconductor devices that reject large quantities of heat.
Figure 6:
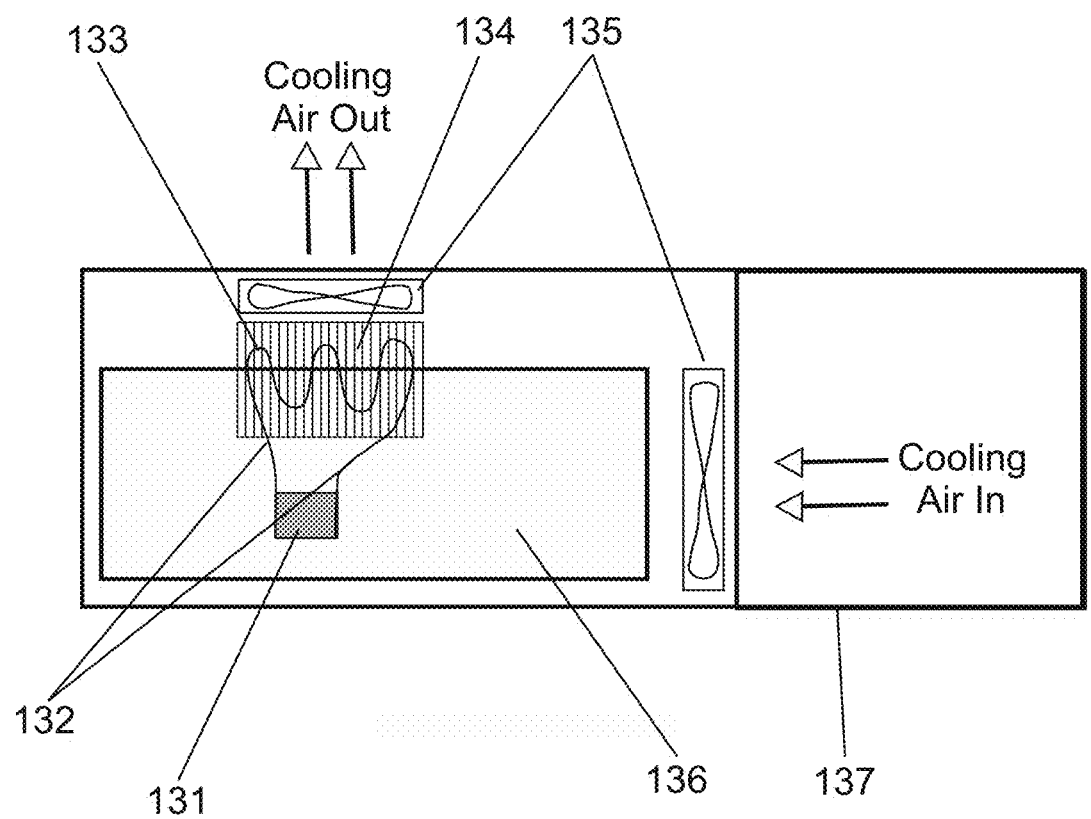
FIG. 6 is a sketch which demonstrates one method of cooling a PC chassis that contains an add in card (i.e. ISA, EISA, PCI, PCIe, HTX or similar) located in an "I/O" channel that contains a component which rejects a lot of heat and is cooled by an LHP and its condenser.

FIGS. 5 and 6 are sketches that demonstrate where to locate exit flow condensers used to cool SBC (single board computer) cards and similar devices upon which are mounted semiconductor devices that reject large quantities of heat, including but not limited to high power CPUs, GPUs and FPGAs all of which are designed to slide or fit into a chassis that includes some sort of backplane that connects these cards to either similar devices in the system or a motherboard. The cards that we are typically talking about include COTS style cards one well known form of which is called PICMG used in standard systems that are not limited to the ISA, EISA, PCI, PCIX or PCIe busses, even though these have become the standard and most popular busses for interconnecting such devices. Either of the techniques could also be used to cool what are today referred to as blades—PCBs that slide into blade chassis and which like COTS cards typically use card edge guides to guide them into a rear mounted backplane for which there is no common interconnect standards. Blades turn out to be just another form of SBC used in HPC (high performance computing).

In the case of a blade or SBC card mounted in a COTS or Blade chassis, an air path is normally provided for cooling which directs the air across the board in either a vertical or horizontal direction. Normally, COTS style SBCs are housed in special chassis. The solutions described herein could be used in situations where multiple rows of blades are cooled by air that is directed vertically through a plurality of them.

The ideal location for an LHP air-cooled condenser in this exemplary embodiment is at the location where the air normally exits the blade. FIG. 5 is a side view of an industry standard COTS PICMG chassis taken off of the web. In this commercial design a pair of fans (135) is used to bring air in below a CPU card (136) and pull it over the card and then exhaust it vertically. The route used causes the air to flow over the other components in the card before flowing over the LHP evaporator (131) that is mounted on a hot component like a CPU before flowing over the finned heat exchanger (134) that forms half of a split condenser whose other half is a serpentine shaped condenser line (133) that is connected to the evaporator with a pair of lines (132). The rising air leaves the region of the processor card helped by the second fan in this push pull arrangement.

Figure 7:
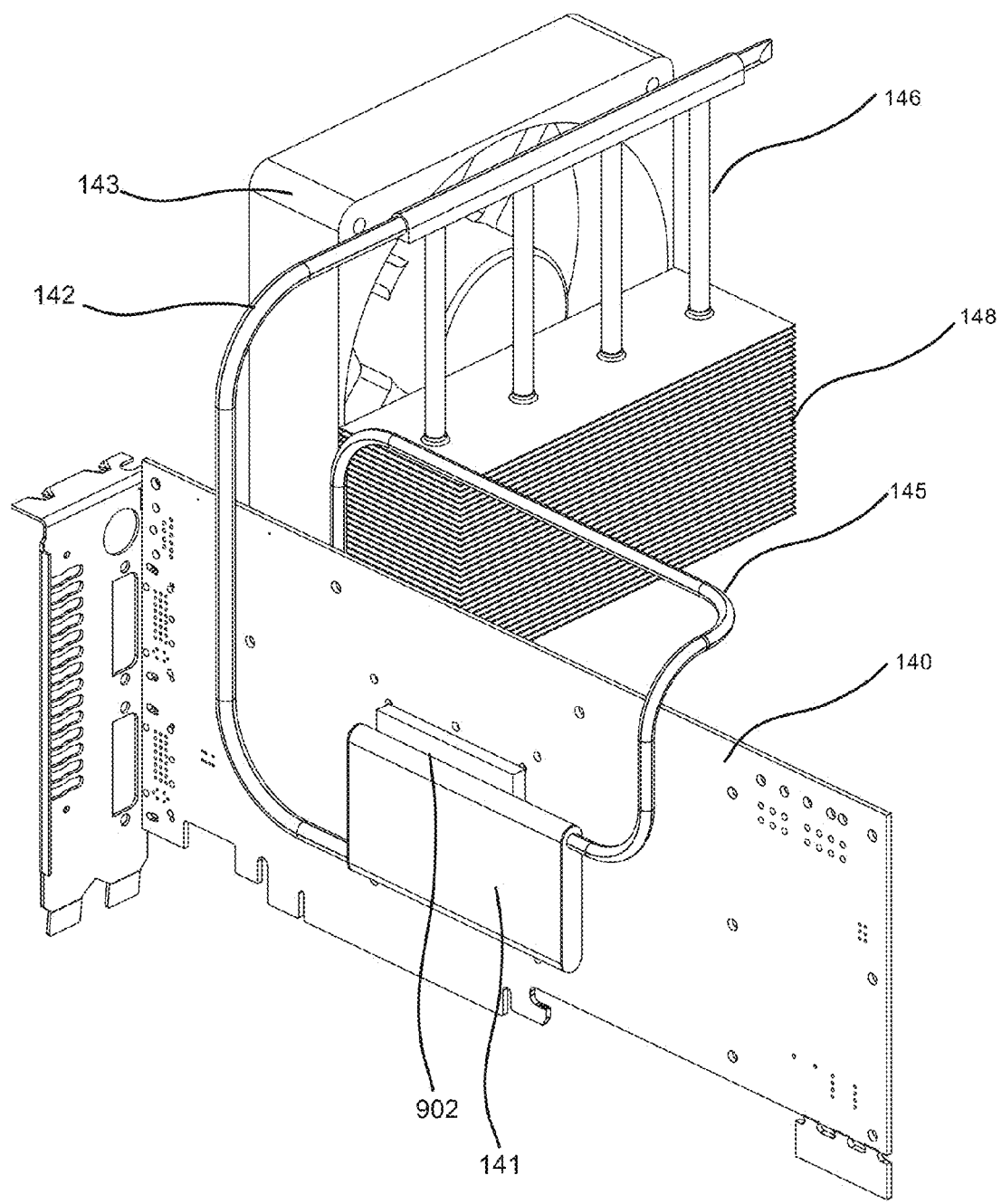
FIG. 7 is a perspective drawing of a PC add-in card that is cooled by an LHP whose condenser and cooling fan is located on the rear wall of a chassis.

The exemplary embodiment seen in FIG. 6 uses a similar but better technique to cool cards installed in the I/O channel of a typical PC motherboard installed which in this instance is installed in an enclosure referred to as a PC desktop chassis shown lying on its side. In this case an air cooled condenser employing a set of fins is mounted between the top of the card and the chassis cover (i.e. top), which has been fitted with an exhaust fan that pulls air out of the I/O channel section of the chassis. For this solution to work, the condenser heat sink 134 might need to mount to the top of the chassis to take the weight of the heat exchanger. FIG. 7 provides a similar solution in which the condenser mounts to the rear of the chassis. The PC chassis (137) has a front section that normally contains hard disks and peripherals that gets followed by one or more fans (135). The air leaving the fans in the mid section of the chassis then enters the motherboard cavity of the box that also contains the peripheral interface cards (136) that get plugged into its "I/O Channel." FIG. 6 shows an I/O channel card in outline (136) that has a hot component on it that is thermally attached to an LHP evaporator (131) that employs a pair of condenser lines (132) to feed vapor to a condenser before returning liquid back to the evaporator. A serpentine condenser line (133) that forms the condensation channel is located as well as the air-cooled fins (134) that condense the vapor back into a liquid before returning it to the evaporator. Directly above the fins is a fan that exhausts air out of the box through the cover.

FIG. 7 is a 3D rendering of an exemplary embodiment of a PC I/O channel "add in" card. The card depicted employs the PCIe bus to receive data, just one of a dozen buses that stretch back to 1982 when the IBM-PC came to market. The card 140 contains a hot device 902 mounted to it that is being cooled using an LHPL whose condenser is being cooled using a cooling fan 143 that can be mounted to the back wall of the enclosure or any other surface. In this drawing a 120 mm rotary cooling device is depicted and used to pull the hot air leaving the condenser fins 148. The LHP evaporator 141 that is attached to the device(s) being cooled employs a pair of condenser lines: 142 carries the vapor from the evaporator to a condenser tubing network that employs a plurality of vertically drawn condenser tubes 146, which are fed by the incoming vapor line 142 resulting in the liquid phase working fluid leaving the network through the liquid return line 145 that can be seen in FIG. 7. more easily which returns the condensate back to the evaporator. A plurality of condenser fins 148 in this exemplary embodiment have been stacked on the condenser tubes 146, each of which has four extruded holes that reduce the thermal resistance between the fins 148 and the condenser tubes 146. We have drawn about half of the fins here to make it possible to view the body of the rotary cooling device 143 that is used to pull air through the fins and out of the enclosure.

Figure 8:
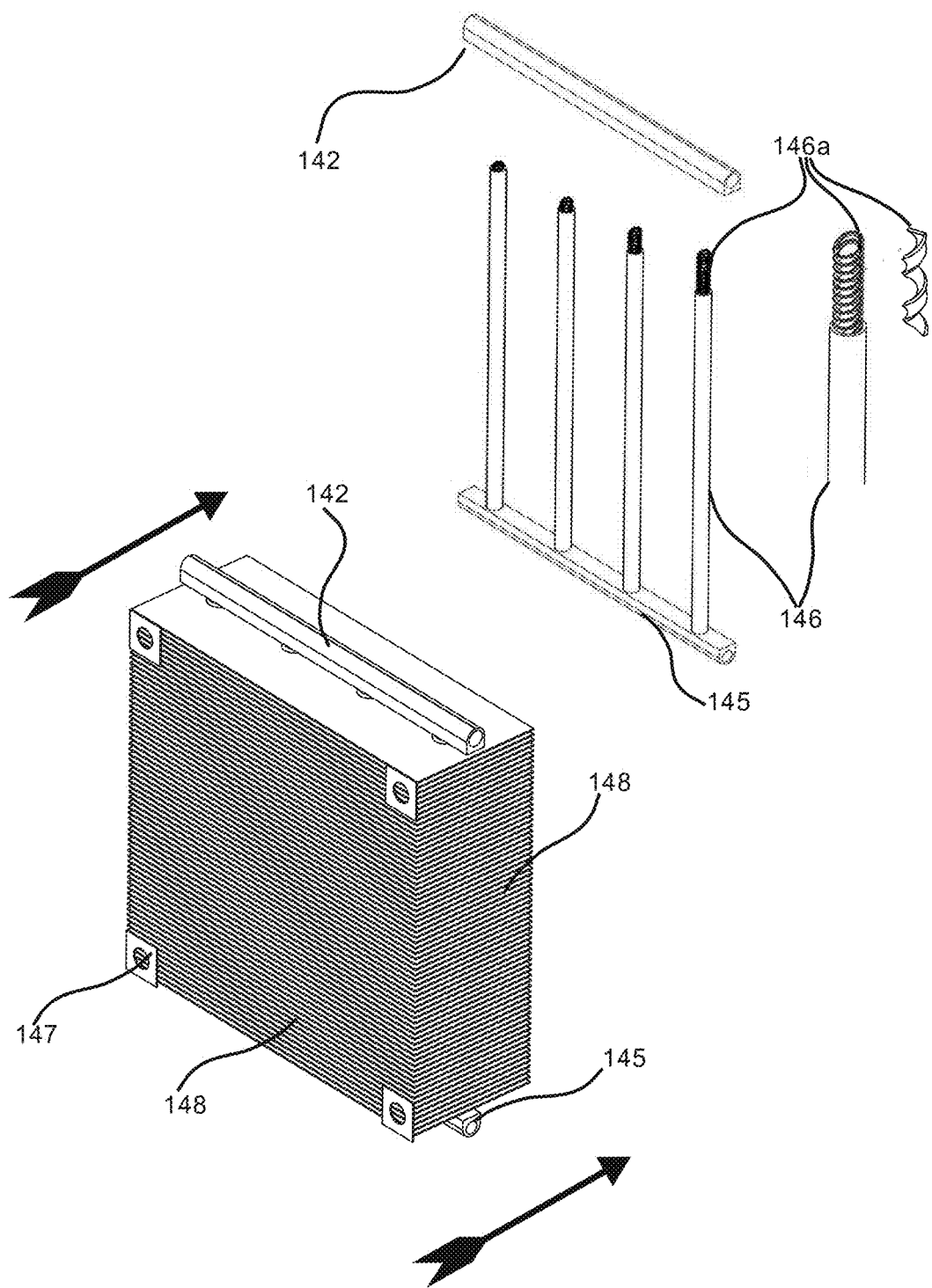
FIG. 8 shows in detail the LHP condenser shown in FIG. 7, including a manifold used to distribute working fluid vapor to a multitude of condensation channels that with an inlet and exhaust manifold form a network that is cooled by a multitude of fins stacked on the condensation channels, including laminar flow disruptors used to improve heat transfer between the condensation channels and the fins using devices within the condensation channels used to break up laminar flow along the channel walls.

FIG. 8 is a 3D rendering of an exemplary embodiment of the condenser shown in FIG. 7. The plurality of vertically drawn condenser lines 146 feed the vapor being condensed by the thin fins 148 which are made of a heat conducting material and in this exemplary embodiment are stacked on the condenser lines using a thermally conductive material to help reduce the thermal resistance of the connection between the fins and the condenser tubes. The bolt holes 147 used to mount the fin structure to the fan 143 seen in FIG. 6 are shown. This fan is oriented so that the cooling gas or air within the enclosure is being removed from the enclosure helping to improve efficiency by reducing the air temperature within the enclosure so that the temperature of the gaseous coolant within the enclosure is kept as cool as possible. The large area of the fins makes it possible to cool the LHPL working fluid using smaller air velocities through the fins which in turn makes a large reduction in the power required to run the cooling fan while at the same time reducing the system's noise footprint.

FIG. 8 shows the details of the construction of the entire condenser seen in FIG. 7. that include the condenser tubes, 146. The flow of working fluid vapor through the condenser tubes 146 starts off as a pure gas, eventually condensing on the side walls of the condenser tubes and flowing out as a liquid. The working fluid flow velocities through these tubes will most often be too slow to result in turbulent flow. To improve the heat transfer between the condensing vapor and the interior walls of the condenser tubes, it helps to break up the laminar flow using a laminar flow disruptor. In this exemplary embodiment, a spiral shaped wire 146a has been inserted into the condenser tubes 146 to help break up the flow and improve heat conduction between the working fluid vapor and the condenser's interior wall. The spiral shaped wires 146a can be seen protruding out of the condenser tubes, but when assembled, the spiral wires would be contained within the condenser tubes 146. This is not the only conceivable laminar flow disruptor that can be placed within the condenser tube to help improve the thermal conductivity between the vapor and the condenser tube wall. Next to the spiral tubing can be seen a metallic strip that when placed inside of a condensation channel will cause the condensing gas to swirl about the strip.

Figure 9:
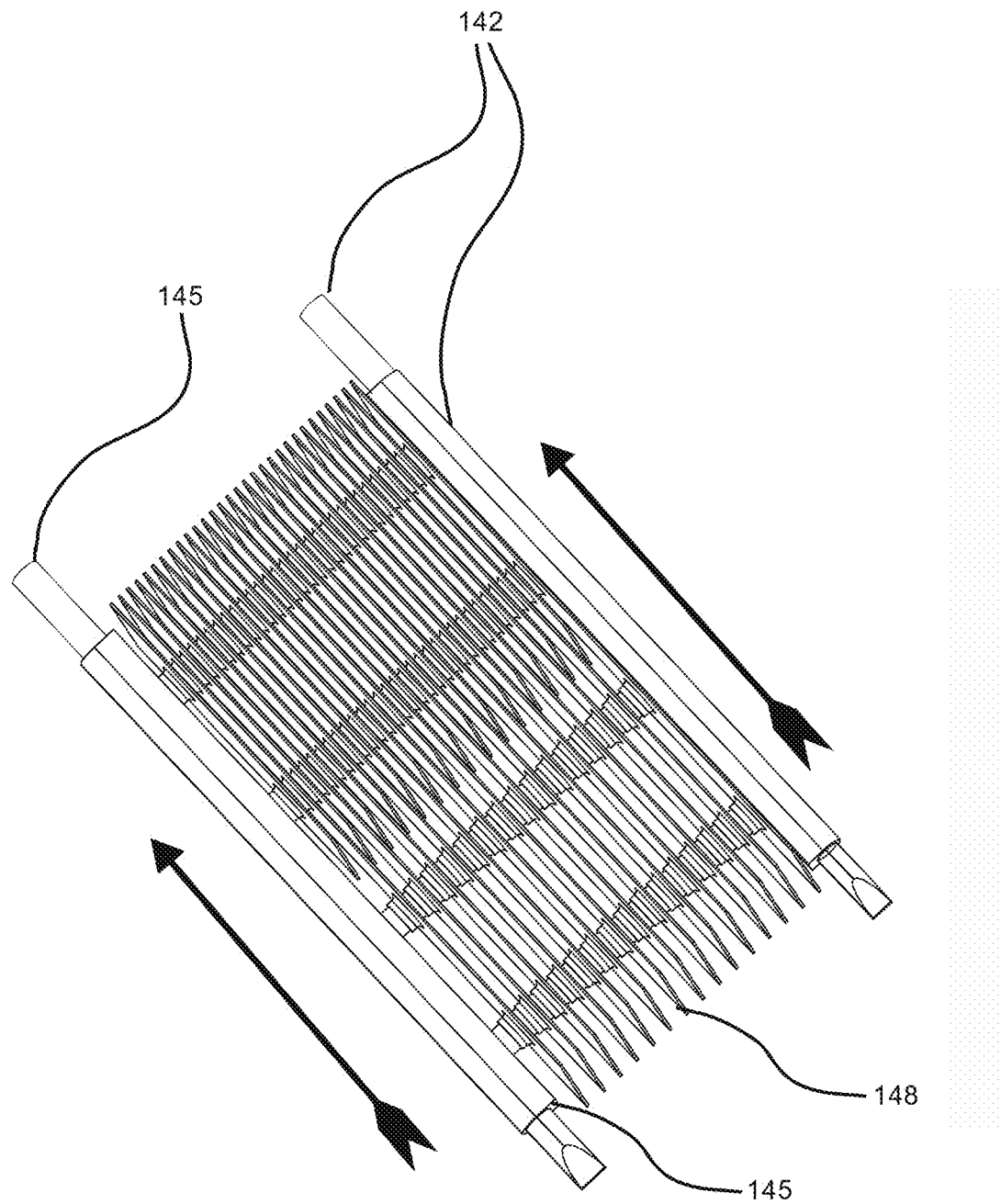
FIG. 9 is a perspective representation of the fins by the designs shown in FIGS. 7, 8 and 10.

FIG. 9 is a 3D rendering of an exemplary embodiment of a condenser which uses the same thin fin cooling design seen in FIG. 7. and FIG. 8. The condenser seen here is designed for the external coolant to flow along the fins as can be seen by the arrows which depict cooling flow direction. As the air moves down the fins, its temperature increases. Employing Newton's law of cooling we can see that the temperature difference between the coolant and the condensing working fluid will eventually get smaller due to the fact that the coolant will increase in temperature as it passes down the fins. This reduction in temperature difference can be adjusted for by increasing the fin area used at the rear of the condenser, something that can be achieved by adding additional fins at the rear of the condenser or reducing the spacing between the condensation channels at the rear of the device.

The plurality of condenser tubes seen in FIG. 7, FIG. 8 and FIG. 9 make it possible to spread the heat being rejected to the plurality of fins without having to use the technique that has been used in the past which employs ordinary heat pipes to help distribute heat across a plurality of fins. One of the major benefits of LHPLs is the ability of the LHPL wick to produce a large enough driving pressure to distribute the working fluid vapor across condensers that employ a network of tubing to distribute the heat to gaseous cooling devices like fins. Where an ordinary heat pipe design might use 4 to 8 heat pipes to transfer heat into a similar set of fins, an LHPL can use a network of condenser tubes to accomplish the same task using a single evaporator module to drive the network. An additional benefit in the cooling of devices that reject a lot of heat is the ability of a single LHPL evaporator to absorb and reject more than 200 Watts. The add in cards that are being manufactured today that use multi-core devices that employ ordinary heat pipes to cool the multi-core semiconductor die, typically employ up 7 mm ordinary heat pipes to remove the heat from the die. Four such heat pipes consume an inch of real estate above the device being cooled, placing an upper limit of around 250 Watts on the amount of heat that a group of ordinary heat pipes can be used to reject. So in addition to improving the energy efficiency of the total system by reducing the ambient temperature of the gas or air within the enclosure (which improves the cooling of everything that is cooled by gaseous or air flows) as well as by making it possible to move the rejected heat to locations in the enclosure where there is room to employ very large fin sets, the use of LHPLs to cool add in cards makes it also possible to cool devices which reject more heat than can be handled using ordinary heat pipes.

Figure 10:
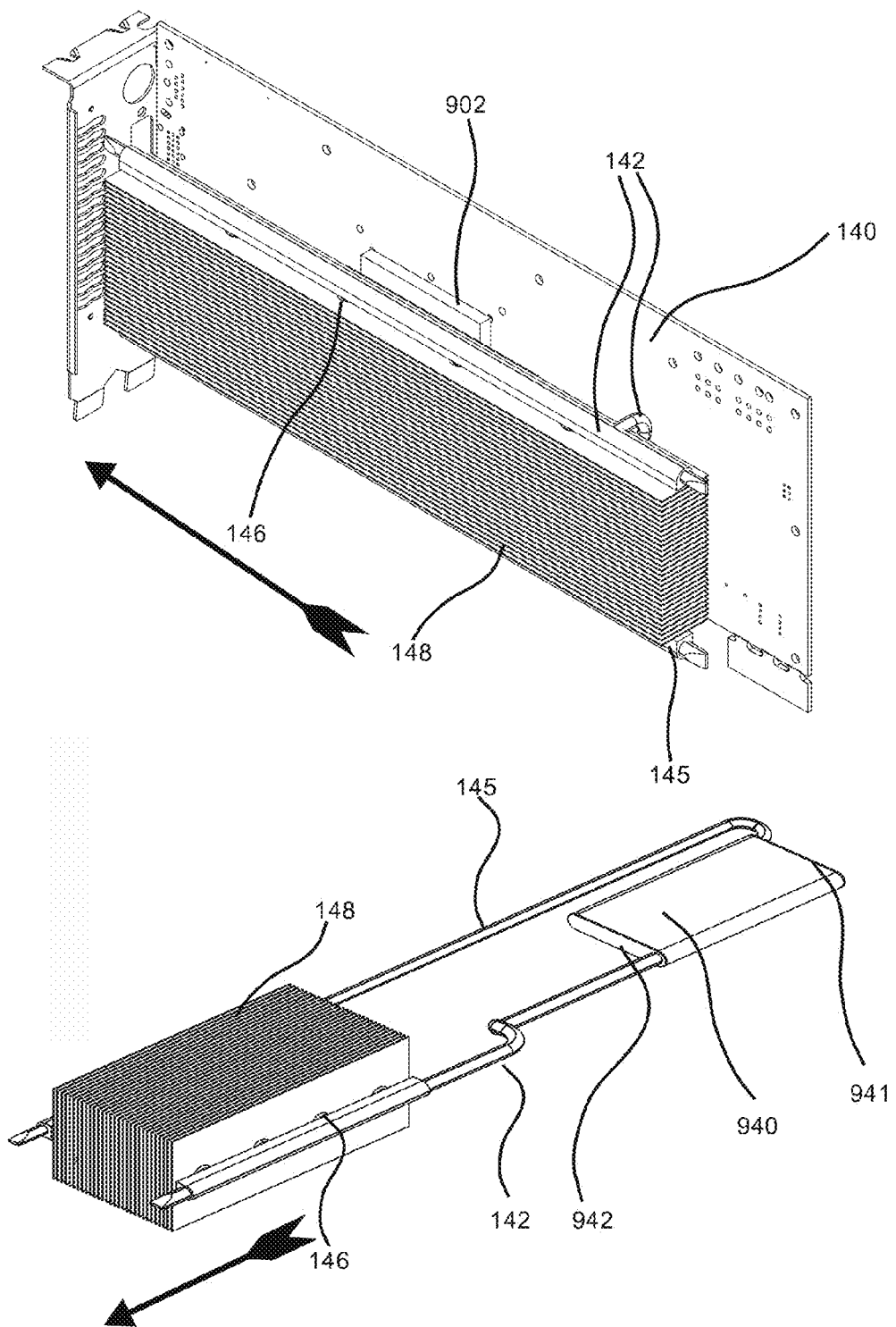
FIG. 10 is a perspective drawing, the upper half of which demonstrates how a set of fins similar to those shown in FIGS. 7, 8 and 9 can be mated with a flat oblong LHPL evaporator module (not seen as it sits beneath the condenser fins) used to cool a component on a PC add in card, and in which the lower half demonstrates how a similar set of fins can be coupled with a flat oblong evaporator module to produce an LHPL which works with a low pressure evaporator module.

FIG. 10 contains a 3D rendering of an exemplary embodiment of a low pressure flat oblong LHP evaporator that has been mated with a set of fins similar to those employed in FIGS. 7, 8 and 9 along with a similar flat LHPL whose fins are mounted to a PC I.O. channel add in card that obscures the view of a flat evaporator module that is cooling the device being cooled 902. The arrows depict the direction of the air flowing through the fins of both devices. The said LHPLs employ evaporators that run at low pressure employing flat oblong evaporator shells used with working fluids whose vapor pressure versus temperature curves require that they be run at either sub-atmospheric pressure or slightly higher, but not high enough to deform a thin shell or to cause the shell to separate from the wick within. The choice of the metal used for the evaporators, tubing and condenser that come in contact with the working fluid is determined by the long term chemical compatibility of the metal with the working fluid. In particular chemical reactions that produce gases that do not condense are to be especially avoided. In this exemplary embodiment the working fluid could be water or one of many other chemical compounds that are chemically compatible with the substance used to make the evaporator as well as the tubing employed in the cooling loop and compensation chamber. The fins 148 in both devices in this embodiment are identical to the ones seen in FIGS. 7, 8 and 9. The vapor 142 and liquid return lines 145 can easily be seen as well the short lines 146 that pass through the fins forming the condensation channel which distributes the heat being rejected to the fins.

Figure 13:
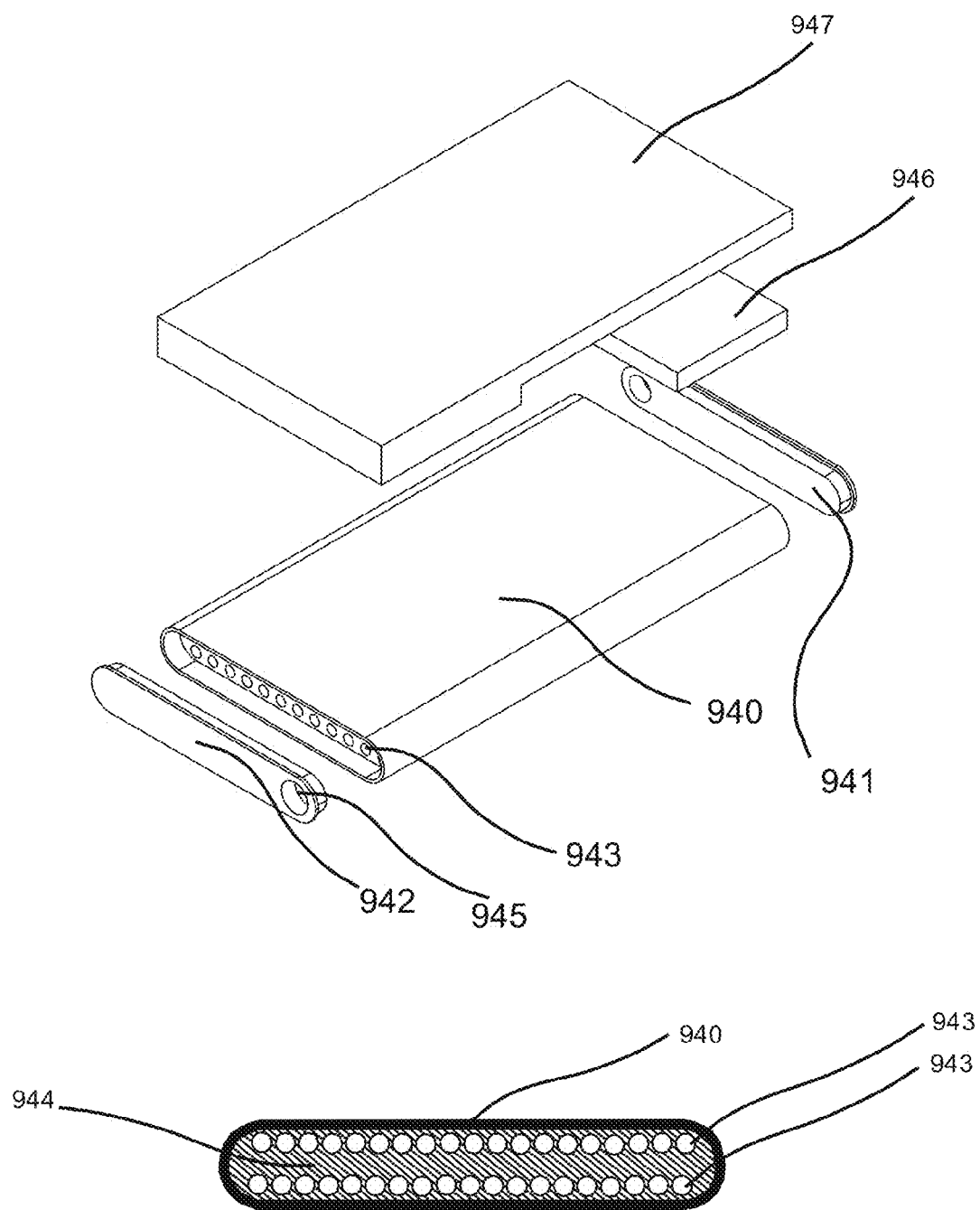
FIG. 13 is an LHP flat oblong Evaporator with escape channels designed to receive heat on two sides of its shell simultaneously that may employ a TEC cooler to improve LHPL performance when small heat loads are being rejected.

The lower 3D rendering exposes the evaporator shell 940 whose end caps 941 and 942 are also called out and which are called out in greater detail in FIG. 13. The add in card cooler seen in the upper 3D rendering exposes the device being cooled 902 as well as the cooling fins 148, the vapor line distribution manifold 142a that moves vapor to the condensation channel lines 146 and the vapor line 142 feeding the distribution manifold. The lower half of the distribution manifold 145a that collects the returning liquid phase working fluid and returns it to the liquid return line (not seen) sits near the bottom of the card. The add in card seen here does not include a rotary cooling device. Cards which do not contain their own rotary cooling devices are referred to as "passive" and rely on fans on either side to either pull or push air across the fins. A baffle is always used to direct cooling air across the fins and almost always is a metal shroud (or a plastic shroud that contains a metal layer) that encloses the top and sides of the card whose other job is to eliminate EMI (electromagnetic interference). The fins and the working fluid manifold can be tuned to take into account the fact that the air passing through the fins gradually gets harder as it approaches the exit, making it more difficult to reject heat to the flow as it approaches the point where it leaves the fins. This tuning can be done by increasing the number of fins while reducing the condensation channel 146 density at the point where the cooling air leaves the fins. These details are not shown here although a set of fins which includes this concept is shown in FIG. 9.

Figure 11:
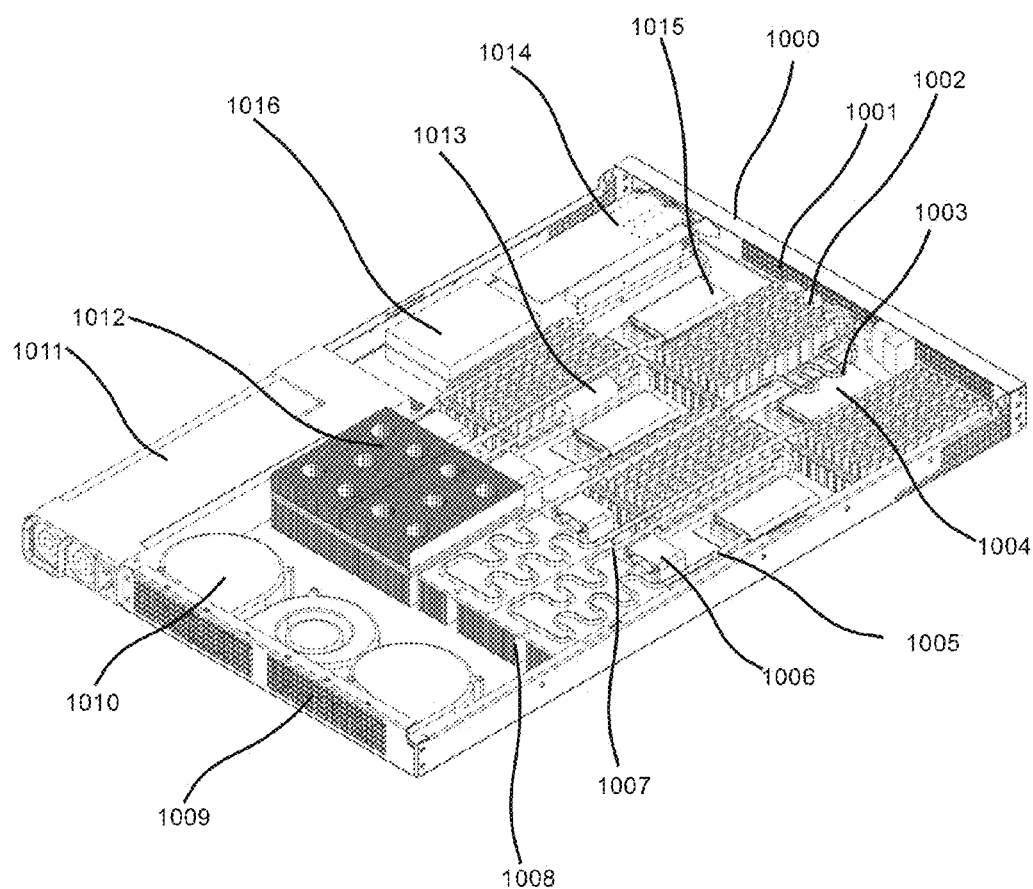
FIG. 11 is a perspective drawing of a 1 U enclosure that houses a motherboard that employs four CPUs each of which are cooled by an LHPL that employs flat oblong evaporators and condensers that employ modified CPU heat sinks arranged as clam shells that enclose a serpentine shaped condenser channel.

FIG. 11 is an exemplary 3D view of an air cooled Quad Processor 1 U chassis that employs four LHPs whose working fluid is water and which typically operates between pressures of 0.06 and 0.20 atmospheres (to keep the boiling point below 70 Celsius) and is capable of cooling a 230 Watt CPU. This 1 U system is essentially a more contemporary exemplary of the system shown in FIG. 1, whose working fluid, Ammonia, runs at high pressure (20 atmospheres) and is the preferred working fluid used in LHP space vehicle applications but not necessarily systems housed in data centers. The processors used in this 1 U chassis can reject up to 160 Watts each where those tested in FIG. 1 typically rejected 100 Watts. The four flat oblong evaporators can reject a total of 640 Watts employing only three 1 U blowers. If the permissible temperature of the CPUs being cooled were allowed to reach 80 Celsius each of the evaporators could end up cooling a 200 Watt device.

The chassis bottom half 1000, has cooling air inlet holes 1001 situated in its front. Items of interest include four sets of DIMM modules one of which 1002 is pointed out. Items 1003 and 1013 are Inline Compensation Chambers that have been inserted in the liquid return lines and would normally be used to tune the lengths (1003) or add capacity (1013) to the Internal Compensation Chamber (ICC) of the LHPs with the smallest vapor tubes (opposite of what is drawn). There are four flat oblong low pressure evaporators 1004 the first of which is called out. 1005 points out one of four LHP vapor lines while 1006 points out one of four optional DIMM module cooling fans, which may or may not be needed, depending on the type and quantity of memory installed in the two motherboards used, neither of which can easily be separated in this drawing, but sit beneath the electronic components being cooled with air that include the DIMM modules, CPUs (which sit beneath the four evaporators) as well as secondary components like MOSFETs. 1007 points to one of the four liquid return lines while 1008 points to one of the four sets of lower condenser fin sets which sit beneath the serpentine vapor lines that are fed by the evaporators. 1012 points out the upper most set of fins which clamp to the lower ones using studs that can easily be seen in the two sets of lower cooling fins. 1009 points out the hot air exhaust ports in the chassis through which the hot air was pushed using three blowers 1010. This is followed by the removable power supply 1011, a pair of hard disks 1016 and a PCIe communication card 1014. The blowers that provide the greatest portion of the cooling of this design consume less than half the power of the typical fans used to cool a similar 1 U chassis. The reduction in power is a direct result of the fact that the large fin area reduces the flow rate required to cool the processors the fact that the blowers run at just 6,000 RPM which dramatically improves reliability over fans and the fact that the air used to cool CPUs does not end up heating DIMM modules, which causes a typical 1 U chassis to have to further increase its cooling air flow rate. In FIG. 11 we can make out the lower 1008 and upper set 1012 of condenser fins, the heat spreader plates 1018 that are thermally attached to the vapor 1005 and liquid return lines 1007. The fins are pressure mounted to the condenser lines and their heat spreaders using a set of studs mounted in the lower set of fins that are fitted with nuts that are inserted in the holes in the top set of fins.

Figure 12:
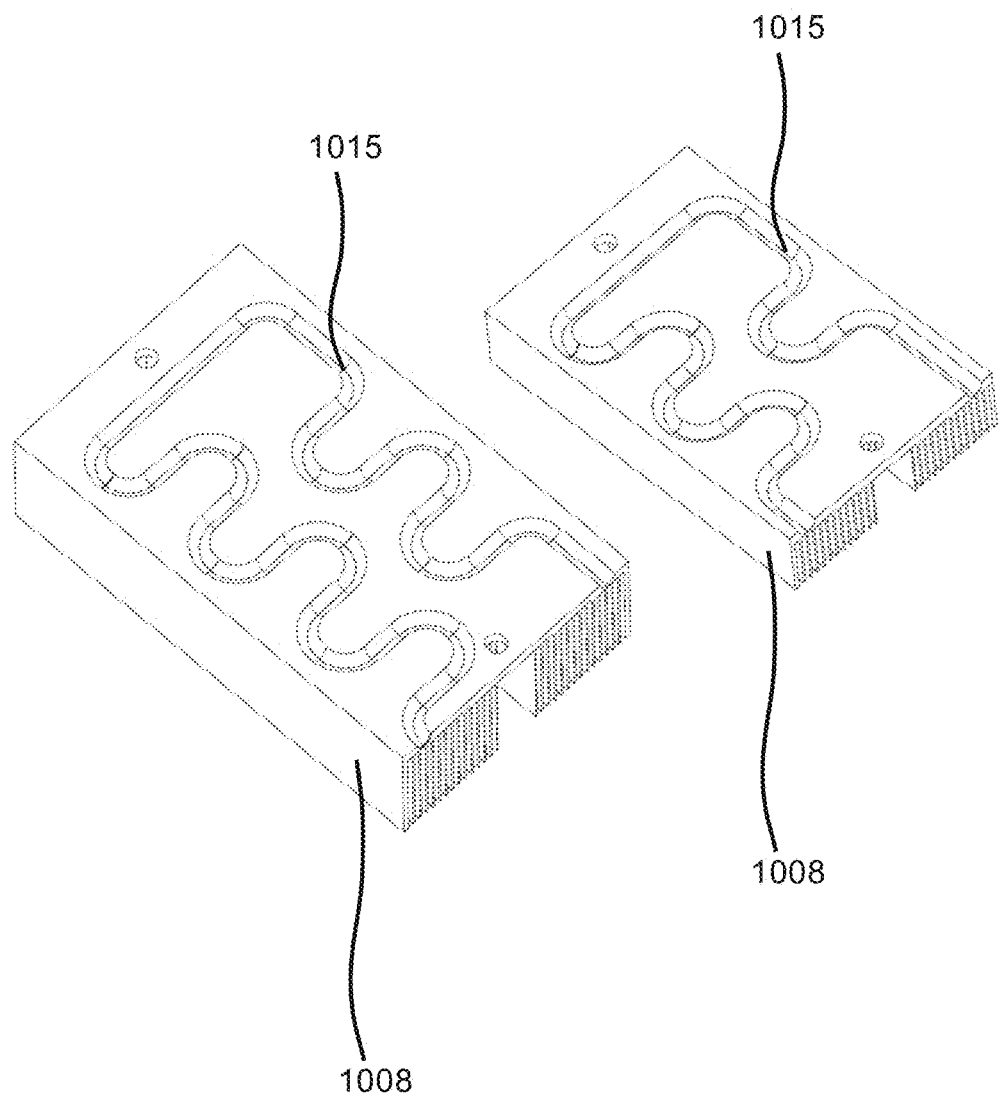
FIG. 12 is a perspective drawing of two different sized heat sinks that have been milled with a serpentine pattern that corresponds to the shape of a serpentine shaped condensation channel, and which each form the bottom half of a clam shell design similar to the one seen in FIG. 11.

To create the LHPL condenser seen in FIG. 11 we used a CNC mill to "hog out" a channel 1015 in the base plates of a pair of commercial CPU heat exchangers. FIG. 12 shows the bottom half of a pair of different heat sinks that form the bottom half of the condensers seen in FIG. 11 (which employed the smaller of the two hogged out heat sinks seen in FIG. 12. The resultant set of fins form a "clam shell" like device which sandwiches a serpentine shaped condensation channel between a pair of hogged out heat sinks. This approach to manufacturing LHPL condenser results in a device that is inexpensive to procure because of the availability of the commodity CPU heat sinks which we used. Hogging out a contour in the base plate of the heat sinks results in an excellent thermal interface. In a typical system the bottom heat sink will be attached to the chassis, making it possible to remove the top heat sink followed by the subassembly that consists of the vapor and condenser lines as well as the evaporator module.

FIG. 13 contains a 3D exemplary exploded view of an oblong flat evaporator that also contains an end view of the end of the evaporator where the escape channels leave the evaporator. Due to the opposing escape channels 943 this evaporator is able to accept heat from devices on both its top and bottom at the same time. This design is employed with working fluids that operate at low or sub-atmospheric pressures. They typically are made of a metal shell 940 that is chemically compatible (does not react with the working fluid over the lifetime of the LHPL to produce non-condensable gases) with the working fluid and can be sealed using end caps 941 and 942 that are inserted into the shell with the gap then vacuum sealed using chemical compounds or welding capable of producing a vacuum seal. The most common compounds used to affect this seal are combinations of metal alloys commonly referred to as solder and brazing compounds which melt at specific temperatures and form a chemical bond with both the shell and the end cap. The end cap 942 nearest the point where working fluid vapor escapes from the wick 944 through its escape channels 943 shows an exemplary hole 945 where the vapor tube is inserted and then sealed to the end cap typically using the same technique used to attach the end cap to the shell. The wick fits within the shell starting a small distance in from the opposing end cap 942 and protruding through the cavity before terminating some distance before the opposing end cap 941. In this exemplary embodiment, an empty region is typically provided between the end cap 941 and the end of the wick where working fluid may be stored. This is one of several locations where a compensation chamber may be located, the others being in the liquid return line itself, attached to the liquid return line by a small length of tubing or attached to the end cap 941 using one or more holes in it that provide a path through one or more tubes into a compensation chamber sitting near the evaporator. The wick itself is made of a porous material that allows the liquid phase to pass through it without generating large pressure losses while at the same time employing small enough gaps between whatever material it is made up of to generate a high enough driving pressure that gets produced when boiling occurs on the escape channel walls forming bubbles whose internal pressure is greater than the pressure of the cool liquid phase working fluid that is entering the wick through the opposing end cap. The pressure needed to burst the small bubbles forming on the escape channel walls is proportional to the surface tension of the liquid phase working fluid and inversely proportional to the radius of the bubbles. The bursting bubbles that form on escape channel walls in the evaporation zone of the wick which is located on the walls of the evaporator shell end up driving the LHPL cooling loop. The most common materials used today to make LHPL wicks are metal particles that have been sintered to form a porous sponge like structure but any material which provides the right porosity and produces bubbles which burst with enough pressure on the escape channel walls will do.

In addition to the flat oval evaporator FIG. 13 also contains an exploded view of an exemplary embodiment of a technique for attaching a TEC cooler to an evaporator whose use has been described in a prior specification. Some LHPL evaporators have problems operating at low power when the length of the vapor and liquid return lines is increased. A typical example is a Copper Water LHPL that can run at 20 Watts when the distance between the evaporator and condenser is 6 inches, but whose low power point increases to 40 Watts when the distance grows to 16 inches. These sorts of problems relate to various properties of the material used in the wick as well as the properties of the working fluid. In the case of a Copper Water device with a Copper wick, the excellent thermal conductivity of Copper makes it possible for heat to flow out the rear of the evaporator at low power. At high power this does not happen simply because the flow rate of water through the wick is large enough to cool the point where the water enters the wick. The other problem when cooling low power devices with long copper vapor and liquid lines is the fact that the copper vapor tube is a good conductor of heat as well, and when the flow through the vapor tube slows up it becomes possible for liquid water to condense in the vapor tube. What is observed in this case are slow oscillations in the temperature of the device being cooled which we call chugging. There are two things you can do to reduce or eliminate chugging. The first is to wrap a heating tape around the vapor line (not shown in any drawing). It only takes about 10 Watts for an LHPL that is having a hard time running at 30 Watts, to see a significant reduction in oscillations. The other solution is to counter the flow out the rear of the evaporator by cooling the compensation chamber at the inlet end of the evaporator 941. The upper portion of FIG. 13 is an exploded view that shows how to mount an electric (wires not shown) TEC cooler 946 so that its cool side can remove heat from the compensation chamber end of an evaporator. The flat slab like TEC (thermoelectric) cooler employed in FIG. 13 has two sides: one side cools whatever it comes into contact with while the opposing side releases the heat picked up by the cool side, adding to that heat the energy required to produce the refrigeration effect. In the case of a 10 Watt TEC cooler, it will take 10 Watts of electric power to run the TEC cooler. The device will remove 10 Watts from the compensation chamber while introducing 20 Watts on its hot surface which somehow needs to be rejected. Take the case where an LHPL starts to oscillate when cooling a 40 Watt load and lets assume we want it to running a device which is only rejecting 20 Watts. The heat spreader 947 that needs to be made of a material like copper which has a high thermal conductivity seen in this figure will remove 10 Watts from the compensation end of the LHP, while at the same time dumping 20 Watts into the end of the evaporator that rejects heat from heat loads. In this case the total power being rejected by the guts of the evaporator will be 40 Watts (where the device presumably runs fine) while at the same time removing 10 Watts from the compensation chamber, which will help to remove parasitic leakage out the back end of the wick, further improving the performance of the evaporator and making it possible to run a device that normally would not run well at 20 Watts, at 20 Watts.

Figure 14:
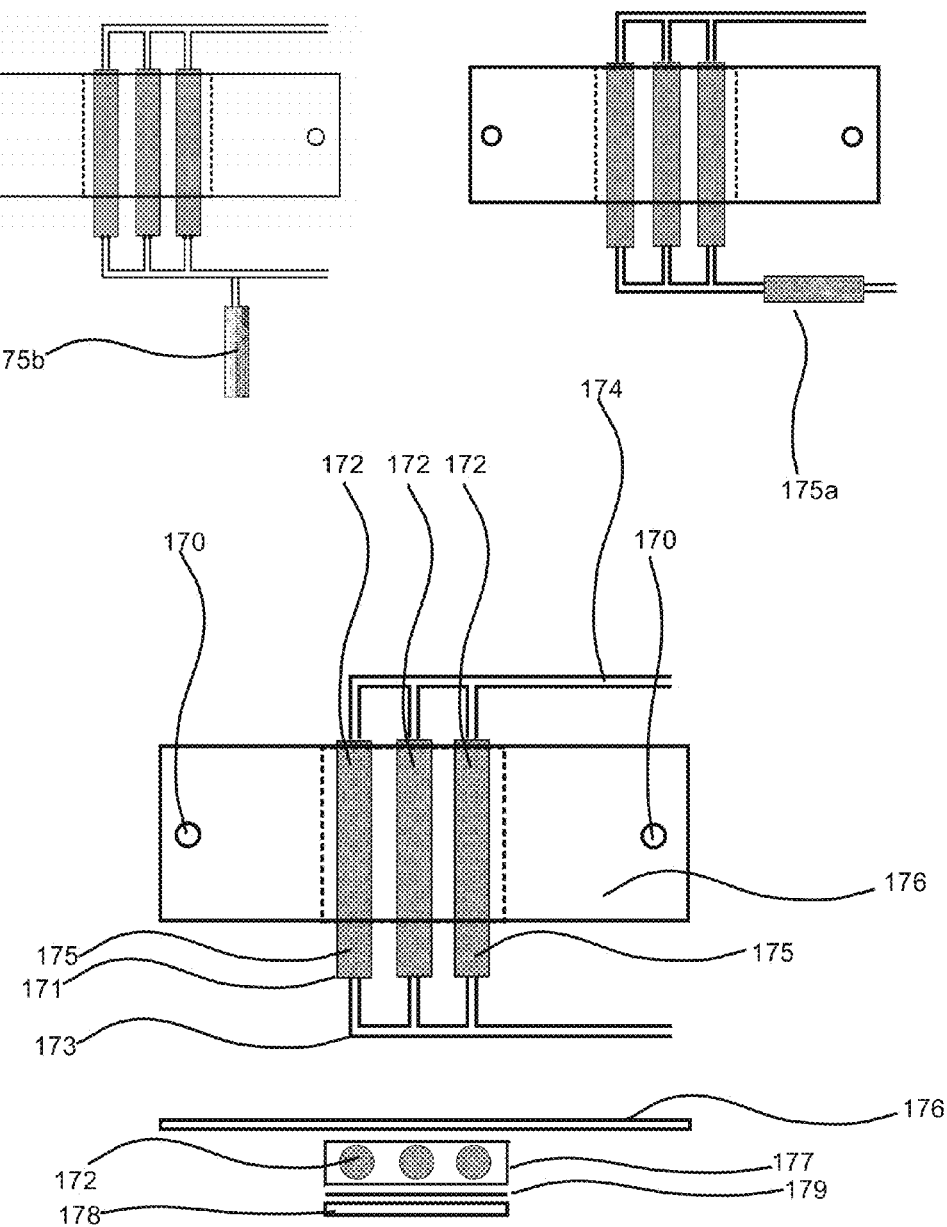

FIG. 14 is an exemplary embodiment that includes three views looking down and one side view of a heat spreader and clamping mechanism that thermally interfaces at least one cylindrical evaporator enclosed in a heat spreader 177 (see the side view at the bottom of the figure) that is thermally attached to a primary heat rejecting device 178 employing a thermal transmitting compound between the heat spreader and the device being cooled and using a clamping plate 175 with mounting holes 170 that compresses the thermal heat transmitting compound 179 between the heat spreader and the heat rejecting device. The cylindrical evaporator(s) 172 in FIG. 14 are intended to work with working fluids whose gas phase pressure over the operating temperature range of the device being cooled runs above 10 atmospheres. These pressures require that the evaporator be made of a strong material while at the same time employing a shell skin 171 that is not thick enough to make a large increase in the thermal resistance of the shell. The ideal shape for such shells is cylinder 171. In the case of an Ammonia LHPL designed to reject the heat coming off of a CPU 178 mounted on a printed circuit board, the cylindrical evaporators will have a diameter less than 0.5 inches. The condenser tubes 173 and 174 seen in FIG. 14 can have diameters that are significantly smaller than the quarter inch copper tubing employed by ordinary heat pipes. In this case their diameter is almost a factor of 3 smaller than an ordinary quarter inch heat pipe. The smaller diameters are made possible by the higher pressure employed by the working fluids employed in LHPLs which results in working fluid vapor having much higher densities than the vapors in LHPLs that run at low pressures such as Copper Water LHPs. The higher density of the high pressure LHPL working fluids makes it possible for the velocity of the working fluid flowing down the vapor tube to be quite small and to still get good heat transfer. This in turn reduces pressure losses along the vapor tube making it possible to employ smaller vapor tubes. In the case of Ammonia LHPLs, the evaporator shell is normally made of Nickel. The heat spreader is ideally made of a high heat conductivity substance such as copper. The miniature evaporators in FIG. 14 are typically capable of rejecting up to 300 Watts each cooling devices that are designed to run at temperatures at or below 80 centigrade. As seen here, the three evaporator modules will be capable of rejecting 900 Watts. When used with Ammonia as a working fluid the evaporators seen here were made of Nickel and interfaced to copper heat spreaders using solder. The condenser liquid return line 173 and the vapor line 174 can be made of Nickel or stainless steel.

Figure 15:
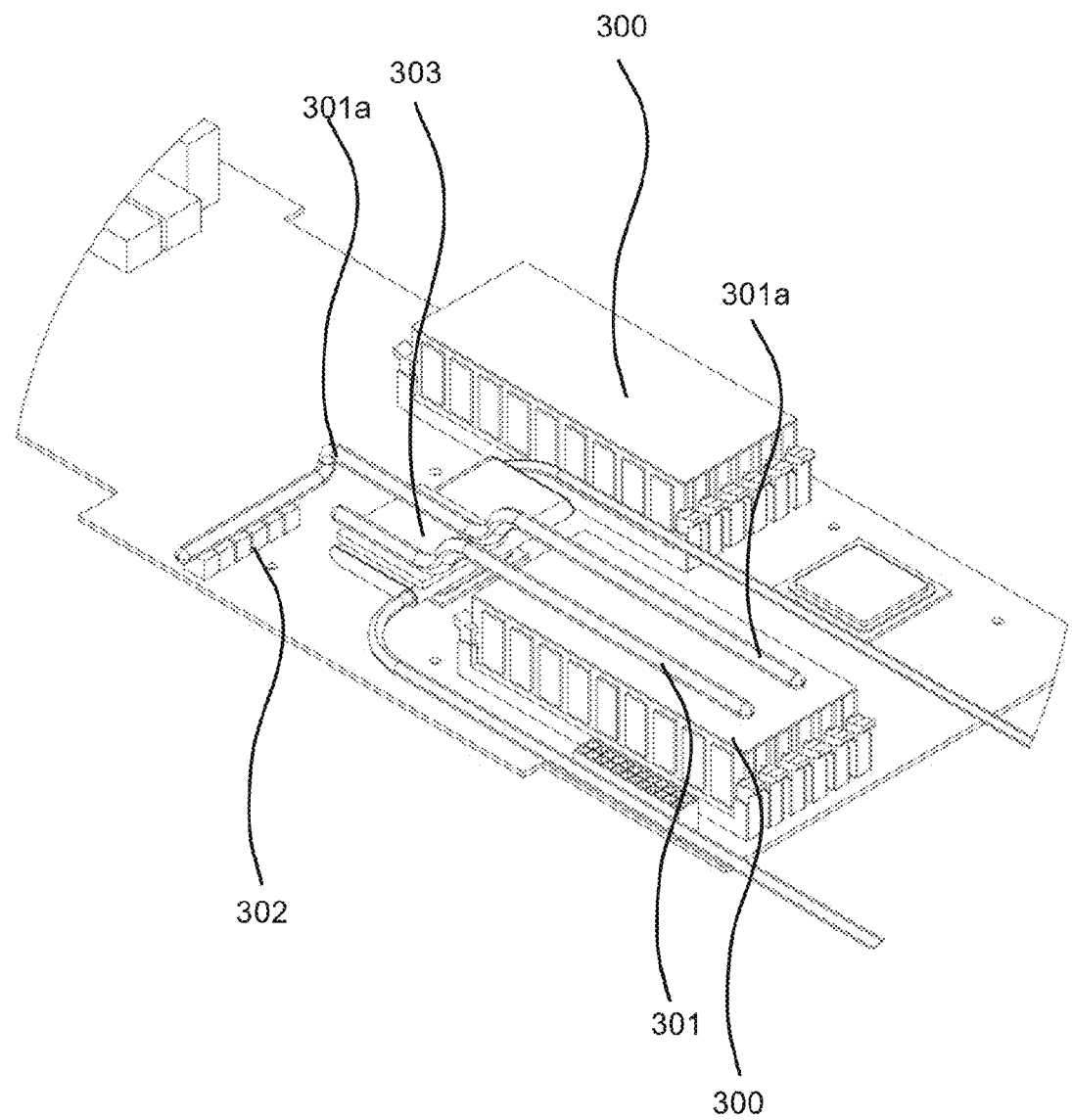
FIG. 15 demonstrates how an ordinary heat pipe can be used to remove secondary heat from components and deposit that heat in the evaporator module of an LHPL used in the primary cooling system.

FIG. 15 is a 3D rendering of an exemplary embodiment of a method of extracting heat from secondary heat loads and depositing that heat in the primary cooling system. There are two ways in which ordinary heat pipes can be used to accomplish this task. One of them was divulged in the past in FIG. 29 and employed a heat pipe to cool DIMM modules on an add in card that employed an LHPL with a split condenser: in this case, the heat pipe connected a heat spreader thermally attached to a group of DIMM modules which was also connected to the cold plate used to extract the heat from the LHPL. In FIG. 15 a pair of standard heat pipes 301 are employed to cool a heat spreader 300 attached to a group of DIMM modules as well as a line of MOSFETs 302: devices used in electronics to reduce DC voltages whose cooling is crucial and which can reject a significant amount of heat, although less than the two main sources which turn out to be CPUs and DIMM modules. One of the two heat pipes 301*a* does "double duty," having a pair of evaporator sections that at its center feed heat into the CPU's primary LHPL evaporator module 303.

Figure 16:
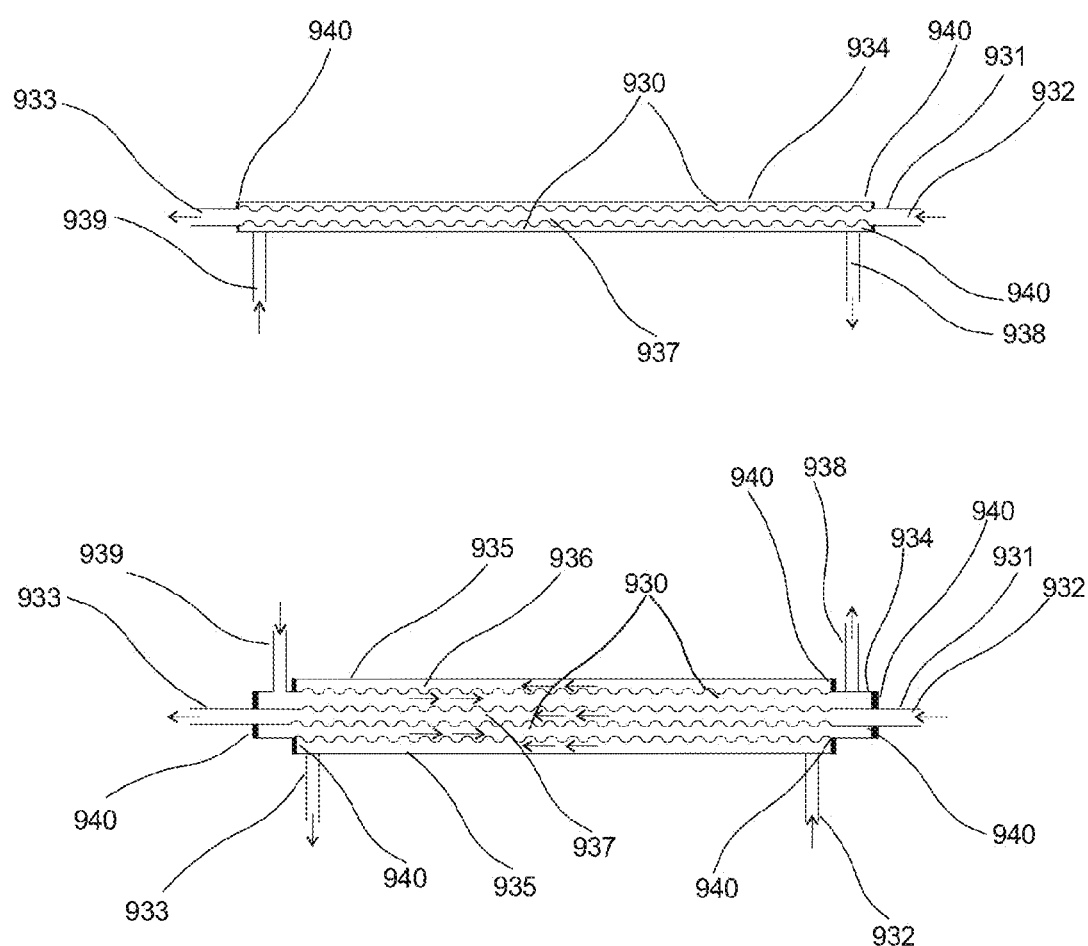
FIG. 16 demonstrates how to create a cylindrical co-axial liquid cooled condenser that employs laminar flow disruptors.

FIG. 16 is an exemplary embodiment of an LHPL condenser composed of either two or three concentric cylinders that exchange heat between a liquid coolant and the working fluid vapor. The upper drawing contains a pair of concentric cylinders. The inner cylinder, 931, is simply a tube that carries the external coolant through it, entering on the right at 932 and leaving on the left at 933. To improve mixing at low Reynolds numbers and heat transfer between the working fluid vapor and the coolant this tube may employ laminar flow disruptors attached to either side of the condensation channel that help to break up the laminar flow of either the coolant or vapor. In addition to these disruptors that are thermally attached to the tube and can increase its surface area, the protuberances can take the form of a tube that has a wall that has been formed with a spiral or rings in it such as a bellows. The upper drawing in FIG. 16 provides an exemplary embodiment of an inner tube whose disruptors turn out to form a spiral. Surrounding the inner tube is an outer tube 934 that is sealed at each end to the first tube using a ring 940 that is sealed to both tubes to guarantee that the coolant and vapor do not mix. The sealant will depend on the materials that the tubing is made out of. In the case where metals are employed the seal will either be a solder, brazing compound or a weld. The condenser's condensation channel is defined by the separation between the inner and outer two cylinders 930. The working fluid enters the condensation channel through a pipe 938 attached to the outer cylinder 934 and exits at the left end through a similar pipe 939. To achieve the lowest thermal resistance and the highest external coolant exit temperature it is necessary to slow up the flow of coolant which reduces its Reynolds number.

The condenser at the bottom of FIG. 16 expands on this concept adding a third concentric cylinder 935 that surrounds what was the outer cylinder 934 of the first example. Four rings are used to separate the three cylinders at their ends all of which are labeled 940. This embodiment adds a second external coolant entrance 932 and exit 933. The two internal cylinders have been drawn using protuberances to improve heat transfer between the condensation channel and the coolant. This design doubles the internal area of the condensation channel across which condensation can occur, as both the inner and outer walls of the condenser now are being cooled by the external coolant, which like the first embodiment, is flowing in a counter flow direction (see arrows inside of condenser channels) to maximize the temperature of the coolant resulting in a condenser that can play a crucial role in LHPL devices whose ultimate goal is the reduction of energy in data centers, half of which can be eliminated if the use of water chillers is not needed, which becomes possible if the coolant leaving the condenser is hot enough to go straight to a cooling tower where it rejects the heat to the outside air. The remainder of this condenser is identical to the top one. The form factor for this liquid cooled condenser was chosen because it makes it possible to create compact liquid cooled condensers. The form of the condensation channel is not limited to concentric cylinders. An alternative form factor that is compact and provides excellent performance is a thin box shaped condensation channel that is surrounded on both sides with the external coolant. Three devices which use air and fins are about to be described followed by a liquid cooled rectangular condenser in FIG. 17 whose cross section is similar to the bottom device in FIG. 16.

Figure 18:
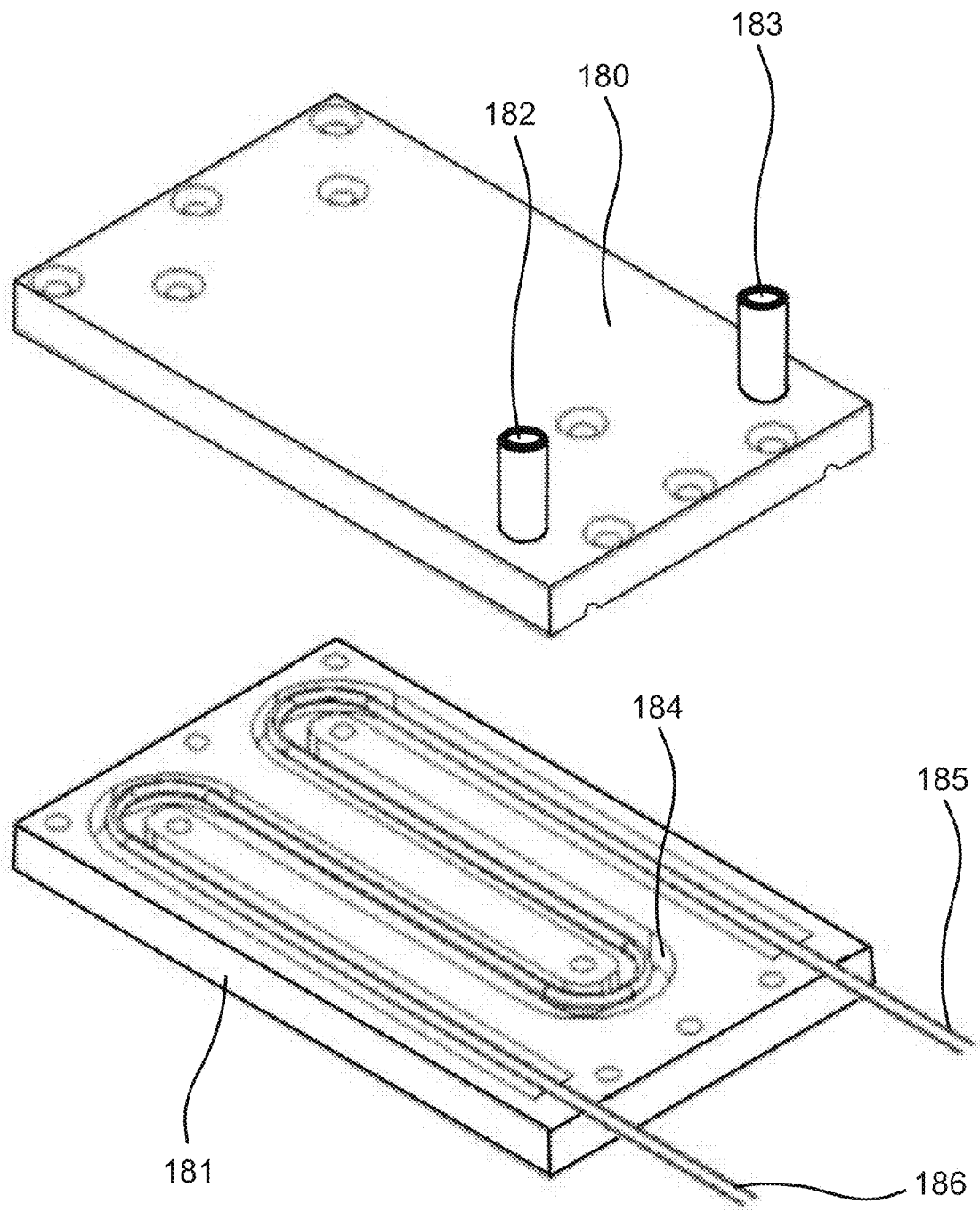
FIG. 18 shows a liquid cooled counter flow condenser that employs a channel made of a non-conducting material that is used in conjunction with a serpentine shaped condensation channel and a laminar flow disruptor to make a liquid cooled condenser module.
Figure 19:
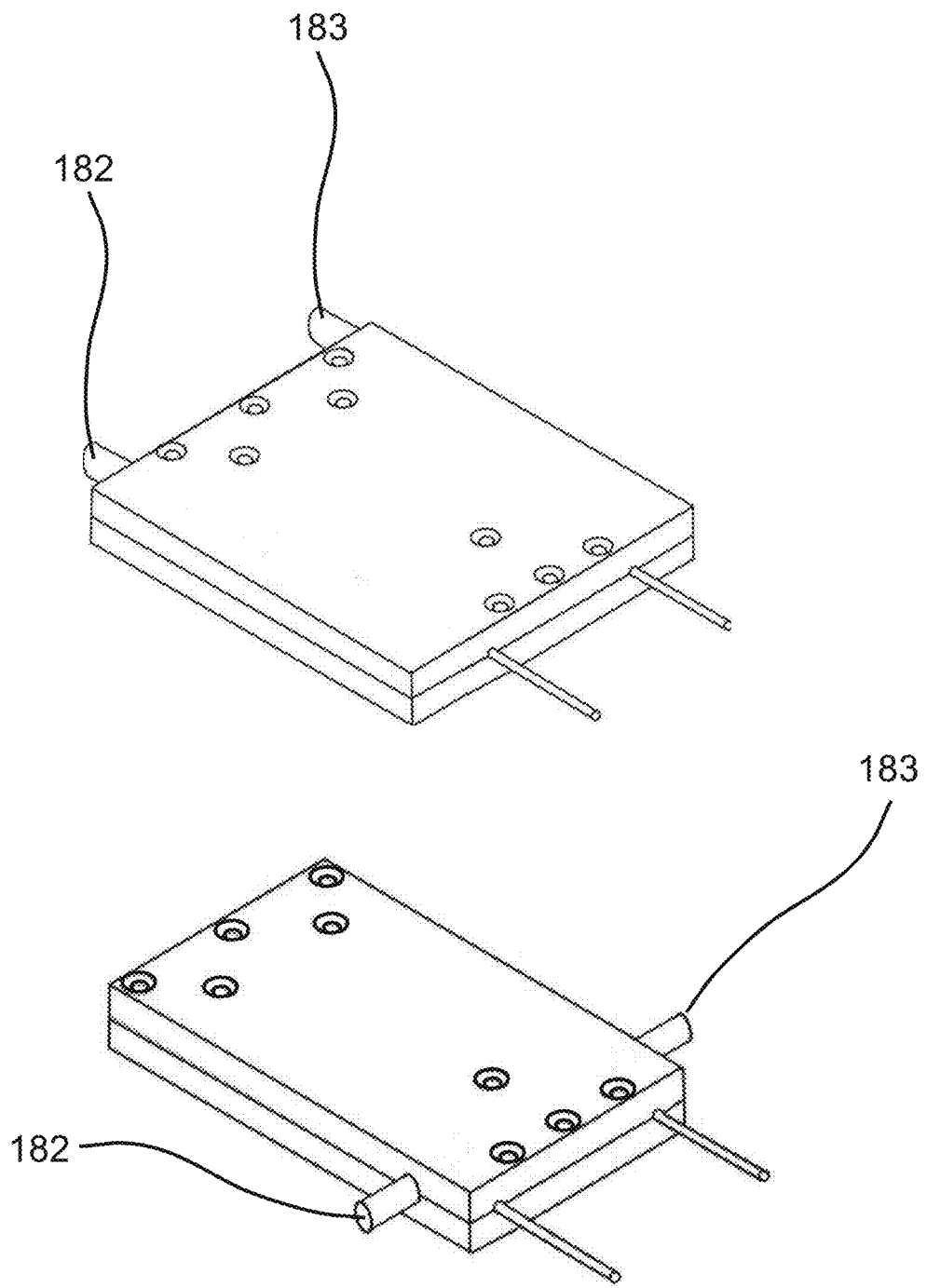
FIG. 19 shows alternative ways in which the condenser seen in FIG. 18 can be created with different to receive both coolants and working fluid coming in from different directions.

FIGS. 18 and 19 are for a direct liquid cooled counter flow heat exchanger that employed laminar flow disruptors to improve heat transfer between the working fluid and the condensation channel. At the time that we designed these devices, our goal shifted from simply cooling hot processors, to rejecting the external coolant as hot a temperature as possible. This condenser design enabled us to reduce the thermal resistance of an LHPL by a factor of close to 3 beneath the thermal resistance of an air cooled condenser The exact form of the liquid cooled condenser exchanger is not critical. The liquid jacket can be as simple as a pipe that encloses the condenser line. The distance that the condenser pipe travels while encased in a water jacket is. And, when the goal switches from simply condensing the primary vapor to condensing it while at the same time producing the hottest external coolant, then other things become important as well. These include preventing heat leaks across the condenser while at the same time making it possible for the smallest secondary coolant flows to be fully taken advantage of. All three criterion can be met in LHPL condensers making LHPLs probably the best devices available for not only efficiently transferring energy off hot running semiconductor devices but also producing secondary coolant flows whose temperatures are as hot as possibly can be obtained.

FIG. 18 shows what the assembled unit looks like. This particular exemplary embodiment was made of two pieces of plastic, 180 and 181 that were machined and attach together using 9 screws that passed through the upper piece of plastic 180 and engaged threaded holes in 181. The orientation of the devices is not critical, provided that the liquid is flown through the channel 184 in a counter flow manner in which the hot vapor arrives at the end of the heat exchanger opposite the point where the hot liquid return is situated. In both figures, we assume that 186 is the vapor input line, which makes 182 to hot water return. The chilled coolant enters the heat exchanger from the opposite side through pipe 183 near the point where the condensed primary coolant 185 returns to the LHP evaporator.

The ability of the LHP evaporator to accomplish the three critical tasks starts with their ability to drive primary coolants through long lengths of condenser tubing making it possible to employ large heat contact areas between the primary and secondary working fluids. Making the condenser jacket out of a thermal insulator solves the second problem. The third problem, making it possible to get good thermal conduction between the primary and secondary coolants even when the secondary coolant velocity has been reduced, is made possible in our case by the use of a condensation channel that has a laminar flow disruptor placed on either side of the condensation channel. When the disruptor is made of a thermally conducting material it can also end up increasing the effective area of the channel on either side. The use of a material which adds area needs to be weighed against the fact that this material can also reduce the thermal conductivity of the wall by increasing its effective thickness.

FIG. 19 shows alternate exemplary embodiments of this design that have liquid coolant inlet and outlet ports (182 and 183) in locations that make it feasible to employ these devices in different semiconductor cooling situations.

Figure 20:
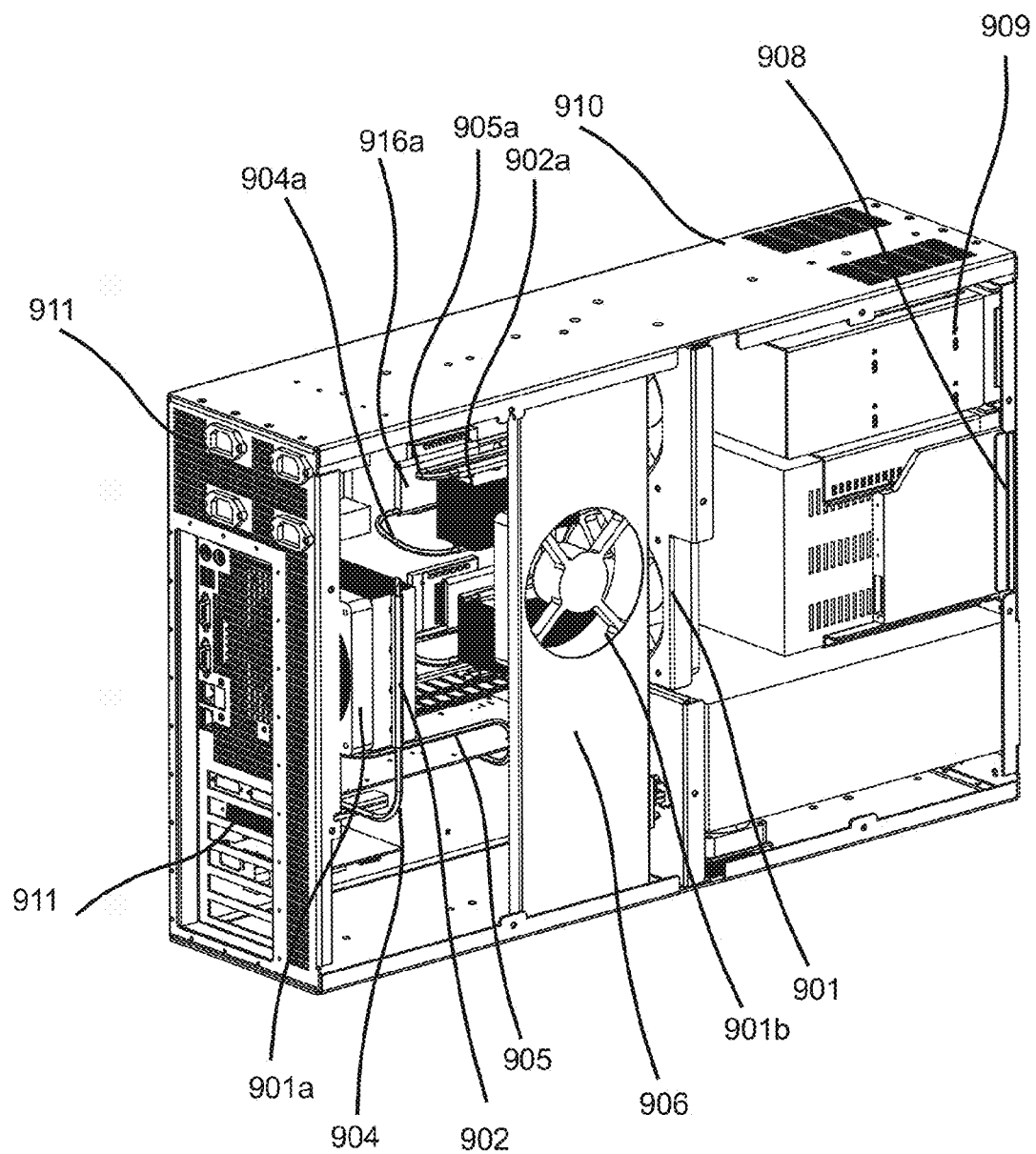
FIG. 20 is a 3D perspective on a tower chassis that employs three LHPLs, one to cool a PCIe card that employs a primary heat load as well as a pair of CPUs on its motherboard, all of which cause the heat being rejected to leave the enclosure without mixing with the incoming coolant.

FIG. 20 is a 3D exemplary embodiment of an enclosure typically called a computer tower chassis that can alternatively be laid on its side, in which case it functions as either a desktop personal computer or workstation. This embodiment includes a PCIe card 906 plugged into the computer's "IO channel" whose rear chassis outlet holes 911 can be seen at the left hand side of the chassis in the rendering and which is similar to the card being cooled by an LHPL in FIG. 7. The PCIe card 906 contains at least one component (not seen in FIG. 20) that rejects enough heat to warrant it be cooled using an LHPL device. In this example the LHPL employed uses a flat evaporator that cannot be seen in FIG. 20 as well as a pair of flat LHPL evaporators one of which, 916*a*, is called out to cool a pair of CPUs. In FIG. 20 the LHPL evaporator is thermally clamped to the primary heat source on the PCIe card that needs to be cooled. In FIG. 20 these evaporators are thermally clamped to a pair of CPUs 900 that require LHPL cooling. Other items that can be seen include the LHPL vapor line 904 used to cool the heat source on the PCIe add in card as well the LHPL's liquid return line 905 can be seen along with the condenser fins 902 that are bolted to in an exemplary rotary cooling device which in this embodiment happens to be a 120 mm exhaust fan 901*a*, that is mounted on the enclosure's rear wall. Similar fans are used throughout both of these figures, but can be replaced with either larger or smaller devices, provided that the airflow requirements needed to cool the devices are being met. As a general rule, the larger the rotary cooling device, the slower its blades or impeller will need to rotate resulting in a reduction in both noise and fan cooling power. Other items include the LHPL evaporator 916*a*, the vapor line for the upper CPU is labeled 904*a*, the liquid return line 905*a* can be seen connecting to the condenser fins that are labeled 902*a* which in this case share an exhaust fan bolted to the cover of the enclosures. The rear fan used to cool the PCIe LHPL is labeled 901*a* and it is mounted on the enclosure's rear wall. The fin pair 902 may be identical to those seen in FIG. 7. Two internal fans 901 can be seen that extract air out of the hard disk enclosure 908 as well as the peripheral enclosure 909 and can be seen along with the motherboard's CPUs 900 and DIMM modules 907. A fan 901*b* that is mounted to a structure that holds it against a side wall of the enclosure and is used to provide a cooling flow for the LHPLs used to cool both CPUs at the same time is also seen. The power supply can't be seen, but it does sit directly behind where 911 points out ventilation holes and the four AC power plugs on the rear wall employed by it, which suggest that this particular enclosure was designed to contain devices whose total power rejection approached one KW.

Figure 21:
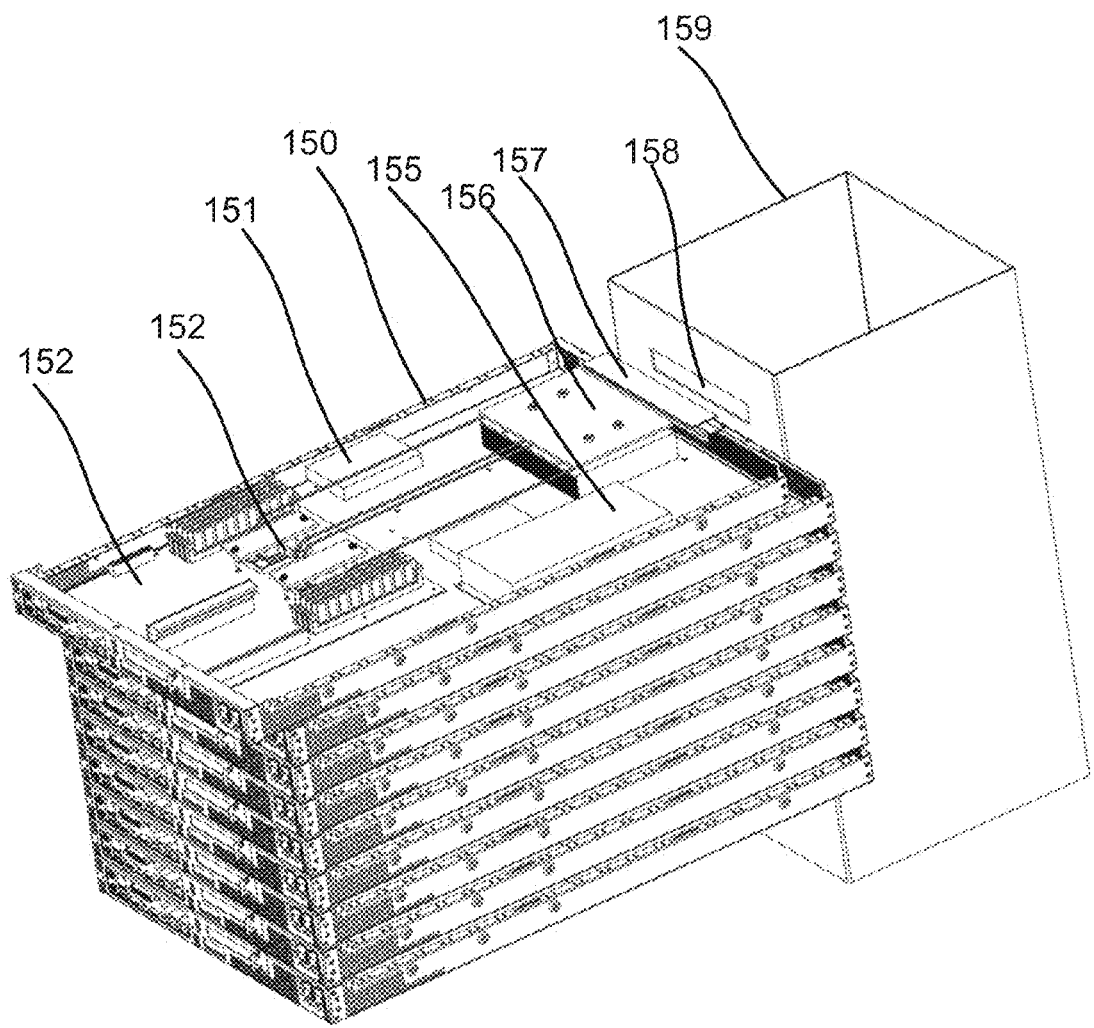
FIG. 21 is a perspective drawing that shows a stack of 1 U rack mount chassis, whose top most chassis is in the process of engaging an air duct used to remove air from all of the chassis in a rack cabinet.

FIG. 21 is a 3D rendering of an exemplary embodiment of a plurality of 1 U rack mount chassis that are being 100% air-cooled using a duct to draw air out of the chassis. The scheme employed is not limited to 1 U chassis, but can be employed by rack mount chassis of any height (1 U, 2 U, . . . NU, etc.). This approach eliminates the need for the exhaust fans and blowers employed in prior figures all of which employed either the 12V blowers or fans typically used to extract hot air from rack mounted chassis. The use of 12V fans to remove air is wasteful, as the power is most often provided by a power supply that converts AC to DC voltages. Such conversions are never 100% efficient and in general, employing power supplies within rack mount chassis to carry out unnecessary conversions is wasteful. The proper way to evacuate such a duct is using large fans powered by alternating current that sit somewhere outside of the rack cabinet although fans mounted on the rear door of a rack cabinet also work quite well and can be constructed to provide the same effect as seen in this figure when the rear door is well sealed to the rack enclosures being cooled. A convenient way to evacuate such a duct is employing the large AC fans mounted on the rear doors of a rack cabinet. Adding plenums (not shown in these drawings but obvious to anyone familiar with the art of fabricating ducts) that connect the duct to these fans is a simple way to simultaneously cut our recirculation within the rack cabinet and at the same time improve the performance of such fans. When this method is combined with water-cooled air heat exchangers placed in the path between the chassis and the duct, it makes it possible to return ambient air to the room eliminating the need for expensive refrigeration units that also take up a lot of space. The duct 159 in this exemplary embodiment has the air within it exhausted by a connection to some negative pressure source below the duct that in the case of an air-cooled data center that relied on its main water chilled heat exchanger only could be the main HVAC return line. The only difference between this exemplary embodiment and one that employed a vertically rising air column would be the orientation of the sheet metal tabs that get described below which get used to seal the duct when a chassis is removed. One of the most important features of the exemplary embodiment is the fact that there exists a seal between the chassis and the duct (typically a crushable material) as well as a method for closing off the slots in the duct that the air is being pulled through when a chassis is removed. One of the main benefits to the cooling of components within the electronics contained by the chassis is the ability to employ bleed air-cooling (i.e. admitting cool air into the chassis through vents placed about the chassis) that is not possible in a typical rack cabinet for the simple reason that there is no guarantee that the air that surrounds a chassis on its sides is cool. In fact, just the opposite, circulation paths frequently set up within rack cabinets about the chassis contained within that allow the hot air at the rear to make its way back to the sides and front. The system within the 1 U rack mount chassis in this exemplary embodiment is virtually identical to the systems rendered in FIGS. 1 . . . 4, employing a pair of LHPs whose evaporators 152 are seen along with the motherboard 153, a power supply 155, four hard disks 151 one of which is called out along with the chassis frame 150 and the single ended condenser 156 which employs a large heat sink mounted to the enclosure to which the condenser tubing is clamped and a horizontal tab 157 that opens a hole 158 in the ducting 159 when the chassis is inserted into the rack cabinet which employs a spring loaded flap that seals the hole in the duct when the chassis is removed from the rack seen in the next figure.

Figure 22:
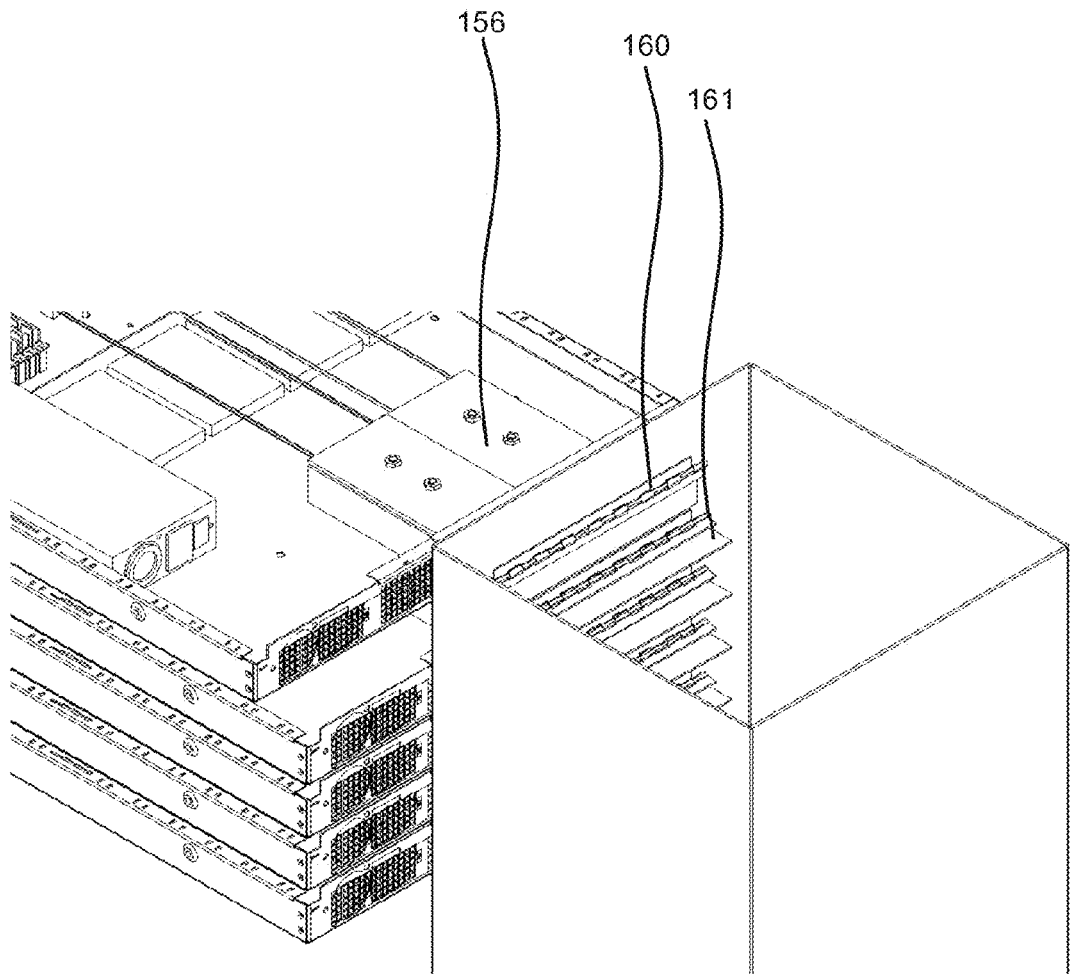
FIG. 22 is a cross section of the negative pressure duct shown in FIG. 21 which demonstrates how a metal piece on the 1 U chassis forces open upon insertion a spring closed flap which seals the duct when the chassis is not installed.

FIG. 22 is a side view of the exemplary embodiment shown in FIG. 21. The 1 U chassis 150 at the top of the stack of chassis can be seen to not be fully inserted into the open rack or rack cabinet. The horizontal tab 157 that gets used to push out the top duct sealing plate 161 along with the hinge line 160 can also be easily seen.

Figure 23:
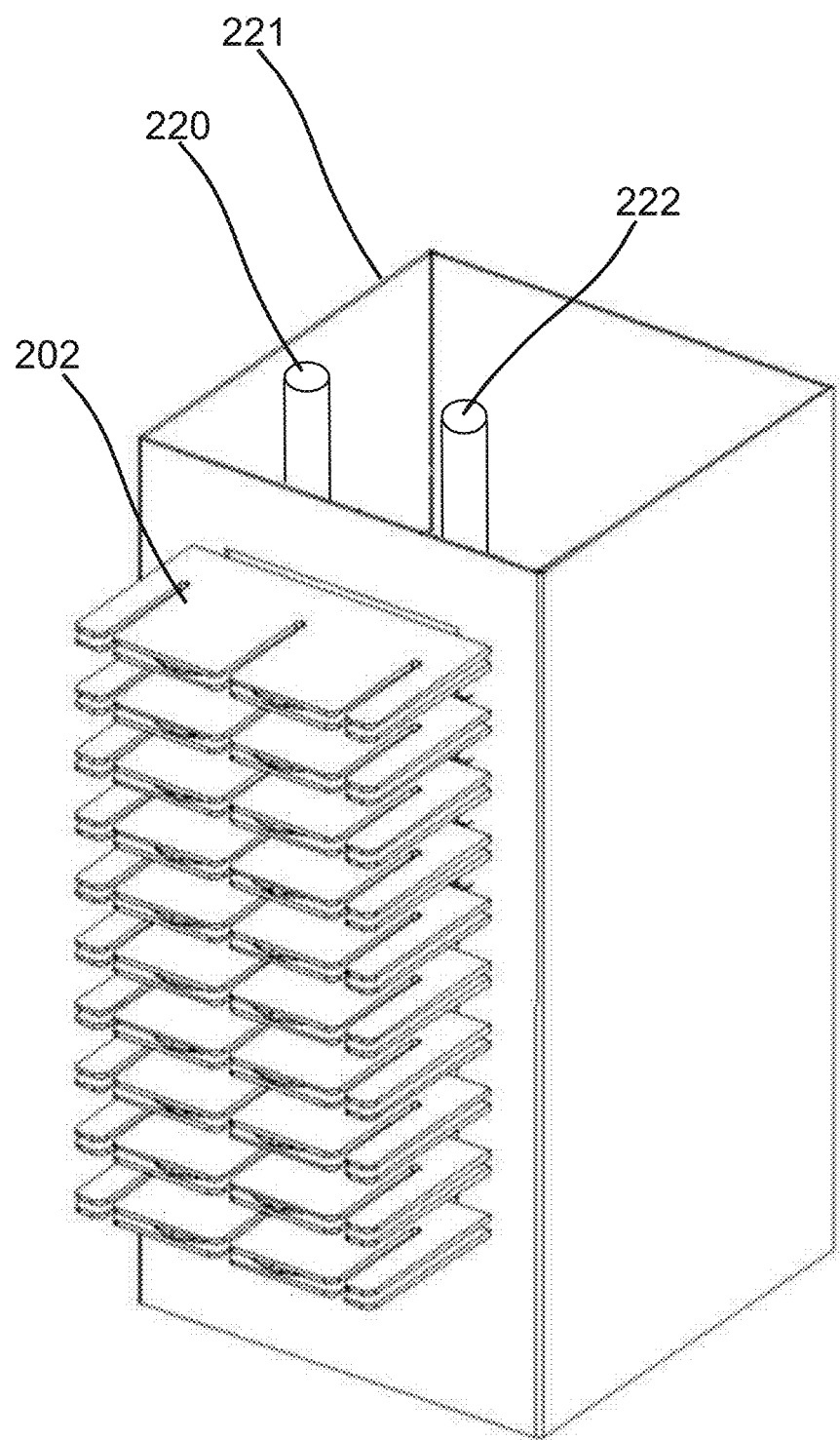
FIG. 23 is a perspective view of a stack of split condenser male cold plates that protrude from a negative pressure air duct used to cool 1 U chassis that attach to it.

FIG. 23 is the first in a series of exemplary embodiments of what we call a split condenser. This particular split condenser is actually a hybrid that combines indirect liquid cooling with air cooling. There are a number of issues that suggest that this is a good approach to cooling electronic devices that need to be "hot swapped" into and out of chassis that enable cards or chassis to be installed and removed while the remainder of the cards or chassis in a plurality of such devices continues to run. This method makes it possible to make and break thermal connections whose source of cooling is a chilled liquid, such as water without actually making or breaking a pair of interconnects that connect the enclosure being cooled with source of coolant used to cool it. In exemplary embodiment, a 1 U rack mount chassis has a slot cut in its rear that is capable of accepting a cold plate that accepts heat from a matching interfacing component within the enclosure that is connected to various devices within the enclosure rejecting heat. The dimensions of the chassis and the other components are not relevant to the explanation of the exemplary embodiment and need to be adapted to the particular situation by a chassis and thermal engineer familiar with all of the details. In this embodiment a chilled liquid flowing through pipes located in the rear of a rack cabinet behind the chassis being cooled is used to cool a pair of horizontal vertical cold plates that are thermally attached to a cold spreader 202 that receive external coolant from a pair of manifolds 220 and 222. There is no reason why the cold plates and their supply lines could not run horizontal. The clamping arrangement is an important part of the overall design, as it is needed along with a thermal interface material that helps make good thermal contact between the cold plate and the mating component inside of the enclosure which we call the cold spreader, for the apparatus to work.

In general, split condensers are not as efficient as the direct liquid cooled condenser design that we terminate this disclosure with. When working with them, one becomes aware of the fact that raising the temperature of the output flow is a non-trivial exercise. What makes it difficult to raise the temperature of the output flow from a water-cooled condenser, be it direct or indirectly (i.e. split condenser) cooled is the fact that for any design that employs heavy copper plates to exchange heat there are thermal conduction shorts across the plates used for the cold spreader and cold plate which enable heat to move from the hot to the cold side of the split condenser. Such thermal shorts are no different than the thermal short that occurs within an air cooled enclosure in which the heated air mixes with the ambient air, reducing the temperature of the effluent leaving the chassis and thereby reducing the COP of any cooling system employed to provide either chilled water or air out of the hot side of the condenser and exchanges it with the cold side, reducing the delta T across the condenser and reducing the temperature of the effluent. The only way to eliminate this problem is to isolate the hot and cold sides of the condenser from each other. The design in FIG. 30 does precisely this.

FIG. 23 is an oblique view of the hybrid air/split condenser we started describing above. A section of duct 221 that may be used to exhaust the air out of a group of rack mounted chassis (shown in FIG. 24) which simultaneously employs a series of water cooled cold plates that get inserted into a multitude of rack mounted chassis and get used to simultaneously cool an LHPL condenser while at the same time cooling a heat exchanger that removes heat from the air leaving said chassis.

Figure 24:
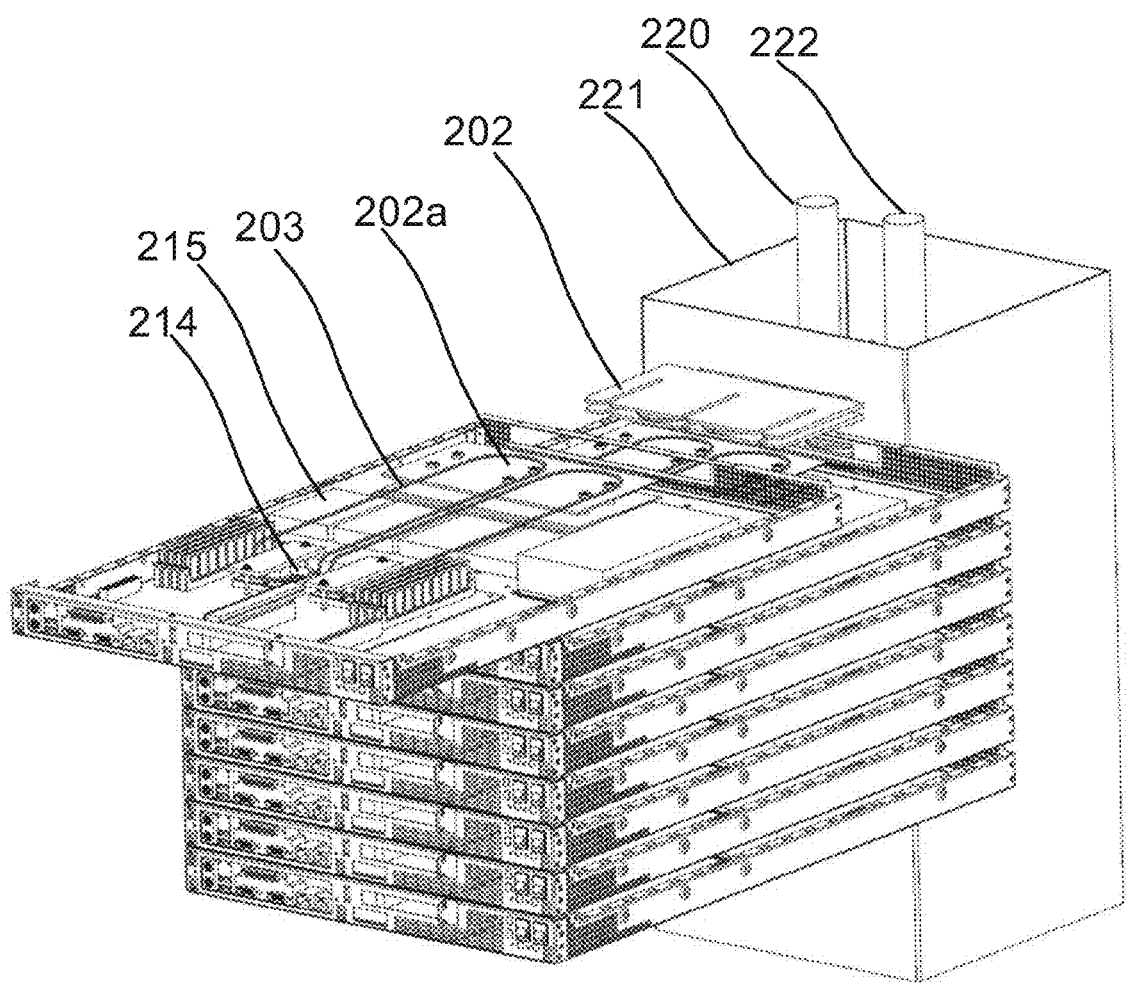
FIG. 24 is a perspective view of a stack of 1 U chassis that employ split condensers that attach to the duct in FIG. 23 and employ the negative pressure duct to remove hot air from them.

The design that is shown in detail in FIG. 24 employs a rack mount chassis, which may be 1 U tall, which may not need any fans at all within it to cool the contents of the chassis. This design provides primary and secondary cooling using the duct to suck air through the chassis while at the same time cooling the air that passes through the air heat exchanger that is a part of the split condenser seen in FIG. 24. The primary and secondary heat loads are rejected using a plurality of chassis that employ a plurality of split condensers 202 that can be seen in FIGS. 23 and 24. This particular duct employs the rack mount chassis seals described in FIGS. 21 and 22. A pipe 220 is used to feed cold water to the plurality of cold plates seen and another pipe 222 gets used to return the hot external coolant to the next cooling loop in the series that ultimately will carry the rejected heat most often to a cooling tower or a heat exchanger cooled by a body of water. The pipes that carry the secondary coolant to and from the split condenser are labeled 205 and 208. The precise location of the pipes 220 and 222 within the duct is not important and can change as a function of many design parameters.

FIG. 24 is an oblique view of a plurality of split condensers that employ an air heat exchanger in contact with the split condenser cold plate to cool the air leaving a rack mount 1 U chassis. The pipe 220 that feeds cold water to a plurality of cold plates 202 and the pipe 222 that returns the hot water to the next cooling loop can also be seen. The top most 1 U rack mount chassis has still to be slid into place in the rack cabinet, making it possible to see its cold plate 202 as well as the other half of the split condenser 202*a* which we call a cold spreader. The condenser tubing 203 will normally be brought into contact with the cold spreader 202*a* using solder or some other material well which bonds well to both the condenser tubing and the cold spreader. Within the topmost chassis we have labeled the condenser 203, a hard disk 215 and an LHP evaporator 214 that is used to cool one of the two processors being cooled in this exemplary embodiment. Also visible in this figure but not marked are a second LHP, memory, power supply, three more hard disks and a motherboard. This system employs the 1 U rack mount to duct sealing method described above.

Figure 25:
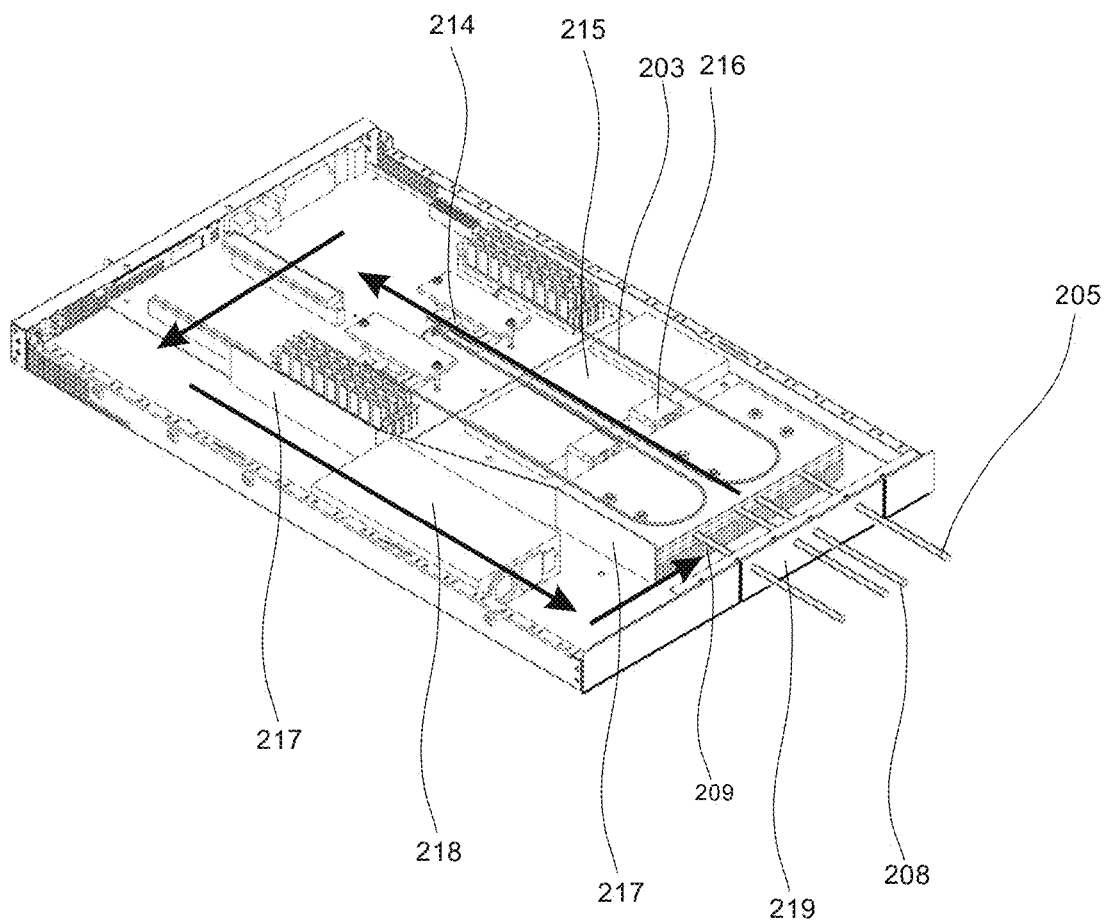
FIG. 25 is a perspective view which shows a sealed 1 U chassis in which an LHPL split condenser is employed that also cools a heat exchanger that cools the air within the enclosure which circulates about the enclosure and in the process cools the remainder of the secondary heat loads using air chilled by the split condenser's cold plate.

FIG. 25 is an oblique view of a similar exemplary embodiment of a large horizontal same split condenser, in which we almost seal the chassis off from the air in the room or the rack cabinet. One of the goals of this design is to let ambient air into the enclosure slowly, possibly feeding pressurized air that has been de-humidified to avoid using humid ambient air much as possible eliminating the need for conditioning data center air which often involves drying out the heated air returning from the data center as it passes through a heat exchanger and then reintroducing moisture mostly to make the room habitable for humans. The large arrows seen inside of the enclosure depict the circulation pattern of the air within the chassis. A pair of fans 216 sucks air through the split condenser air heat exchanger that is no longer called out but whose fins can easily be seen sitting beneath the remainder of the split condenser. The fans are interfaced to the split condenser using a baffle not depicted here. The airflow pattern is created using a containment baffle 217 that forces the air leaving the fans to travel to the front of the chassis before being sucked back to the rear of the chassis after it passes around the baffle. The airflow is helped by the positioning of the power supply 218 whose fans accelerate the air passing through before it turns the final corner and again passes through the finned heat exchanger that is part of the split condenser depicted in FIG. 25. This chassis partially isolates the internal air within the chassis from the air within the room and rack cabinet. In the rear, a plate 219 that is attached to the cold plate's water supply lines 205 and 208 has been added to seal the back slot in the chassis using a compression gasket at the point where the chassis is fully inserted into the rack cabinet and the cold plate is fully inserted in the split condenser. While this chassis does employ several fans, some of which might need to run at high speeds, it still consumes much less energy than a typical 1 U chassis that can require as many as 18 fans to cool the electronics. This energy savings is a direct result of the fact that the primary load of the unit amounts to over 60% of the heat being rejected and this heat is being directly rejected to a chilled liquid instead of air. Not only that, the air that is circulating within the chassis will have very little need to leave it, eliminating the need for air-cooling outside of the chassis. This eliminates the energy typically expended within rack cabinets and the data center room to move air while at the same time eliminating the need for large heat air heat exchangers located within or adjacent to the rack cabinet to handle the high heat loads that densely packed rack mount chassis can produce. With new semiconductor devices hitting the market that reject as much as 500 Watts, it becomes possible to create 1 U rack mount chassis that reject up to 2 KW. Such rack mount chassis can reject up to 80 KW when installed in a 40 U tall rack cabinet. Solutions like the one shown in FIG. 18 are able to handle heat loads of this magnitude and are much more energy efficient than solutions which employ direct water cooling to cool CPUs instead of the factor of 100 more energy efficient two phase cooling provided by LHPLs. In addition, keeping the circulating air path within the chassis itself (instead of letting the air wander about a rack cabinet or out the rear door to the data center's CRAC unit heat exchanger) dramatically reduces the energy required to reject the secondary heat loads.

Figure 26:
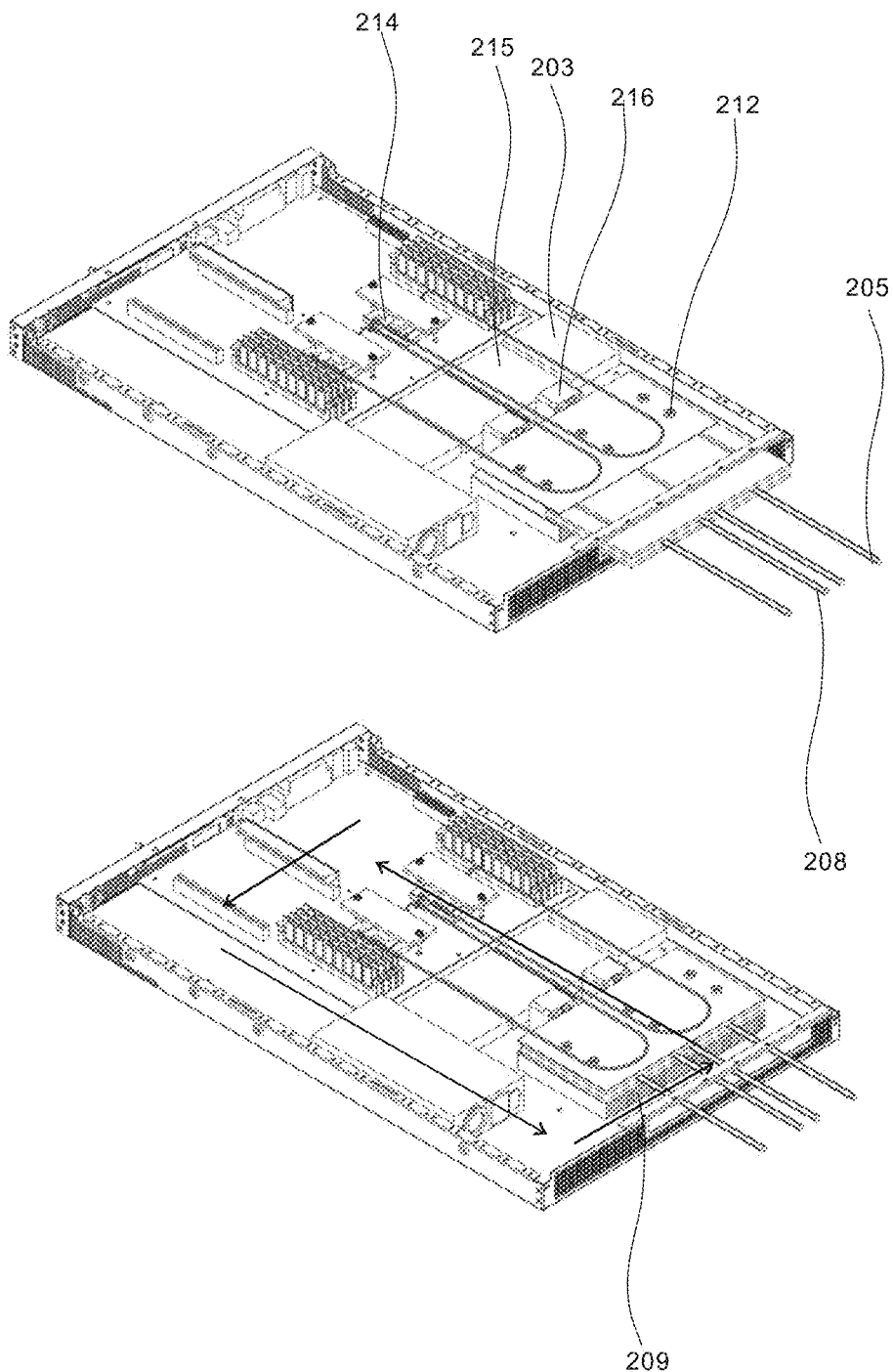
FIG. 26 contains before and after perspective views of the split condenser components described in FIG. 25 coming together in a 1 U chassis.
Figure 27:
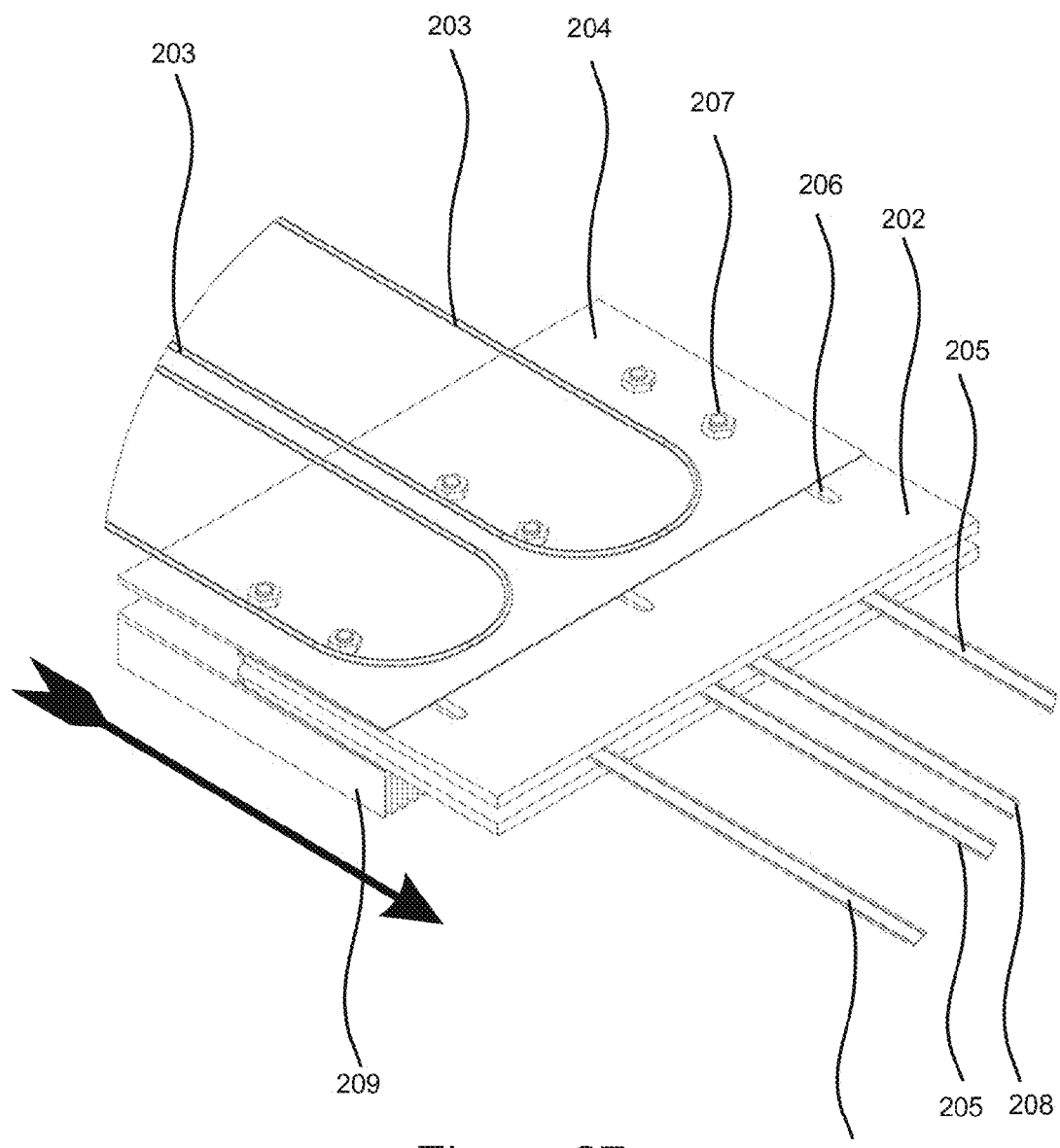
FIG. 27 contains a perspective view of the split condensers seen in FIGS. 25 and 26.
Figure 28:
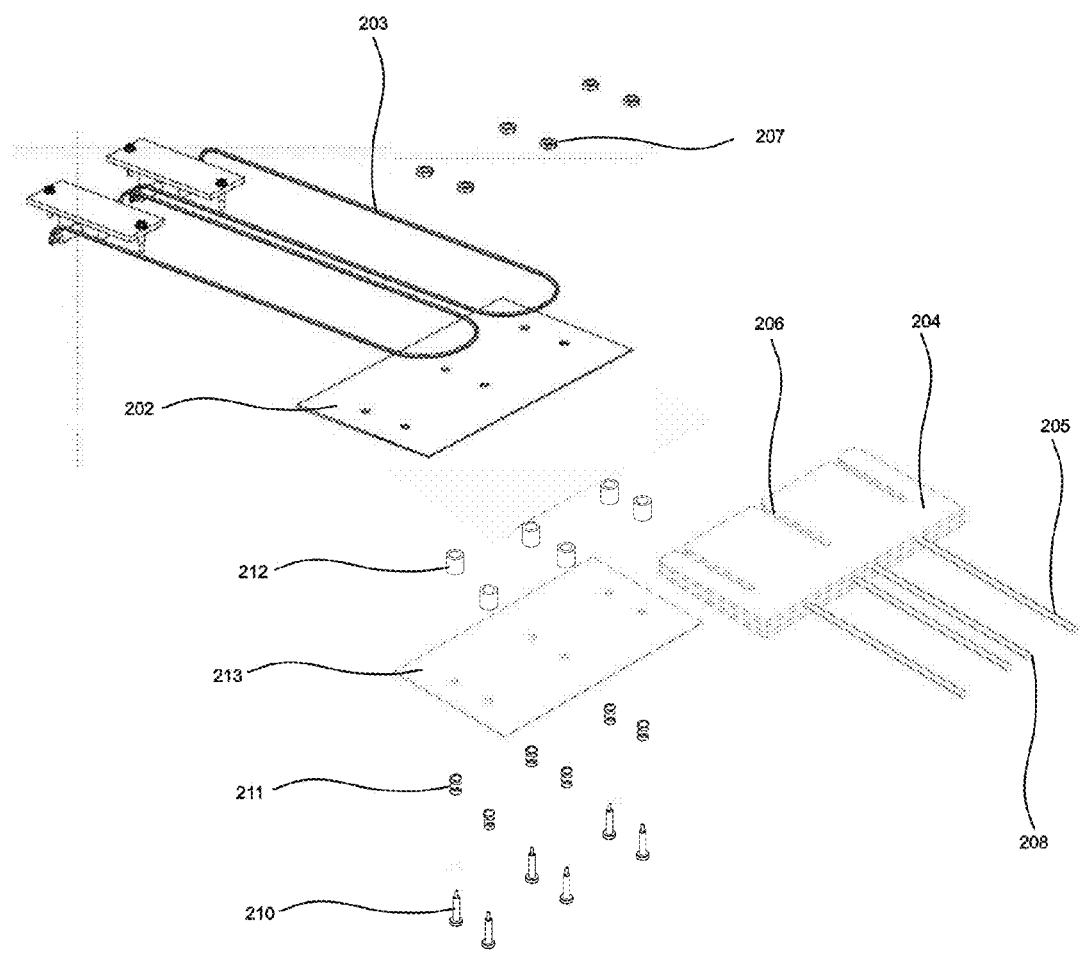
FIG. 28 is an exploded view of the hardware described in FIG. 27.

FIG. 26 provides an oblique 3D view of the split condenser design detailed in FIGS. 27 and 28 that resides within the 1 U rack mount chassis. In this exemplary embodiment two LHPs are being cooled one of which 214 is called out. The bottom half of the figure is identical to the top, and shows the same units after the cold plate is fully engaged. The total number of LHPs used to cool primary heat loads is a function of the number of motherboards being installed in the rack mount chassis: using current motherboard designs up to four processors can easily be mounted in a 1 U chassis and eight in a 2 U tall chassis. In FIG. 26 the bottom chassis has been fully inserted into its location in a rack cabinet or rack, as can be seen from the fact that the split condenser's cold plate is fully inserted within the combination cold spreader/liquid assisted air heat exchanger. This chassis happens to be a 1 U rack mount design, but the size of the rack mount chassis is not fixed: the chassis employed may be smaller or larger. Care has not been taken in this figure to make the modifications to the chassis that one might make to improve its cooling performance. For example, the rear wall of the chassis contains breathing holes in it that are left over from the normal manner in which power supplies get installed (i.e. near the rear wall). The drawing calls out one of four hard disks 215 and a pair of standard high speed 1 U fans, one of which is labeled, 216. These figures do not show a baffle that couples the fans to the air heat exchanger that forms the lower half of the female split condenser. In the top half of the figure, the cold plate can be seen entering the heat spreader air heat exchanger combination as the chassis gets inserted into a rack cabinet that contains a cold plate mounted on pipes. Some additional supporting structure for the cold plate will probably need to be provided as well. The cold plate is stationary and is permanently attached to a pair of chilled liquid pipes that typically would reside within the rack cabinet behind the chassis. The bottom half of the figure shows the chassis fully inserted into the heat spreader air heat exchanger split condenser combination. In situations where there is adequate air flow leaving the chassis and fin area between the air leaving it and the fins, this particular arrangement is one of those that makes it possible to return the air leaving the chassis to the ambient temperature of the air in the room eliminating the need for refrigeration units that take up space in rack mount chassis in situations where the heat being rejected within a rack cabinet exceeds 25 KW. Again, we should point out that split condensers are not limited to rack mount chassis and when used in rack mount solutions are not limited to 1 U chassis.

FIG. 27 shows the details of a split condenser whose contact area between its cold plate and cold spreader is very large. The cold spreader 204 that is in contact with the condenser lines 203 is actually a component that becomes a part of the rack cabinet. The female portion of the rack mount enclosure is mounted to the enclosure and can be seen progressing to the rear (see arrow) where it engulfs the male cold spreader. The circulating air within the enclosure whose direction is not called out can be seen in the prior two figures which employ the same split condenser design. The motion of the air has been arranged so that it passes through the fins of the air heat exchanger plurality of fins 209 can be seen in bottom half of FIG. 26. The fins of this heat exchanger are cooled by virtue of the fact that their base is in thermal contact with the bottom half of the cold plate whose upper plate is called out as 202. As it exits this particular split condenser it passes through a finned heat exchanger 209 that in this case sits below the cold plate 202. The split condenser does not need to employ a liquid assisted air heat exchanger, but can be created using a pair of cold spreaders both of which are used to cool LHPL evaporators or possibly a pair of air heat exchangers, depending on the nature of the devices housed in the rack mount chassis can contain any combination of primary and secondary heat loads. The cold plate in this instance is formed from a pair of identical metal pieces that may be sandwiched around a U tube through which a chilled liquid flows. In this possible exemplary embodiment the chilled liquid can be seen entering the cold plate 202 through a U shaped pipe 205 which exits the cold plate at 208. When the cold spreader and finned heat sink within a chassis in this particular exemplary embodiment passes over the cold plate, six bolts whose precise number is again a function of the mechanical design and the size of the split condenser that employ springs 211 shown in FIG. 26 get used to pull the cold spreader down on top of the cold plate when it is being inserted. The cold plate has slots 206 that make it possible for the cold plate to enter the female cavity without hitting the clamping bolts 210. The cavity is prevented from closing up using by six that sleeves that fit around the six bolts 212. A second set of identical chilled liquid pipes are drawn to the left but not labeled. There is nothing unique about the particular way in which the cold plate is fabricated. It could just as easily have been cooled using a single entrance and exit pipe that fed a serpentine section of pipe instead of a U channel or a channel that was machined inside of the cold plate that was intended to provide a counter-flow cooling path. The choice of the precise method used to cool the cold plate is a function of the design constraints, including the cost, heat being rejected and thermal resistance. There is also no need for the split condenser to sit inside of a chassis, it can be located behind the chassis in the rack cabinet and there is also no need for the male portion to be a cold plate: it is possible to employ a variation of the design in which the LHP condenser tubes are embedded within a male device that gets inserted into a pair of female cold plates.

FIG. 28 provides the details of a one of many possible mechanisms that can be created to apply clamping pressure between a pair of female plates. The bottom plate in this exemplary embodiment could be a spreader plate (we did not draw any condenser lines on it for this case) or a shim plate that was used with an extruded air heat exchanger that is ultimately in thermal contact with the cold plate. For the cold plate 204 to be easily inserted between the cold spreader 202 and the bottom plate 213, it is necessary to provide an inclined plane whose surface is "greased" with a thermal bonding material. As the cold plate rides into position (and the motion in the case we are dealing is relative, the actual motion comes from the chassis being inserted: the cold plate is fixed and enters the female section as the chassis that contains it is inserted into a rack cabinet) the inclined planes of all four surfaces exert vertical pressure on each other which is resisted by a set of six springs. The bottom shim 213 of the heat exchanger in this exemplary embodiment is attached to the chassis. For this scheme to work, the height of the cold plate needs to be correctly set up so that at the end of the travel it comes into contact with the shim, as neither have a lot of vertical freedom. The upper cold spreader, though, is free to move up and down, easily bending the LHP condenser lines 203 which are both small and fairly flexible. The vertical clamping pressure is provided in this exemplary embodiment by six bolts 210 that pass up through six springs 211 before passing through the bottom plate 213 and a set of six sleeves that guarantee that the gap between the top 202 and bottom 213 of the female cavity stays open. The top of the bolt 210 has a shoulder and a smaller threaded section. The shoulder, screw and nut 207 make it possible to fix the end of the bolt to the cold spreader plate 202. When the cold plate is inserted, the springs allow the cold spreader to rise, while at the same time providing vertical clamping pressure on the entire assembly.

Figure 29:
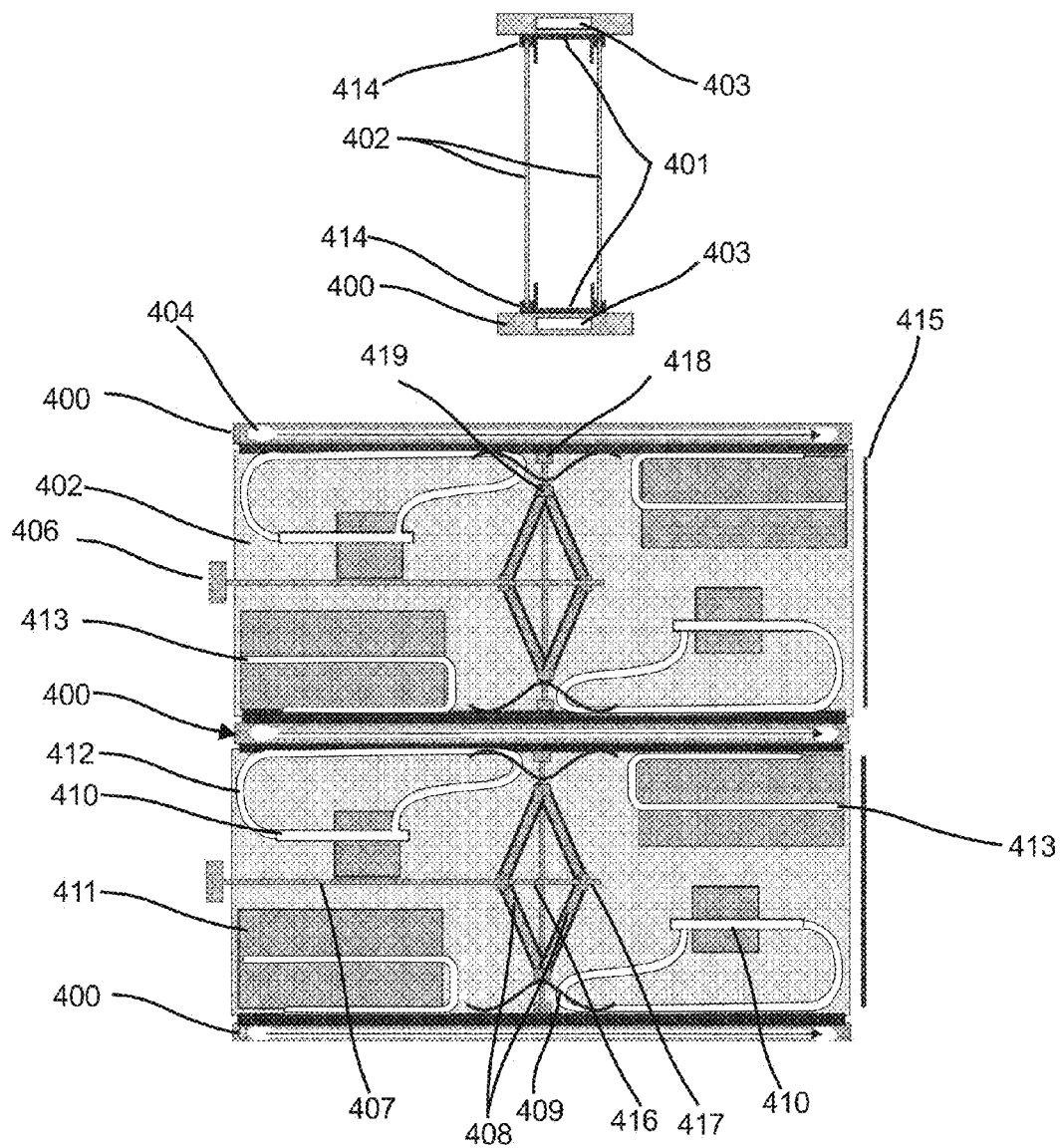
FIG. 29 contains a pair of side views of an LHP split condenser designed to cool processor blades that employs a combination of cold plates that are fixed into the chassis and cold spreaders that are attached to the blades which slide into place and employ a scissors jack to provide the thermal contact interface pressure.

FIG. 29 depicts a pair of "blades:" single board computers that are designed to slide into an enclosure that has a backplane 415 that is designed to accept mating sockets that provide the blade's PCB 402 with the power needed for its electronic components to function. This approach to split condenser design does away with a rear exit interface to a chilled liquid. What we do instead is employ cold plates 400 above and below each of the blades being cooled. These cold plates presumably receive their coolant from pipes that run up and down the sides of the enclosure used to contain the blades and which get delivered to them at the front (left side in FIG. 19) of the chassis, delivering the coolant to a channel in the rear before it leaves to go back to the return pipe. What makes the design unique and novel is the use of cold spreaders 401 that are made of U channels and which upon insertion of the blade into its enclosure, make contact with the cold plates, top and bottom. Once installed and seated in the sockets that mate with the backplanes 415, a scissors jack 407, 408, 416, 417, 418, 419 is employed to apply the clamping pressure to a spring 409 the cold spreader channel which is in thermal contact with both LHP condenser lines in this exemplary embodiment and standard heat pipes which are being used to cool DIMM modules with a copper heat spreader that fits over the modules and is thermally attached to them.

The upper portion of the figure is an end on view of the blades inserted into the chassis. The end view provides a detailed description of the cooling arrangement. A pair of cold plates, 400, each cooled by a liquid stream 403 is employed to cool the components on the blade employing a split condenser. The blade PCBs 402 slide into the enclosure using "card edge guides" 414 that are designed to both guide and hold the PCB as it slides into place. Between each of the card edge guides used by adjacent blade PCBs we have inserted a "U channel" 401, at both the top and bottom of the blade. These U channels provide the metallic component that defines the cold spreader and are in thermal contact with the cold plates, LHP condenser lines 412 and DIMM module heat pipes, 413. The blades are inserted into the electronic enclosures with their U channel cold spreaders 401 making light contact with the cold plates 400 that they will become thermally attached to after the board is completely inserted into the enclosure. For the channels 401 to make good thermal contact with the cold plates, 400, it is necessary to apply pressure to them.

In this kind of situation there are few possibilities for creating this pressure. The method we have chosen to provide the clamping pressure, which is certainly not unique but does demonstrate a possible approach, is to employ a scissors jack with arms 408. The jack is engaged using a knob 406 that comes out the front of the blade and uses a shaft 407 and threaded nuts 417 to squeeze the two arms 408 of the scissor together, creating a vertical compression stress on the springs 409 that in turn is applied to the channels 401. The squeezing action is effected using a pair of threaded nuts, 417, one of which is called out and is opposed by a second in each jack. As the threaded section of the shaft 416 turns the two nuts 417 get pulled together putting opposing forces on the springs, 409, one of which is being used to exert pressure on each of the cold spreaders 401. The sleeve 419 rides up and down on a vertical shaft not called out which attaches at its end to a cold spreader with a female attachment 418 that holds it snuggly to the channel.

The cold plates 400 are obvious in the side view and we mark the cold (404) and hot (405) liquid coolant channels that feed them at the top as well as the LHP 410 and its condenser lines 412 that get used to cool the processors which sit beneath them. The memory region of the card 413 is also called out as well as the device used to cool the DIMM modules, which employs an ordinary heat pipe 413 whose condenser is also thermally attached to a cold spreader. The balance of the components on the board that dissipate energy can be easily cooled using a copper mask that fits over them and is attached to them using a thermal interface material that is in turn attached to either the LHP or the heat pipe used to cool the DIMM modules. Or alternatively, the ground planes of the PCB can be thermally attached to the cold spreaders using a flexible sheet of copper made of shim stock that is soldered to the PCB and gets inserted between the cold spreader and the cold plate.

For this blade cooling solution to work, the thermal resistance of the split condenser defined by the cold spreader and the cold plates has to be adequate. In situations where the cards are spaced on 1 inch centers and are 18 inches deep, this solution provides 36 square inches of interface area between each of the cold spreaders and their cold plates. Based on earlier experiments this ought to handle at least 500 Watts of power per card. Sixteen of these devices packed into a chassis that is 7 inches (i.e. 4 U tall) will reject 8 KW, and in a 40 U tall rack cabinet this results in a cooling system that will handle 80 KW! This cooling solution also turns out to be much more efficient than any blade cooling solution that employs air and direct water cooling, both of which require additional power. The power densities here are high enough to suggest that the resulting water might even be hot enough to be sent directly to a cooling tower bypassing a systems water chiller. But, since we haven't built one of these units, we feel it is premature to make this claim, especially considering the fact that the split condenser here does not employ counterflow principles like the unit we are about to describe.

Figure 30:
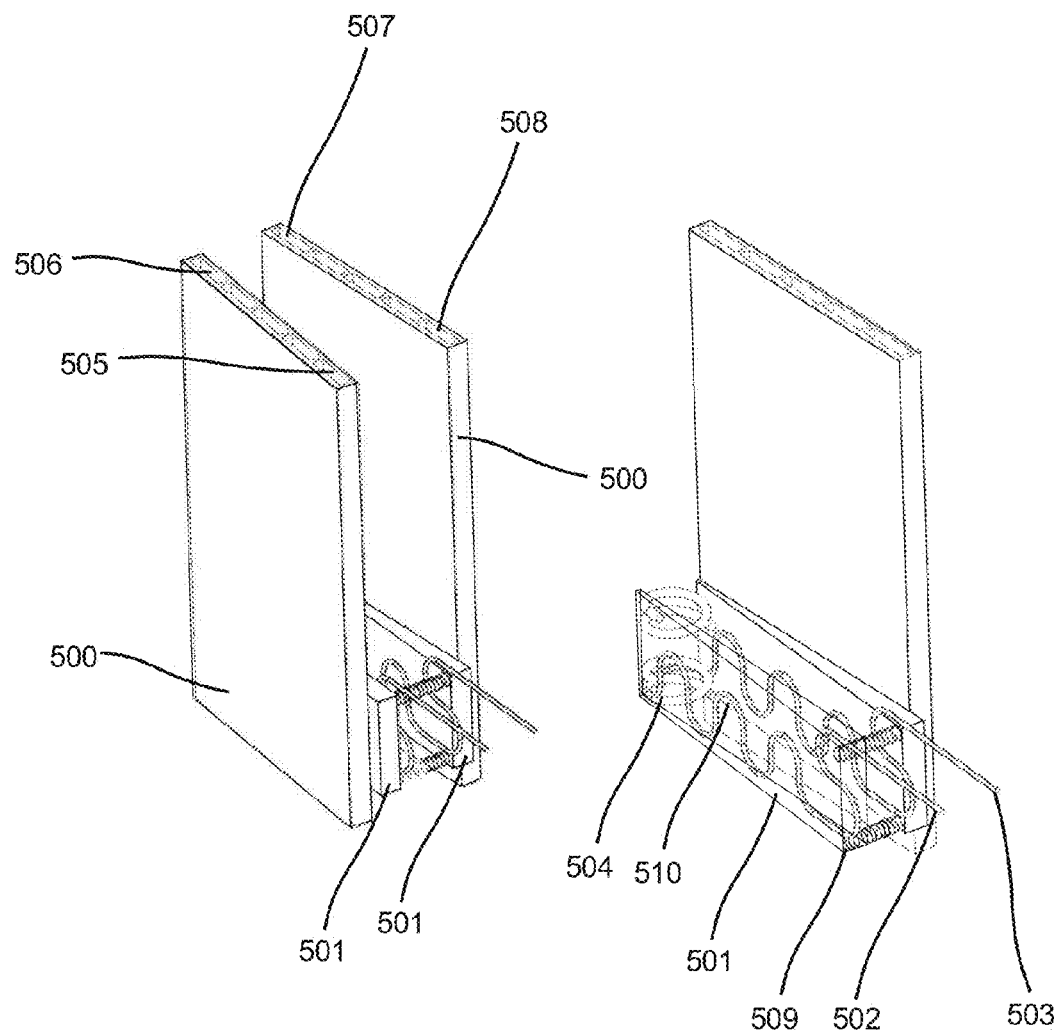
FIG. 30 is a 3D perspective drawing which demonstrates how to make a split condenser that employs a counter flow architecture and which employs a cold spreader that sits outside of a chassis at its rear and slides into a pair of vertically oriented cold plates that are brought into contact with the cold spreaders employing springs to create the clamping pressure between the cold spreaders and plates.

FIG. 30 shows a split condenser which employs a pair of vertically oriented segmented cold plates each labeled 500 and 501 that sit at the rear of a rack cabinet. Some provision must be made for holding the two cold plates at a precise distance from each other so that when finally clamped to the cold spreaders 501 good thermal contact is made between the cold plates and cold spreaders across their entire contact area. The cold spreaders slide into the V shaped space between the cold plates compressing a pair of springs at the rear 504 which also act a hinges as well as a pair of spring at the front 509 that are also mounted top and bottom. Any mechanism which makes it possible to insert a pair of cold spreaders between a pair of cold plates that also provides enough clamping pressure to establish good thermal contact will suffice. The incoming working fluid vapor enters the condensation channel 510 through 502. For the condenser to achieve counter flow operation that means that the hottest external coolant must leave the left hand condenser through cold plate segment 505. Walking around the cold plates that means that the left hand cold plate receives its coolant in segment 506, which is hooked up to the exit port of the right hand cold plate 507 making segment 508 the first segment to receive coolant. At the ends of each of the cold plates, there are seals which direct the coolant through the segments so that the coolant gradually gets hotter as it moves from 508 to 507 to 506 to 505. The ideal material to make the cold spreaders out of is copper. The cold plates can be extrusions out of any metal with descent thermal conductivity.

Figure 31:
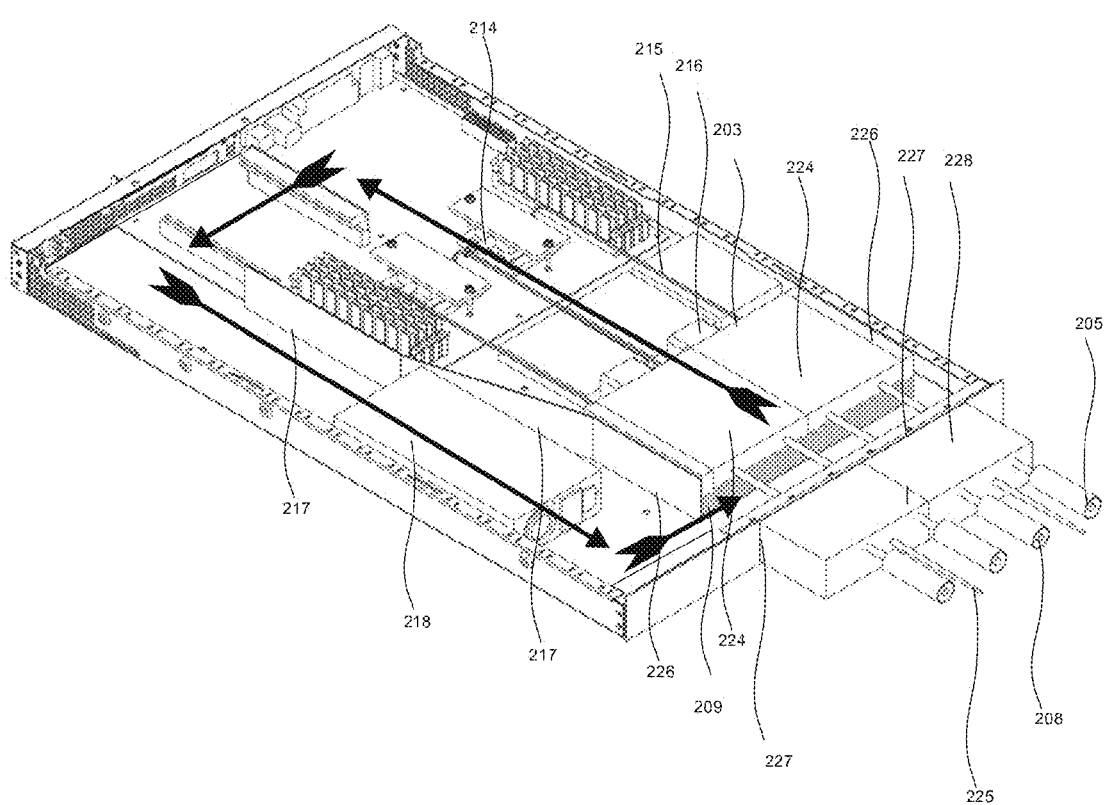
FIG. 31 is a perspective view which shows a partially sealed 1 U chassis in which a pair of LHPLs each of which employs a liquid cooled condenser that is fed using quick disconnects that provide it with external coolant can also be used to cool a heat exchanger which sits beneath the liquid condensers and uses the external coolant to simultaneously cool air that is circulating about the enclosure to cool the secondary heat rejecting components.

FIG. 31 is an oblique 3D diagram of a specific exemplary embodiment of a very efficient method for cooling electronic devices enclosed in an electronic enclosure that has direct access to an external liquid coolant that implements one of the general claims made by the disclosure. The electronic enclosure drawn happens to be a 1 U rack mount chassis, but may be any electronic enclosure with direct access to a chilled liquid manifold. The specific implementation drawn here employs a particular method of delivering chilled coolant to the electronic enclosure but any method that suffices to deliver coolant to the enclosure will also work. The main features of the exemplary embodiment include:

1) The use of energy efficient passive devices of any type, including LHPs, LHPLs and ordinary heat pipes to remove the primary heat load from the devices rejecting it and to deliver this heat load to one or more efficient direct liquid cooled heat exchangers.

2) A method for removing the secondary heat load and transferring this heat load directly to a chilled liquid, that may employ one or more methods including combinations thereof, including direct liquid cooled closed loop air circulation, passive connections between the secondary components and a chilled liquid cold source such as a cold plate, chilled liquid cold plates in contact with PCBs (see section in definitions which discusses how internal layers of PCBs are employed to gather secondary heat loads) enclosed by the enclosure and circulation of air within the chassis in a closed loop that does not involve the use of a chilled liquid air heat exchanger. The last method was specifically included in the list of secondary methods to allow distributed cold plates within the chassis to directly cool the PCBs that reject most of the secondary heat (i.e. heat other than the primary loads) including motherboards and power supplies while at the same time employing circulating air within the chassis to gather up the remainder of this heat and allow it to be inexpensively exchanged with the PCBs being cooled by cold plates, which just happen to contain a lot of copper distributed over large surface areas.

The specific exemplary embodiment in FIG. 31 is for another "almost sealed 1 U chassis" that employs a pair of LHP evaporators 214 that are cooled by a pair of counter flow LHP heat exchangers 224 previously described, to cool a pair of processors. This particular exemplary embodiment is similar to that shown in FIG. 25, with the exception that we have now replaced the split condensers (that employ permanently connected liquid connections) with a liquid cooling system in which we employ quick disconnects 205 and 208 (note we are calling out two of the four liquid feed lines and are using the same numbers we previously did for the hot and cold chilled liquid lines to now point to the quick disconnects that they are attached to. The quick disconnects happen to be female components, but they could just as easily have been male. They protrude into a small optional duct (not shown) that surrounds the main liquid feed mains and employs the same or a similar chassis to duct sealing arrangement as was previously employed with the negative pressure air duct. Within the duct sits a mating device that in this case happens to contain four male interconnects as well as a pair of guide holes that interface the guide pins 225 (one of which is labeled) seen here. This method of using pins that get larger as they expand into a guide hole for automatically connecting together couplings that carry liquids is similar to the ones employed in computers to align sockets that need to accurately mate. The purpose of this optional duct or shield 228 though is quite different. Enclosing the main liquid feed lines in a sealed duct and then avoiding the use of internal connections within the rack mount chassis itself, greatly reduces the possibility of liquid leaks within a chassis that may also be receiving electric power at 110 AC, 240 AC or 300 VDC power. The crushable seal 227 that makes contact with the duct can also be seen here.

Beneath the LHP counter flow heat exchangers can be seen the fins 209 of a liquid cooled air heat exchanger. The liquid that feeds the air heat exchanger in this exemplary embodiment just happens to come from a distribution block 226 that surrounds and contains the heat exchangers and includes a liquid cooled base plate that is thermally attached to the fins. The liquid that cools the air heat exchanger does not have to be shared with the heat exchangers and the precise order in which the liquids that cool the LHPs and the air get applied, is up to the engineer designing the system and the inclusion of other methods, which such as a method for bleeding air at a particular relative humidity into the rack mount chassis. Another pair of lines could have also been employed to supply the liquid assisted air heat exchanger or two of the four lines in FIG. 30 could have been split within the chassis and used to cool the primary load LHP heat exchangers while the other two were employed to cool the air heat exchanger.

This method uses a similar technique described in the exemplary embodiment in FIG. 25 to handle the secondary heat load, which is to circulate air within the chassis proper. The large arrows in FIG. 31 display the path taken by the closed loop air-cooling circuit employed. The actual path employed is not fixed. Any path that returns cooling air that has been heated by the secondary load, back to the liquid assisted air heat exchanger inlets, will suffice.

What is different about the method is its use of direct liquid cooling of the primary LHPs or LHPLs along with the fact that it can combine direct liquid cooled air heat exchangers, cold plates and air circulating that rejects heat picked up from secondary heat loads and passes it to the motherboard itself in situations where the motherboard is cooled by a cold plate, which ends up converting the large area of the mother board into a heat exchanger without fins. In the exemplary embodiment displayed in FIG. 30, the secondary heat load is being picked up by the internal closed loop sealed air flow that remains within the chassis passing beneath the LHP heat exchangers before being accelerated by a pair of fans 216 (one of which is called out) that could just as easily been one or more blowers before passing over a line of hard disks that could just as easily been located at the front of the chassis or omitted altogether. A baffle 217 on the left hand side of the chassis interior helps to set up the circular flow pattern that directs the flow into the power supply 218 where it gets accelerated again by a pair of 1 U fans before reaching the liquid assisted air heat exchanger that sits beneath the LHP primary load heat condensers and then being sucked up again by a pair of circulating fans that drive the internal cooling loop.

The intent here is to seal the chassis, using a positive pressure technique that slowly bleeds dry air into the chassis when the temperature of condensing surfaces within the chassis are below the relative humidity of the air in the room. In poorly managed data centers, up to 10% of all energy gets devoted to condensing and then humidifying the airflow. This is done to make the data center more convenient for humans and to reduce ESD. It turns out that in well designed and grounded circuits, such as those employed within rack mounted chassis, the ESD requirement has now been eliminated. However, care still has to be taken not to condense water vapor out within the chassis.

The two things that make this method so extraordinarily energy efficient are the very low thermal resistance of the LHP primary heat load cooling mechanism combined with an efficient as possible approach to recovering the secondary heat load. The latter has been greatly improved over other methods that combine direct chilled liquid cooling of the primary load (which is two orders of magnitude less efficient than the passive techniques employed here) with circulating air, by minimizing the energy required to circulate the air and also by employing optional PCB cold plates where possible to minimize the amount of energy employed to circulate air. Consider for a moment, the fact that the distance that the air inside of this enclosure needs to travel to release its heat is hundreds of times shorter than the distance air leaving an enclosure needs to travel before it arrives at a chilled water heat exchanger where it dumps the rejected heat it is carrying to chilled water.

Figure 32:
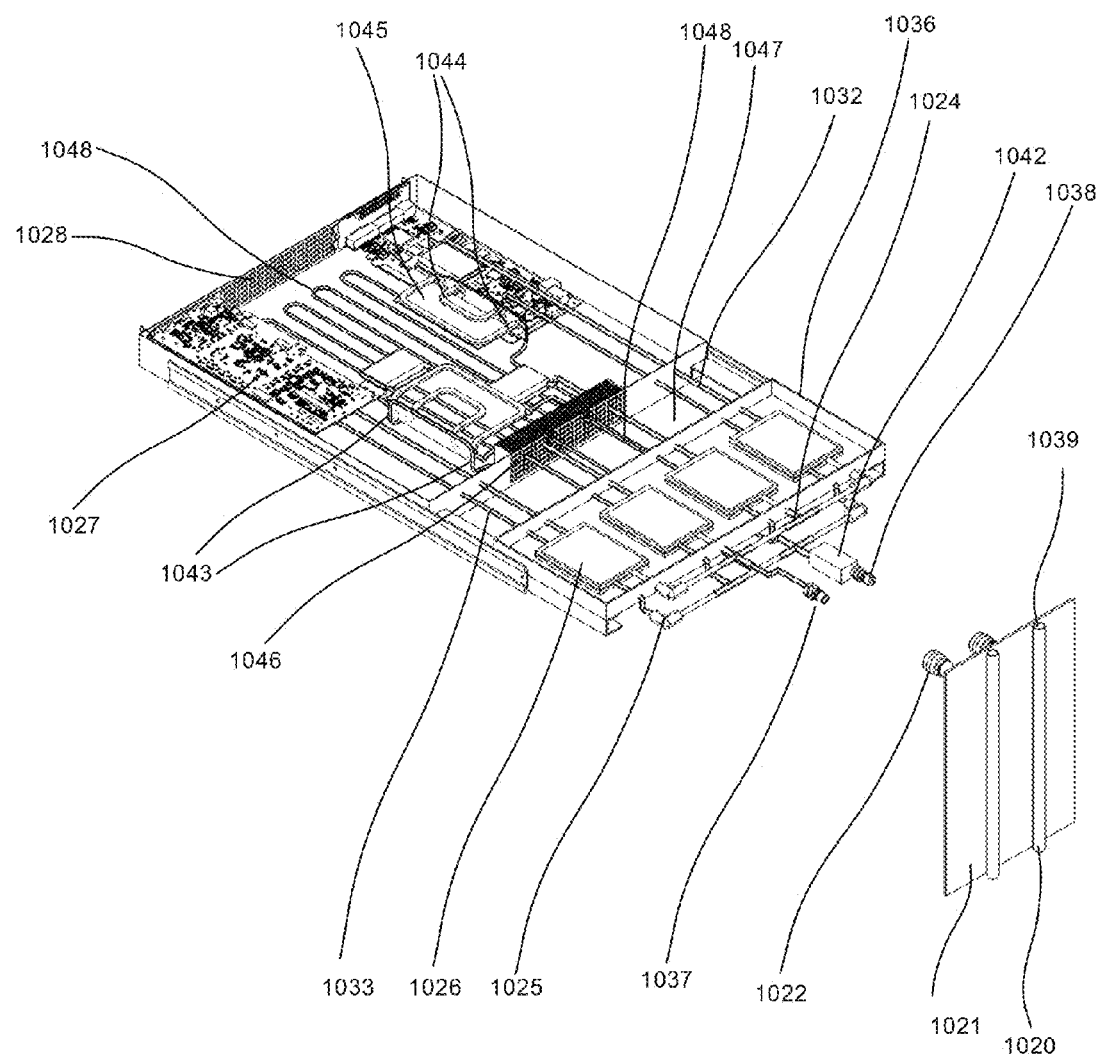
FIG. 32 is a 1 U chassis that contains two CPUs and two GPUs cooled by four liquid cooled LHPLs that receives external coolant using a pair of quick disconnects in a splatter guard.

FIG. 32 is an exemplary 3D view of a 1 U liquid cooled chassis that houses four processors, two CPUs and two GPUs. A liquid external coolant distribution manifold employs an external coolant inlet line 1039 that distributes an external liquid coolant that is released to the outside world through the pipe 1020. A pair of male quick disconnect components 1037 and 1038 are employed to make connections with the liquid inlet and outlet manifolds using female quick disconnects 1022. A liquid splash guard 1040 and the back plate used to mount the female quick disconnects 1021, surrounds the female quick disconnects and is employed to solve the rare but possible problem of a female quick disconnect failing. A hole 1049 has been inserted into the splash guard which pushes open a door (not seen) that closes when the chassis is removed, completely isolating the female quick disconnects still under pressure from the remainder of the system. The male quick disconnects, 1037 and 1038, are enclosed in a five sided box 1023 that has a thin sponge like material inserted on the box's bottom. Typical quick disconnects can release approximately 0.3 cc of liquid when engaged or released. This small amount of liquid is guaranteed to be picked up by the sponge. Once the box has exited the splatter box, both sources of leakage will be eliminated. The piping used to distribute the external coolant to the condensers can be seen, 1024 distributes the cold coolant to the condensers while 1025 distributes the returning hot coolant to a quick disconnect for disposal.

To further isolate any liquid cooling hazard from the enclosures electronic components, the LHPL liquid cooled condensers 1026 are housed in a separate water tight section 1036 of the chassis. In this exemplary embodiment we have inserted an optional vertical air channel 1047 between the 1036 and the main portion of the chassis 1035 which houses the server electronics. This channel makes it possible to create chassis in which air is used to remove the secondary heat loads employing a negative pressure rotary device that sits on the top of the rack cabinet, and exhausts heated air to another device. To help reduce energy consumption further, this embodiment includes a cold plate 1043 that circulates cold water throughout the server section. To eliminate external heat exchangers which cool heated air, we have inserted an optional liquid cooled heat exchanger 1046 that can be used to help restore air leaving the 1 U chassis to its inlet temperature that is in thermal contact with the cold plate 1048. In an airtight version of this 1 U chassis, this heat exchanger would be coupled with one or more low speed cooling fans to remove heat from ambient air within the chassis. This chassis has a pair of PCIe GPU cards 1027 which each is cooled by an LHPL whose evaporator 1031 can be seen on the left hand side device. The orientations of the GPUs are different, hiding the evaporator for the right hand GPU in FIG. 32. In the front, an optional air cooling entrance 1028 can be seen as well as the CPU motherboard 1029 and one of its evaporators 1034. The motherboard DIMM modules 1030 can be seen along with an optional water cooling device that employs a heat spreader 1045, which is in thermal contact with the DMM modules (which now can be purchased with metallic heat spreaders which bridge both sides and cross over the top, providing a thermal contact surface to remove heat from, using heat spreader 1045 and a thermal contact pad), a pair of ordinary heat pipes 1044 in thermal contact with the heat spreader that have a 90 degree bend in them going vertical that makes it possible to conduct heat from the heat spreader 1045 to a vertical rising section of the cold plate 1043, all of which are most easily made out in FIG. 33. The first of four liquid return lines 1032 as well as the first of four vapor lines 1033 can be made out as well.

Figure 33:
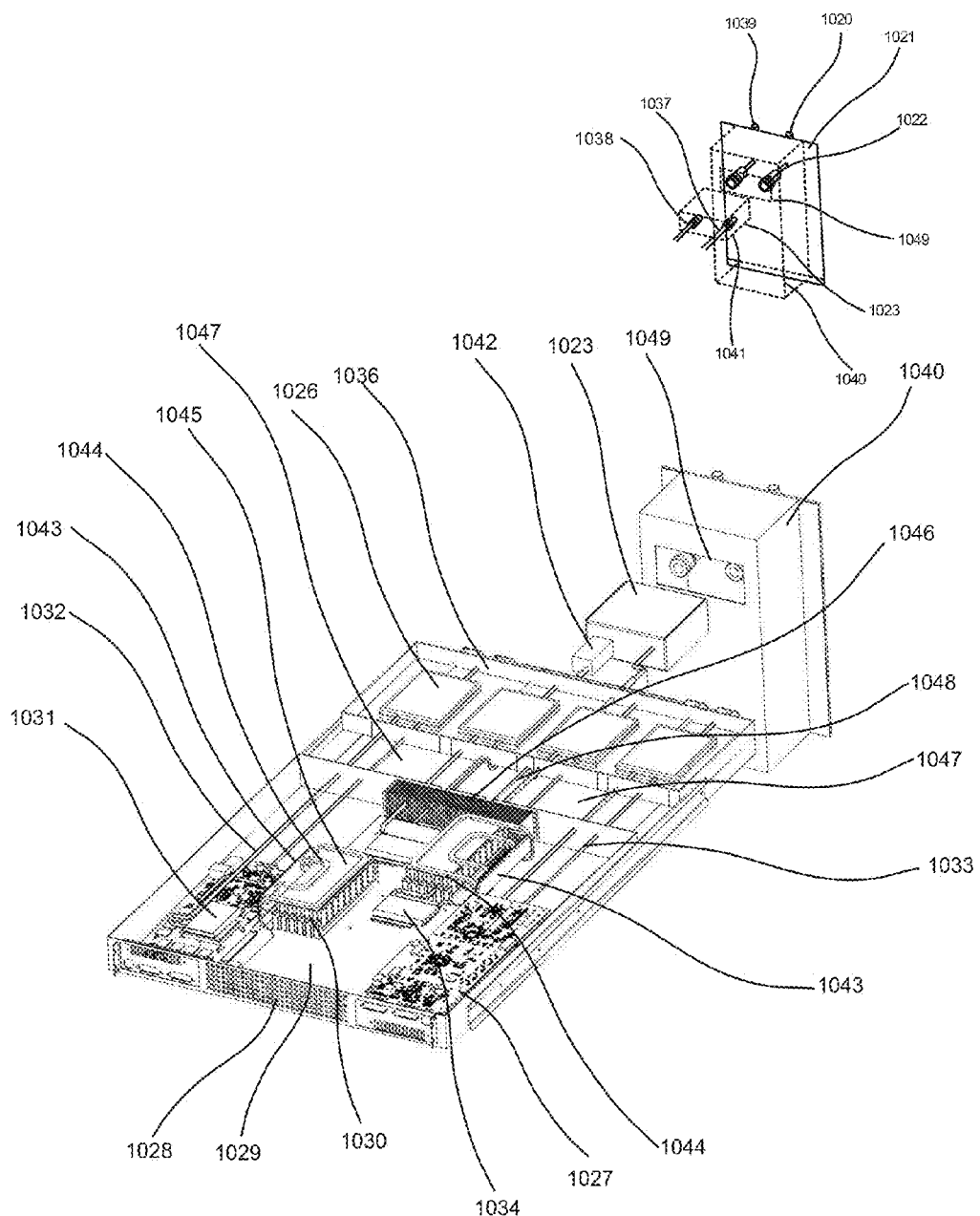
FIG. 33 is another view of the chassis in FIG. 32 showing details of the cold plate used to cool the motherboard and DIMM modules.

The liquid cooled cold plate 1043 seen in FIG. 33 is sheathed top and bottom with a thin metallic layer designed to act as both a heat spreader and to protect the cold plate's piping. The cold plate vertical riser 1043 is also sheathed in copper as is the portion of the DIMM module heat pipes 1044 which comes into contact with it: both are brought into thermal contact using a mechanism which clamps the heat pipes to the cold plate vertical riser. This same embodiment could also be used for cooling an air heat exchanger mounted in the rear of the chassis as well as an interface to cool evaporator CCs. Item 1042 is an exemplary embodiment of a device used to control the rate of liquid cooling flow rate through the LHPL condensers and cold plate. In this instance it turns out to be a servo controlled valve on the water inlet side that simultaneously controls both the LHPL condensers and cold plate.

Figure 34:
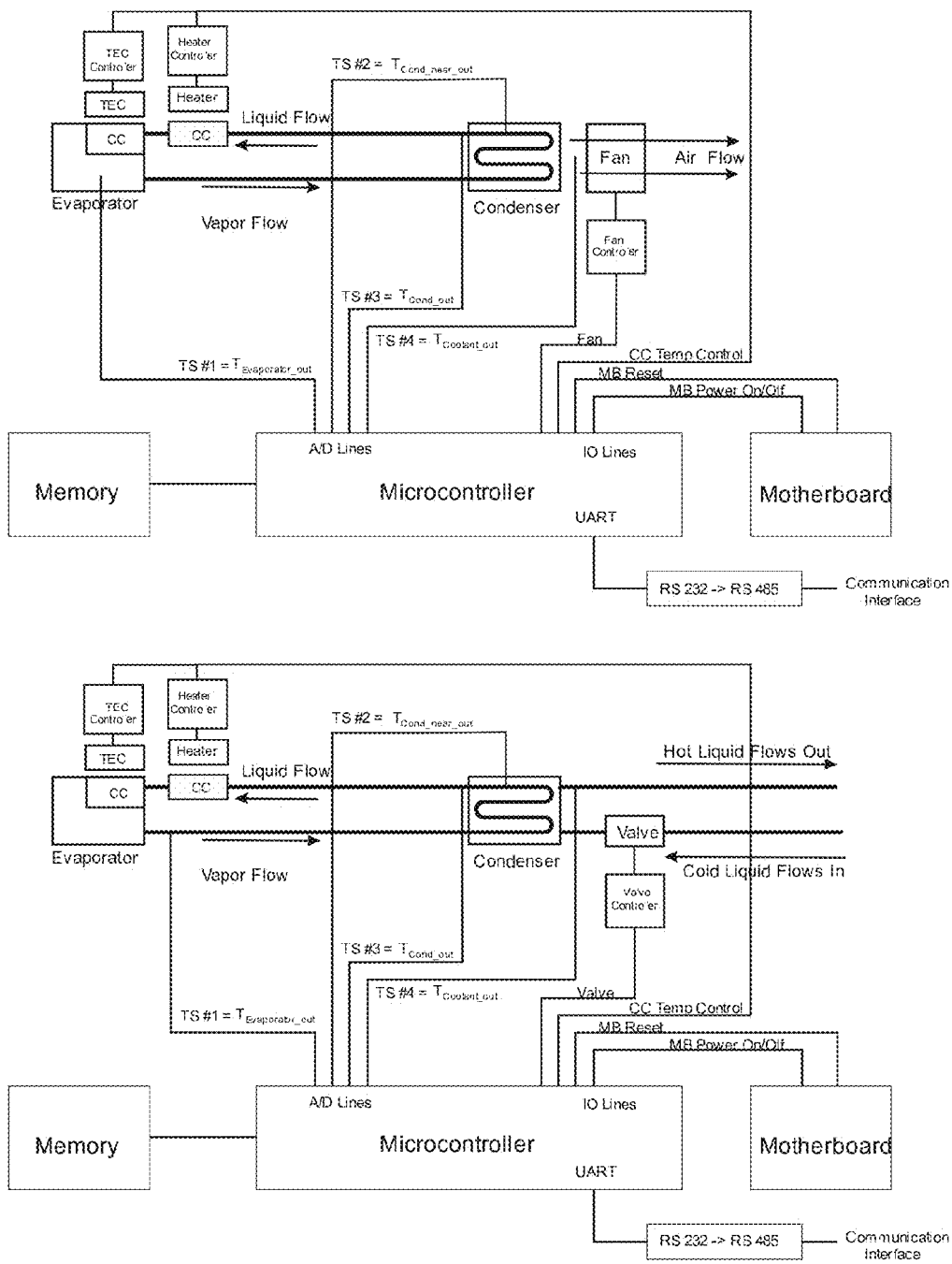
FIG. 34 is a schematic overview of an LHPL microcontroller.

FIG. 34 is an exemplary embodiment of a pair of control circuits that employ microcontrollers to monitor and control LHPL devices that are simultaneously in communication with software that monitors and controls a server. These were first disclosed in U.S. Provisional Application 61/327,659. The circuits employed are similar to IMPI, a standard for remotely monitoring and controlling servers, which often comes built into servers. Unlike most cooling circuits, where the goal is to keep up with a heat load, by controlling the speed of cooling devices such as fans as the heat load increases, our goal here is to maximize the overall energy efficiency of an LHPL cooling solution by actually reducing the cooling in such a manner that the exhaust temperature leaving an LHPL cooled enclosure is maximized, while at the same time keeping the device being cooled operating below its maximum temperature. This is accomplished by continuously reducing the cooling until the device being cooled approaches the desired upper operating temperature. The net effect of this optimization is to increase coolant exhaust temperatures while reducing the power required to cool, and at the same time improving the efficiency of any downstream devices used to cool the external coolant(s). The net effect is a reduction of the overall thermal resistance of the LHPL cooling device.

Two cases are considered here, one in which the condenser is air cooled (on the top of FIG. 34) and the other in which the condenser is liquid cooled. In the case of the liquid cooled LHPL, the goal is to hit or exceed the temperature being requested by the device which exchanges the rejected heat flow carried by the by the external coolant which will be exchanged with a heat sink that ultimately deposits the heat load to the local environment. Since the most common local heat sink is outside air, our goal in this exercise is to produce external coolant hot enough to efficiently employ cooling towers (cooling towers can run with smaller delta T's than their design point, but such operation increases the power rejected by their fans) on hot days. Cooling towers that heat outside air are more likely to be used in this service than heat exchangers being cooled by a body of water.

To operate on very hot days, cooling towers vendors specify for a particular outside air temperature what temperature the external coolant they are cooling needs to hit. For example, on the hottest day of the year in Atlanta Ga. a cooling tower vendor specified that it could chill the liquid leaving the tower to 30 C if the external coolant it was tasked to cool arrived at its inlet at 35 C. This 5C "delta T" is typical of heat transfer devices that do not consume excessive amounts of energy to operate their cooling fans. The power required to move an external coolant to and from a cooling tower and run its cooling fan is a small percentage of the power required to run a water chiller. In the case of an air cooled LHPL, the object becomes simply to maximize the temperature of the coolant leaving the LHPL while at the same time providing enough cooling to guarantee that the device being cooled does not exceed its maximum temperature.

In both cases, the external coolant exit flow temperature is raised by reducing the flow rate of the external coolant. The temperature of the device being cooled is typically monitored by a diode inside of it, in the case of a CPU or GPU being cooled by an LHPL, this temperature can be obtained from programs that run on these devices. However not all semiconductors have such devices embedded within them. The two exemplary circuits provide two different methods for obtaining die temperatures. In both circuits a temperature sensor whose net labeled TS #1 produces a variable used by the microcontroller called $T_{evaporator\_out}$. The temperature sensor is an exemplary device that can be implemented using different devices including thermocouples and thermistors is mounted either in or on the side of the thin heat spreader that conducts heat between the device being cooled and the LHPL evaporator. In the upper circuit used to cool an air cooled LHPL, a temperature sensor whose net is also called out as TS #1=$T_{evaporator\_out}$ is attached to the vapor line several centimeters from the point where the vapor line leaves the evaporator. The temperature measured by TS #3=$T_{Cond-out}$ at the start of the liquid return line will typically be half way between the temperature of the device being cooled and the outlet temperature of the external coolant leaving the condenser. For every LHPL, this difference in temperature can be used to produce a look up table which will provide a measure of the total power being rejected by the LHPL which along with the temperature of the evaporator can be used to compute the die temperature by essentially adding to the evaporator temperature the temperature lost in the heat spreader which can be computed by multiplying the measured thermal resistance between the heat spreader and the die by the current heat flow being rejected.

Both circuits employ an exemplary microcontroller that in its operation is very similar to the standard IPMI devices that are now used to monitor and control motherboards. The method that the microcontroller uses to communicate with the outside world is also exemplary, in this case taking the output of a UART and employing an RS-232 to RS-485 converter to drive an RS-485 signal pair (shown as a single line, as are all the other circuit pairs in these schematic overviews). Often, the embedded CPU employs a GigE interface (instead of RS-485) and usually carries out a number of tasks, not shown, such as monitoring voltages, reading and controlling other cooling fans as well as monitoring reset and on/off switches and generating these signals remotely. In this case the 8051 embedded CPU contains the interfaces needed to both read A/D lines (i.e. temperature sensors and voltages) as well as the I/O control lines needed to read and control pumps, fans, tach lines, limit switches and other devices.

In addition to maximizing external coolant temperature this exemplary control circuit can provide other beneficial services. After a rapid shutdown, it is possible to put some LHPLs into a dry state in which there is no working fluid in the evaporator, resulting in what is called dry out. By actively controlling the temperatures about the cooling loop during shut down and start up, it becomes possible to fine tune the operational parameters of these devices to eliminate them in solutions that require them. Both circuits show a heater element positioned in the vicinity of a compensation chamber (CC) located in the liquid return line (i.e. for controlling a CPL). The position chosen is exemplary and could have been anywhere about the loop where liquid phase working fluid accumulates when the LHP is cold, including the condenser. A thermoelectric (TEC) cooler is also shown positioned above the CC located within an evaporator (the case where the device is classified as an LHP) which can be used to draw working fluid to the evaporator during shut down. The TEC cooler can also be used to improve cooling at low power levels by preventing working fluid in the LHP CC from heating up due to shell conduction. In addition two or more temperature sensors could be positioned in the condenser to monitor the location of the point where the boundary between working fluid liquid and vapor sits: monitoring this location helps to maximize condenser performance, something that can be aided by changing the external coolant flow rate. In this case temperature sensor TS #2=$T_{Cond\_out}$ is situated at the point where the condenser tube leaves the condenser while TS #3=$T_{Cond\_near\_out}$ is situated at a position on the condenser tube a small distance upstream of TS #2=$T_{Cond\_out}$. At low power settings increased condenser performance can be achieved by reducing the flow rate of the external coolant which will let the working fluid meniscus retreat towards the condenser's exit. As the meniscus within the condensation channel approaches the exit point it pays to increase heat transfer between the working fluid and the external coolant by increasing the amount of cooling which also keeps the meniscus at the exit point of the channel. This type of control is enabled by TS #2 and TS #3. Ideally, one would like the entire condensation channel to participate, as this maximizes the amount of condensation going on within the condenser, and produces the highest external coolant outlet temperature. The circuit also provides control lines for monitoring and controlling the speed of the cooling device, which in the case of a liquid coolant is most likely to be some form of valve that restricts coolant flow while in the case of an air cooled condenser it will be a fan speed control. The two lines which typically are included in IPMI microcontrollers that control motherboard reset and power supply on/off are also shown. GPUs are a good example of devices that typically run at a single cooling speed and do not employ IPMI control devices.

Figure 35:
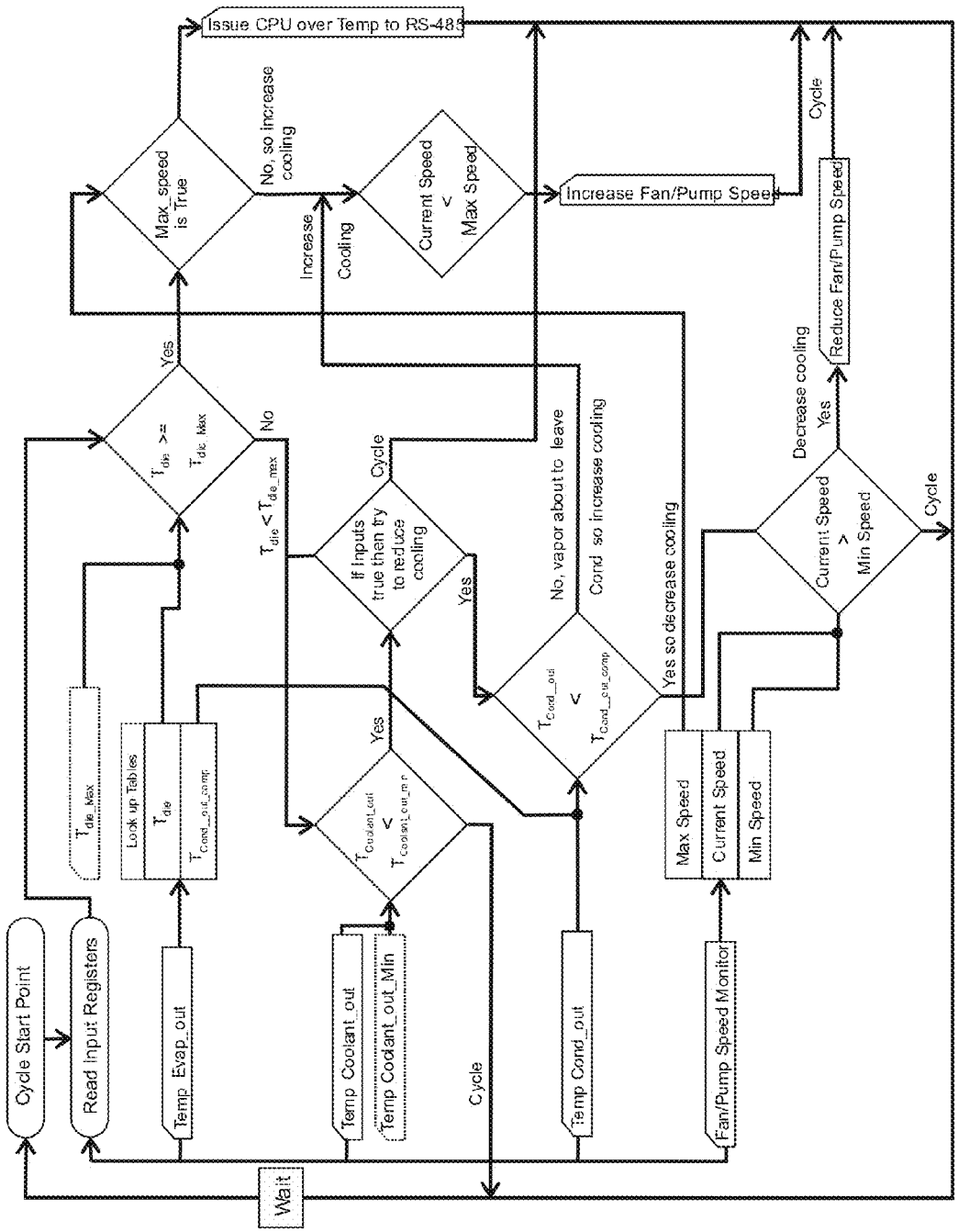
FIG. 35 is a flow chart for a program designed for use with the controller of FIG. 34.

For these monitoring and control objectives to be met software needs to be written that simultaneously monitors working fluid and external coolant temperatures that gets employed as inputs to control cooling fans and pumps as well as initiating CC cooling or heating during shut down and low power operation. FIG. 35 is a flow diagram for a program design to control the circuits described in FIG. 34. The flow diagram takes the form of what software developers call a Do Forever loop: the starting point initiated by the microcontroller after reset goes true and a program which executes the flow diagram has been loaded and jump to starts off at the head of the flow chart which we label Cycle Start Point. Throughout the flow chart, decisions get made which force the program to either continue making decisions and take action or decided to do nothing and return to the starting point. A line about the chart which we label cycle directs non-actions back to the start.

The first action at the head of the loop is to read the input registers, which like the write registers are contained in an I/O block. The I/O blocks that are dotted contain constants that never change value, i.e. global constants used in calculations. The actual values stored for variables like $T_{evaporator\_out}$ do not have to be the last value read in. LHPL devices can experience instabilities that cause their temperatures to oscillate several degrees. The period of these oscillations is typically varied from 30 to 120 or more seconds. Just below the start point on the cycle path we have placed a WAIT statement whose value can be set and whose job is to wait some time before reading the next set of register values. The actual value of things like temperatures that are passed into the program implementing the flow chart does not need to be the current value. A more reasonable value is a running average taken over N cycles that is designed to average out fluctuations. This will avoid the control circuits to spend too much time chasing phantom changes in LHPL operation. Regarding the flow chart itself, in situations where decisions need to be made using several input parameters, we bind them together into a common inlet channel using a sold dot to indicate that all of the I/O parameters or constants enter the decision box through a single location. There is one decision box that might be a little confusing. Within this decision statement is the text, "if inputs true then try to reduce cooling." The input to the top of this box is the "NO" from the last box, which we interpret to mean that $T_{die} < T_{die\_max}$. If this is true, and the result of the box to its left which is where the flow actually went is also true (which compares the external coolant temperature with the desired temperature) we are in a position to attempt to reduce cooling, otherwise we go to cycle and repeat the entire loop.

The first job that the flow chart approaches is the most troublesome case, which would be an LHPL cooling device that was not adequately cooling a CPU or GPU. While we can in some instances simply read the temperature of the device, in situations where we can't, such as a GPU, we need to compute that temperature. There are several exemplary methods that we could take, for example measuring the energy flowing into the external coolant by measuring the flow rate, inlet temperature and outlet temperature. We have instead chosen building a table whose input parameter is the vapor temperature leaving the LHPL evaporator. For any particular LHPL, the power being rejected can be determined from the evaporator temperature (except in the case of an LHPL that is in a peculiar orientation which we discuss below). A pair of look up tables get used to compute $T_{Die}$ as well as a the expected temperature of working fluid entering the liquid return line $T_{Cond\_out}$ and the computed die temperature $T_{Die}$. This last value is the expected temperature of the silicon die we are cooling. It is employed in the first decision box to determine if the die temperature is greater or equal to the maximum die temperature allowed, which normally would be a temperature slightly below the maximum temperature at a point where the lifetime of the semiconductor die is not impacted. If this condition is met, we have a problem and now have to check if we can increase cooling by checking if either the pump (i.e. valve controlling a flow) or the fan being used to cool the LHPL condenser can have its speed increased. If it has reached Max speed we have a problem that can only be resolved by asking the device which controls the speed of the device being cooled, to reduce its speed, by presumably reducing its clock frequency. Max_speed is derived from the input variable Current Speed. It is either computed, or possibly is set by limit switches in the case of a valve being controlled by a servo circuit. In the case where we have hit both limits, we have no choice but to send a message to the machine controlling the server being cooled, to reduce frequency. In most motherboards used today, this actually happens automatically, using built in circuitry that uses a similar scheme. If we have not reached Max Speed, we send a message or a signal to the device controlling our cooling device to increase the flow rate.

If the die temperature was below $T_{Die}$, we are in a position to increase the temperature of the external coolant by reducing the cooling rate. However, before we do that, we need to check to make sure that what is coming out of the condenser is a liquid and not vapor. To do that we again go to a look up table that contains the value of $T_{Cond\_out\_comp}$. As long as the Condenser outlet temperature $T_{Cond\_out}$ is less than $T_{Cond\_out\_comp}$, we still have liquid leaving the working fluid exit of the condenser, and it is safe to increase cooling further. The entire flow chart is exemplary, in any real device the sensors used to collect information about the operating conditions of the LHPL are likely to be different than those we have chosen. In addition, in situations where the performance curve of the device being cooled is a multi-valued function (has more than two or more temperatures corresponding to different operating point temperatures) a more detailed analysis of the total heat load rejected to the external coolant will be needed in conjunction with a measurement of working fluid vapor temperature.

Figure 36:
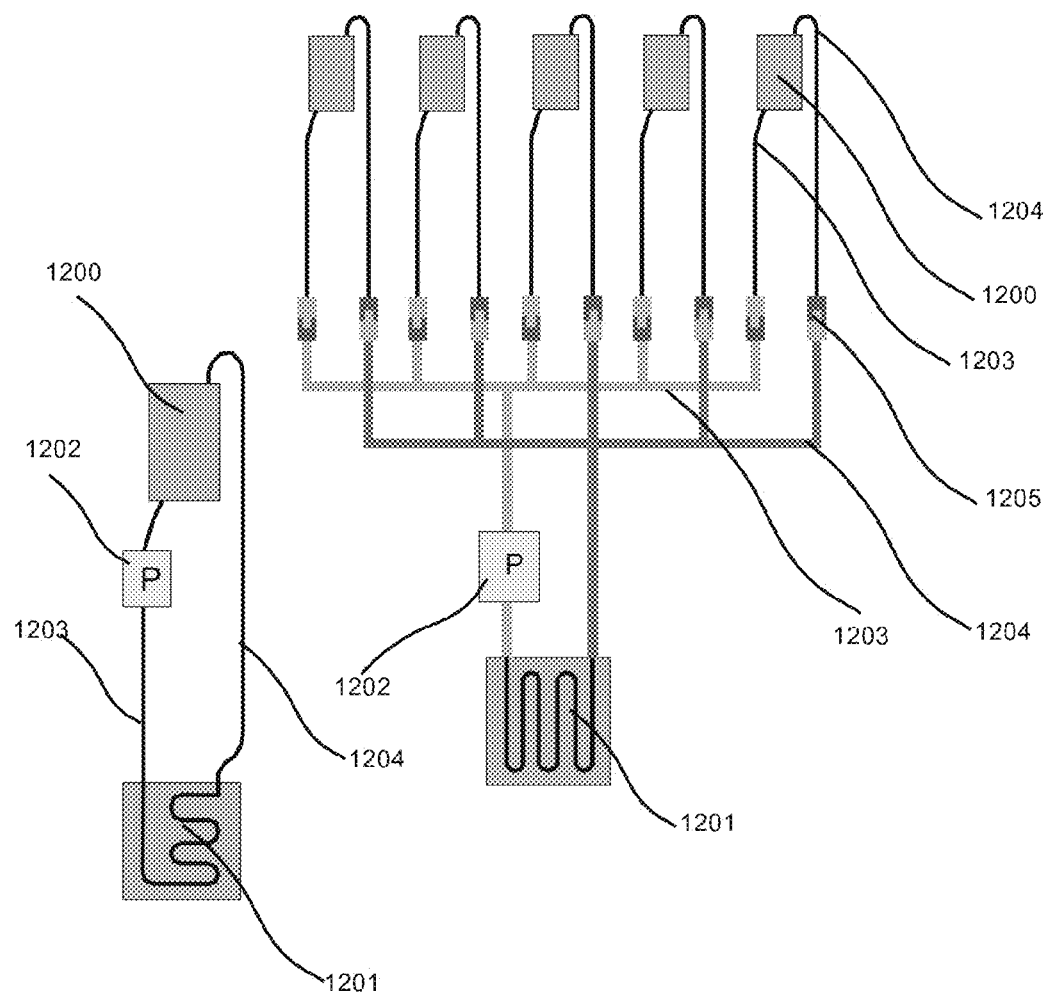
FIG. 36 is an LHPL cooled system that employs a vacuum pump in the vapor line that reduces the pressure in an LHPL helping to reduce the operating temperature of the LHPL.

FIG. 36 is an Advanced Loop Heat Pipe (ALHP) that employs a pump in the vapor line to reduce the vapor pressure and therefore the evaporation temperature in the evaporator. As the heat densities rise to 1,000 Watts/cm$^2$ and greater in low pressure evaporators the evaporation temperature of the working fluid rises to over 100 C. Cooling devices that reject these high power densities becomes a problem unless the pressure in the vapor line is reduced. This is accomplished using a vacuum pump, 1202. The ALHPs shown in FIG. 36 employ a pump to reduce vapor pressure on either a single evaporator or multiple evaporators. Each of the ALHPs employs an evaporator 1200, a condenser 1201, a vapor line 1203 that feeds the pump inlet, a liquid return line 1204. In the exemplary embodiment shown where a single pump is reducing the vapor pressure on five evaporators and feeding the resultant higher pressure (and temperature) working fluid to a condenser, quick disconnects can optionally be inserted in the vapor lines and liquid return lines, which end up feeding in parallel through a manifold that transports the higher pressure vapor to the condenser and returns the resulting liquefied working fluid to the evaporators. The approach we employed is not limited to a single system chassis, but could be employed at the rack level or possibly even at the data center level to cool many heat rejecting devices at the same time using a common vacuum pump and condenser.

Figure 37:
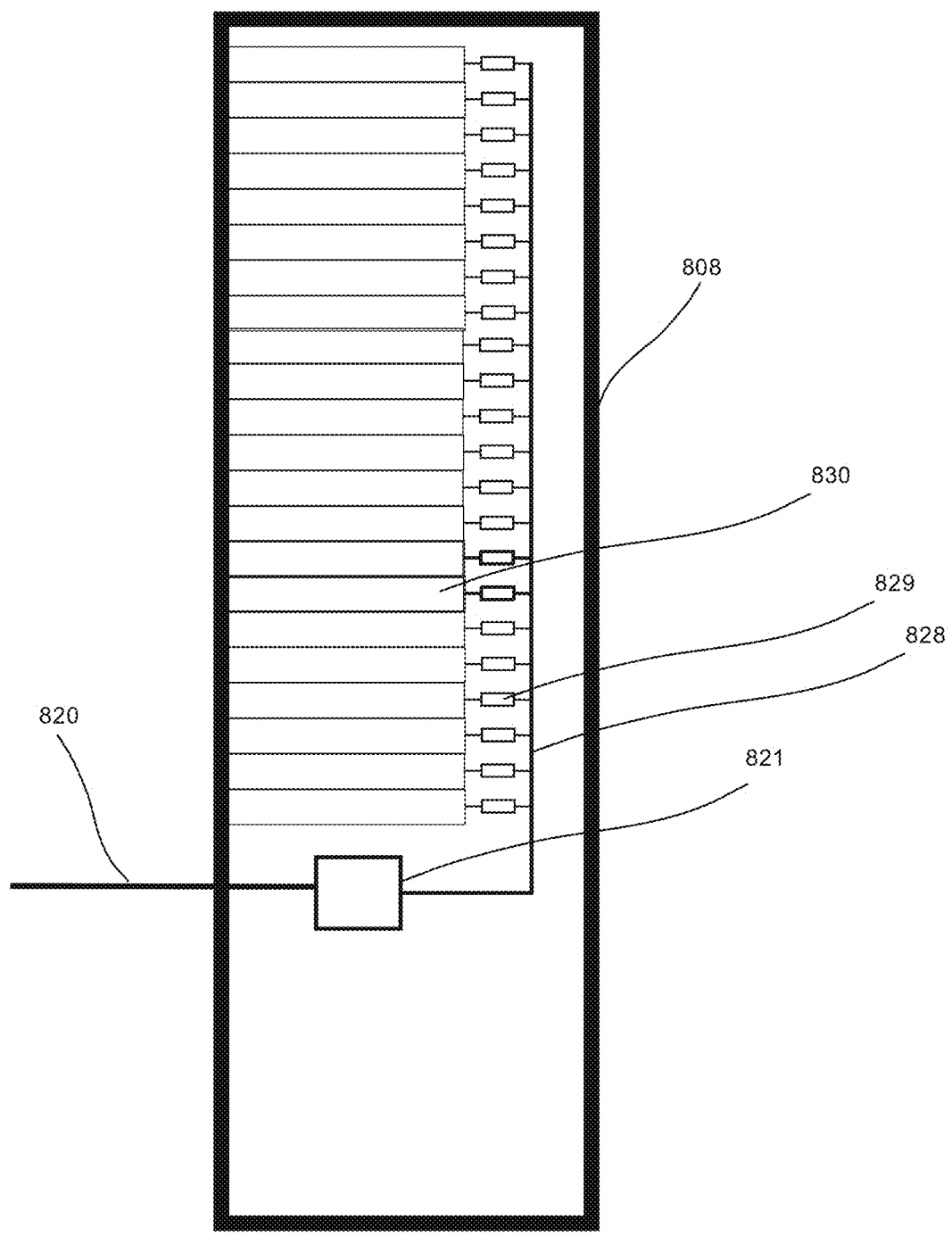
FIG. 37 is a sketch of a rack cabinet that encloses a group of rack mounted enclosures that each receive air that has been dehumidified and which is passed into said enclosures at a pressure large enough to generate small leaks out of the enclosure making it possible to inexpensively avoid condensation issues.

FIG. 37 is an exemplary embodiment of Rack Cabinet 800 that includes a de-humidifier to maintain control of the air within the enclosures 830 held by the cabinet. Quick disconnects 829 are used to connect each enclosure to a source of pressurized air, whose pressure is just large enough to generate a slow leak out of enclosures which are "almost pressure tight." The goal is produce a slow stream of air leaving all of the enclosures held by the rack cabinet as mentioned in several of our designs. The pressurized air is introduced to the cabinet by the line 820 and immediately passes through a dehumidifier 821 that condenses out water vapor, reducing the humidity of the air flowing through the enclosures. For this to be cost effect, the enclosures need to be sealed well enough to keep the cleansing dry air flow from becoming too fast.

Figure 38:
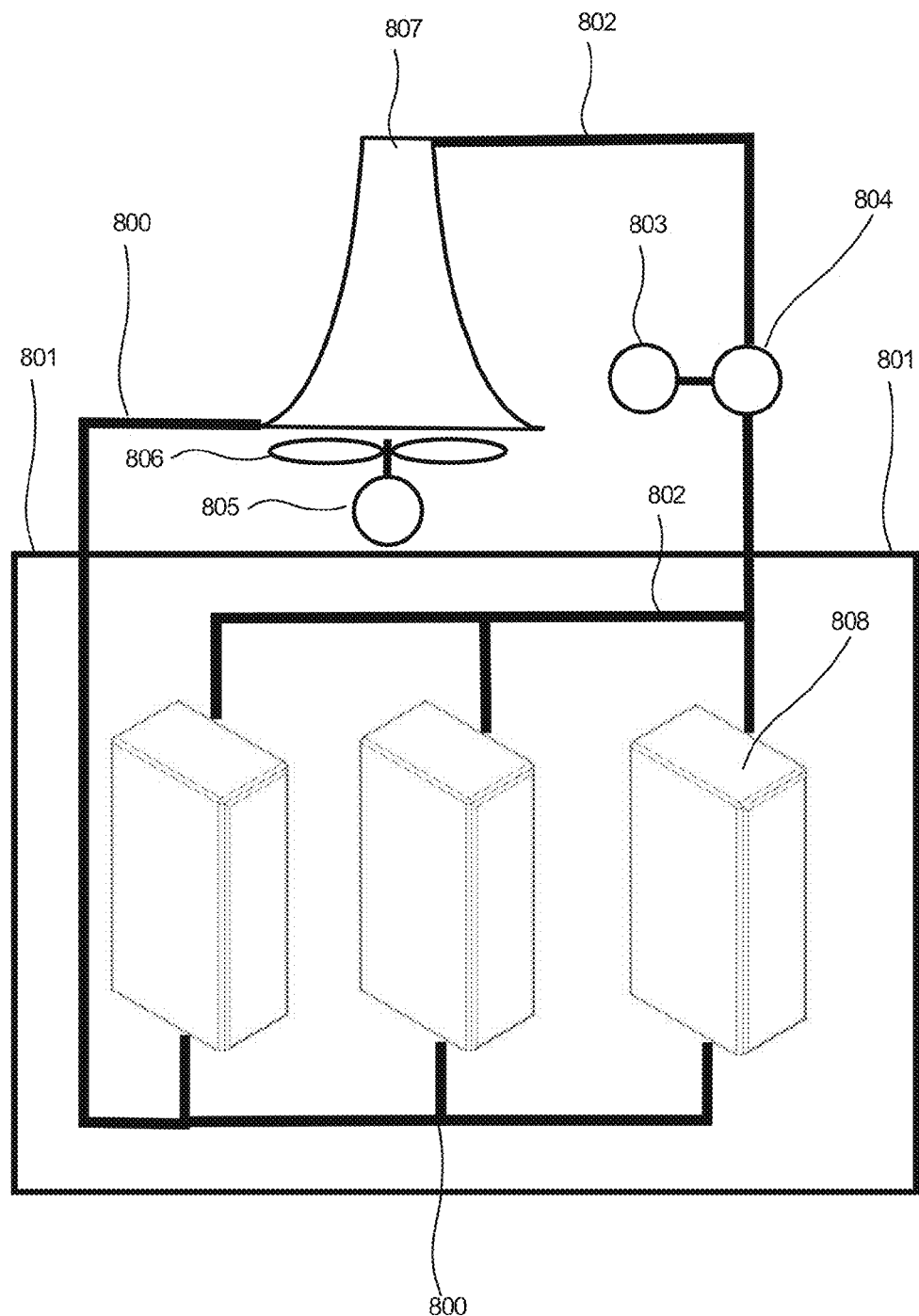
FIG. 38 is a schematic drawing of a data center that employs three rack cabinets, a cooling tower and circulation used to move coolant directly between the chassis in the rack cabinets and the cooling tower.

FIG. 38 demonstrates how a cooling tower 807 can be hooked up directly to a data center, whose data center room 801 contains a plurality of rack cabinets 808 is sending chilled water to the cooling tower through a pipe network 802 that includes a pump 804 that is driven by an electric motor 803. The precise manner in which the chilled water and the connections to the cooling tower are to be created, are to be designed by experts in the field. This drawing is just an exemplary embodiment of a way that the author believes such a system could be set up. The cooling tower may or may not need a cooling fan 806 driven by a motor 805, depending on its architecture and size, but one has been provided in this schematic presentation. The chilled water that results leaves through a network of pipes 800 and returns to the data center room and its rack cabinets 808.

One of the basic components of this series of patent applications is the cooling of secondary components. In many instances, the amount of heat rejected by DIMM modules can approach the power rejected by the processors that they feed with data, making it even possible to consider cooling them with LHPLs. For the most part, however, the amount of heat that they reject is about 40% of the heat being rejected by CPUs, so going to these extremes is not necessary. However, the amount of heat that they reject can be large enough to make the cooling of some motherboards housed in 1 U enclosures almost impossible, so demonstrating how DIMM modules can be cooled turns out to be a crucial issue in the use of LHPL cooling. Several of our exemplary embodiments used devices including ordinary heat pipes and cold plates to cool DIMM modules.

Figure 39:
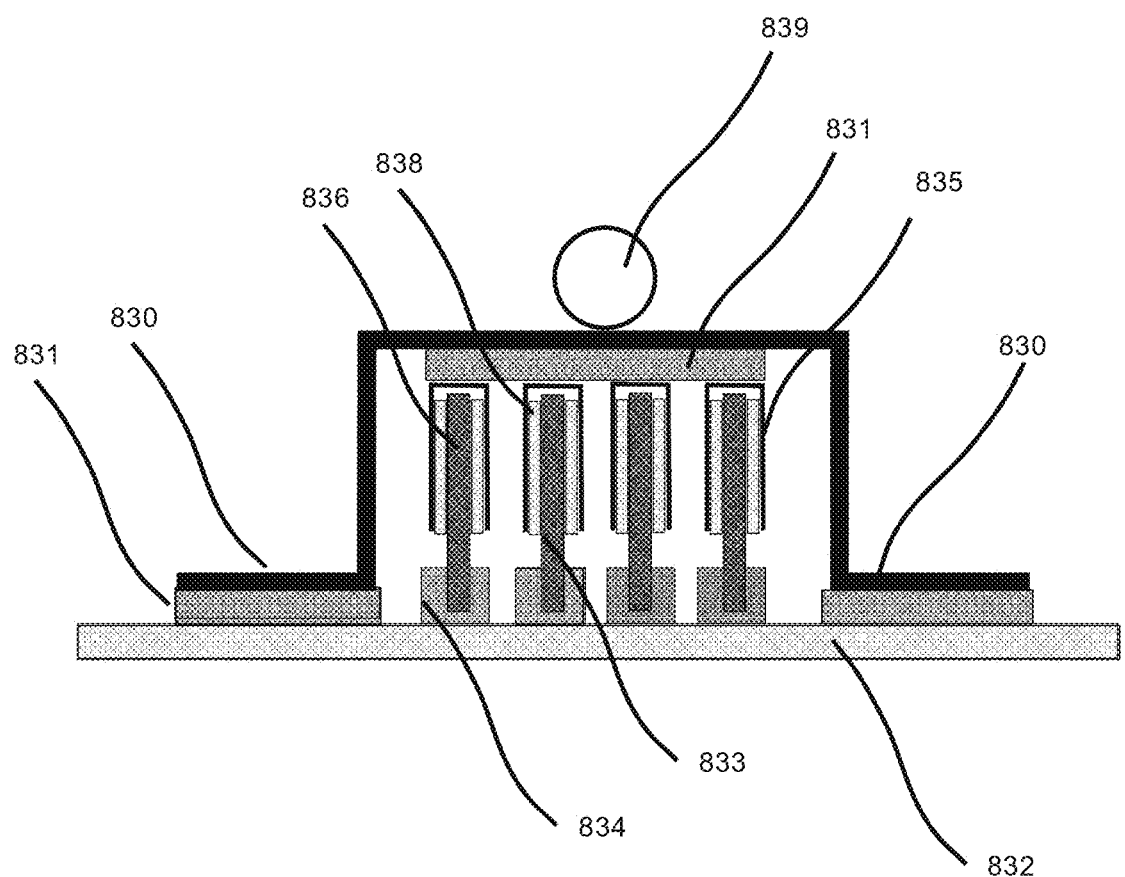
FIG. 39 is a cross sectional view of a device intended to remove heat from a group of DIMM modules.

FIG. 39 provides an exemplary embodiment which makes this possible. DIMM modules can be purchased that have metallic caps 835 covering the memory components 838 that are sitting on the modules PCB 836 that are designed to help components reject heat. Placing a heat spreader 830 on the top of a group of such modules makes it possible to extract the heat to a metallic object, the heat spreader, which in turn can reject it to something else. The first concept is to reject the heat to the PCB that sits beneath the module sockets 834 depositing the heat to the motherboard PCB 832 that holds the sockets. In situations where the motherboard was being cooled by a cold plate, this solution might be able to reject the heat provided that the contact area between the heat spreader 830 and the motherboard 832 and the thermal transfer material employed 831 could do a good enough job moving from the heat spreader to the motherboard.

In two of the LHPL embodiments presented a more effective approach to cooling the DIMM modules was undertaken. The circle 839 represents either a tube carrying coolant that turns the plate 830 into a liquid cooled cold plate or a standard heat pipe. In the case of a tube carrying coolant, the heat would end up being directly to the secondary coolant in the system. In the case of a standard heat pipes, the heat could be dumped either to the secondary coolant, be it air using a forced convection heat exchanger of a liquid cooled cold plate. Another alternative that we explore is simply terminating the standard heat pipe on the heat receiving end of an LHPL evaporator which is also being used to cool something else, like a CPU.

Several hundred million heat pipes are manufactured every year, most of which end up in computers. The majority of these devices employ a single tube through which heat vapor flows to carry heat away while at the same time employing a capillary device such as a wick to return the working fluid from the cold condenser to the hot evaporator. The "heat pipe" was likely invented at Los Alamos during the second world war. It is a derivative of the thermo siphon invented by German bakers in the $19^{th}$ century, which like Loop Heat Pipes (LHPs) and Capillary Pumped Loops (CPLs) differ from ordinary heat pipes by virtue of the fact that two tubes are used instead of a single one to transport vapor from an evaporator to a condenser and then a second tube transports the condensate back. The problem with heat pipes is the returning liquid transported by a wick is limited in the length and velocity by viscous drag in the wick and also by heat transfer between the opposed flow. The first improvement was a heat pipe where the returning liquid moved through a tube with a wick therein that eliminated the interference loss but still suffered from evaporator dry out when the distances between the evaporator and condenser were large or the heat being rejected was large (U.S. Pat. No. 3,543,839). Such devices can masquerade as LHPs or CPLs, but their performance is only slightly better than an ordinary heat pipe. All five of these devices have different heat transfer performance characteristics, many of which disqualify them for use cooling electronic components housed in devices like servers. One of our goals in this section has been to differentiate the different passive heat transfer devices from each other, to provide examiners with the insight needed to understand the benefits of the LHPL devices at the heart of our claims. Much of the passive heat transfer prior art that appears in the patent literature never makes its way into peer reviewed engineering journals because of their embarrassingly poor performance curves or their another glaring drawback that is not obvious, such as their inability to work properly when tipped on a side or upside down.

A study of Thermo siphons used to cool a computer was conducted by Hewlett-Packard (HP) that demonstrates the orientation problem. This study employed a "microchannel" like evaporator design that has additional problems that the LHPL evaporators we employ do not, including instabilities caused by bubbles that cause them to boil over at high heat loads. Simply comparing the results of the HP study with ours we discovered that even with small distances separating the evaporator and condenser their performance was at a distinct disadvantage their thermal resistance of 0.41 C/W was roughly twice as large as ours cooling a similar load sitting at three times the distance. However their device turns off when tipped or turned upside down while our device may work in all orientations at peak power, which is the reason that HP has rejected the use of a thermo siphon in its commercial computer products.

CPLs and LHPs (Loop Heat Pipes) were invented roughly 12 years after the first heat pipe with a separate liquid return line, at the same time in the United States and Russia for use in space vehicles. They work in all orientations and can be distinguished from each other by the location of their Compensation Chamber (CC): in CPLs the CCs are located in the liquid return lines while LHPs have CCs located within their evaporators. We use the term LHPL (Loop Heat Pipe Like) in this document when discussing devices which have CCs in either or both their evaporators and liquid return lines in addition to devices derived from them that include a vacuum pump in the vapor line. CCs play a crucial role in the start-up characteristics of all passive heat transfer devices and in the case of LHPs enable an important feature called auto-regulation, in which the working fluid moves out of the condenser into the CC as the heat being rejected increases. This effectively results in an increase in the volume of the condensation channel as the power goes up, increasing the condensation rate in the condenser which in turn enables the rejection of increased heat loads. Without a CC in the evaporator you lose this important performance feature which is unique to an LHP. A number of the mislabeled prior art devices do not include CCs guaranteeing poor performance at high power. The disadvantage of putting a CC in the liquid return line is a more complicated start up that can require that the CC be heated to move the liquid stored in the liquid return line into the evaporator to avoid dry out. We solve this problem below for situations where a CC in the liquid return line might prove useful by embedding a computer in our cooling system which we employ for regulating the operation of the device as conditions change, which includes attaching low power refrigeration devices such as a TEC (thermoelectric cooler) to the CC.

A major benefit of our approach to LHPL design is the performance of our evaporators whose high volume vapor output may make it possible to dramatically reduce the number of fans required to cool a 1 U chassis by distributing the rejected heat using a set of condenser fins with large area. The high pressure vapor we produce makes it possible to reject heat over a large set of fins without the use of ordinary heat pipes, which are often used to improve the performance of a set of heat exchanger fins by moving heat away from the entry point in a heat spreader out to the fins. LHPs eliminate this need and at the same time guarantee that the thermal resistance between the working fluid and the fins themselves is minimized, which reduces the thermal resistance of air cooled condensers. This performance feature takes advantage of the LHP classic evaporator wick design which employs escape channels in the condensation zone to minimize pressure losses in the wick. We frequently found devices labeled CPL that was missing either a CC or escape channels or both. One such device a condenser that depended on gravity to return liquid to the evaporator (i.e. it was a thermsiphon). A peer reviewed publication for this device cooling a 1 U chassis enabled us to compute its thermal resistance which turned out to be roughly a factor of two worse than our equivalent design. The crucial LHPL parameter that needs to be reduced to improve energy efficiency is thermal resistance. The bottom line on any invention is its commercial viability. Variations on the basic LHP or CPL designs that have been proven to work but do not result in improved cooling performance or which turn off when tipped or turned upside down are by definition, not commercially viable.

Another drawback of some heat pipe based Tower CPU coolers is the fact that the rejected heat is not carried to the periphery of the tower chassis, and is free to move about raising the ambient temperature within the chassis forcing the exhaust fans mounted on the periphery to pull more air through to cool everything. By contrast, the GPU LHPLs whose performance we highlight in FIGS. 7, 10 and 20 and are used in FIG. 20 to cool CPUs, all dump their waste heat outside of the enclosure which houses the primary heat loads being cooled. Mounting the LHPL condensers on the fans used to extract air from the chassis itself also ends up reducing the cooling power by employing these fans to accomplish two tasks at the same time, bring fresh cool air into the enclosure while at the same time using the air being pulled out to cool LHPL condensers. Our approach reduces fan count, fan power while at the same time reducing the exhaust flow rate needed to cool secondary heat loads by reducing the ambient temperature within the chassis, one of whose side effects is hotter exhaust which improves the efficiency of HVAC water chillers.

Another major problem for LHPs turns out to be heat conduction through the evaporator shell into the CC (which is inside the LHP evaporator) at low power. When the heat being rejected by the evaporator moves backwards into the CC by conduction through the evaporator shell, it heats up the working fluid entering from the liquid return line. At high powers this heating effect is handled by the forward motion of the working fluid through the CC. To improve low power performance we have added to this disclosure cooling devices that extract heat from the evaporator shell in the vicinity of the CC that include finned heat exchangers and heat conducting strips. The net benefit of these cooling devices can be as much as a 10 degree reduction in the temperature of the semiconductor device being cooled. Other devices could easily be employed to cool CCs, tiny coolers with embedded blowers, ordinary heat pipes that reject heat to near by cool objects, liquid cooled cold plates and thermoelectric (TEC) coolers. TEC coolers could also be used to reposition working fluid in the CC at shut down or start up to avoid dry out. Their use for this purpose presupposes the existence of a control device which turns them on at start up or shut down.

For many years the emphasis in the LHPL prior art arena has focused on creating evaporators that can reject higher and higher heat loads. We recently demonstrated a device that can reject 1000 Watts/cm$^2$; and our prior art includes evaporator that employ evaporator wicks with vapor escape channels that reduce the pressure losses associated with the vapor leaving the wick and entering the vapor line. One consequence of this approach is evaporators that can sustain a larger pressure drop across their wicks than devices using other geometries. The wicks themselves are typically made from sintered metal particles that are chemically compatible with the working fluid. A new evaporator was disclosed herein that makes it possible to inject heat into a flat evaporator on two sides at the same time. Except for this new form of evaporator, the design features of the wicks we employ are covered by prior art (U.S. Pat. No. 6,892,799).

One of the problems encountered in LHPL designs, is gathering up the heat from both the primary and secondary devices being cooled. In GPU designs in particular, a metal heat spreader is often attached to the GPU itself as well as the nearby components that cools these secondary heat rejecting devices. The heat is typically transported to a set of long parallel fins using as many ordinary heat pipes capable of being placed above the GPU itself. The upper limit to this approach becomes the contact area above the GPU that is free to accept ordinary heat pipes. It only takes a few heat pipes to consume all of this area and the distance that the heat has to be transported often limits the effectiveness of this approach by requiring that larger heat pipes be used to reject heat to portions of the fins that are farthest from the GPU. The space limitation that limits ordinary heat pipes in this application is not a problem for LHPs, whose evaporators can reject 500 or more Watts per square cm of heat spreader area. The remaining problem includes gathering the heat from the near by secondary heat sources and conducting that heat to the LHPL's evaporator. A unique design we have come up with is a flat oblong evaporator that can absorb rejected heat on two sides at the same time, making it possible to cool the secondary components with either a heat spreader or ordinary heat pipe attached to one side while the other side cools the GPU itself. This evaporator could also be used to remove heat from a pair of semiconductor components at the same time, each of which has been located on either side of its flat sides.

The use of LHPLs to cool GPUs located on PCIe cards along with their use to cool other types of add in cards found in COTS (commodity off the shelf) computers including computer motherboards was already disclosed. We added new figures that demonstrate how this cooling can be employed in a typical air cooled desktop PC tower chassis that can also be laid on its side and employed as a desktop or workstation chassis. The embodiment here described is not limited to either PCs or to a particular type of add in card, nor to the geometry. It could also be used to cool any hot semiconductor mounted inside of an enclosure employing an air cooled condenser that is mounted to a cooling fan situated on the exterior surface or for that matter within an enclosure if cooling efficiency is not an issue, but heat transfer performance is. FIGS. 7 and 20 show an LHPL cooled PCIe card with a hot component on it that is cooled by the 120 mm fan that is normally mounted on the rear wall of a tower to exhaust heated ambient air from the tower. The same LHPL can also cool other devices within an enclosure such as CPUs as also seen in FIG. 20. The air cooled condensers in such an enclosure need to be mounted on one of the closures walls to get the maximum reduction in cooling energy. In this case we chose to mount them on what nominally is called an enclosure cover, but they could just as easily been mounted on either of the other two sides of the enclosure that are exposed to the air in the room that contains the enclosure. In this LHPL cooling scenario the fans do double duty, simultaneously removing ambient air and cooling the LHPL condenser. In the case where a fan is also mounted on the cover, there is little need for the two internal fans seen in FIG. 20 that blow air through the enclosure, as the extra pair of exhaust fans used to cool the CPUs will provide the same air movement within the enclosure. This approach also reduces ambient air temperatures within the enclosure while simultaneously reducing the speed of the exhaust fan employed to remove hot air from the enclosure, reducing the number of fans needed and at the same time reducing the flow rate required to evacuate ambient air from the enclosure, thereby reducing fan cost and power consumption. For this technology to be commercially viable it needs to operate correctly in all orientations. As the orientation changes, the performance curve of LHPLs is impacted by the change in gravity and whether it helps or reduces flow about the loop. However, for all orientations, it is possible to show that there is some maximum temperature that the LHPL will enable the device being cooled to remain at. For the LHPL to provide adequate cooling, this maximum temperature must be less than the allowed operating temperature of the device being cooled, and if this criterion is not met, some feature of the LHPL will need to be changed to meet this specification. That being said, the problems normally occur at low power and can be partially overcome by employing things like TECs to improve cooling at low power. In the case of a PCIe card, FIGS. 7, 8 and 10 demonstrate how LHPLs can be used to cool components on PCIe and other add in cards.

Our use of the term LHPL includes LHPs, CPLs and ALHPs: devices which employ a pump in the condenser line that heretofore was intended to extend the distance between an evaporator and its condenser. In this disclosure we add another use for pumps in LHPLs, and that is to reduce the operating temperature of the evaporator by reducing the vapor pressure in the evaporator and vapor line. While a miniature LHP has been developed that can reject almost 1,000 Watts per cm squared, one of the problems with this device is that it reaches this transfer rate at an evaporator temperature of 120.degree.C. In the case of a very high performance multi-core semiconductor device, lowering this temperature by adding a vacuum pump in the vapor line that reduced the vapor pressure at the exit point of the wick evaporator produces a hybrid cooling solution that provides both high levels of heat rejection while at the same time preserving some of the passive benefits of LHPL technology. Such an ALHP is actually a hybrid cooling cycle half way between a refrigerator and a Loop Heat Pipe.

Another problem that this disclosure provides a solution for is the use of a single evaporator design employed to cool LHPLs whose condensers and evaporators are separated by different distances. The volume of the lines used to connect components together impacts things like the size of the CC. For a single evaporator to work with designs whose distances vary, balancing line length using either a serpentine shaped liquid return line or by placing a volume in the liquid return line (which converts an LHP into a CPL complicating start up issues) provides a solution that enables the same evaporator to be used in different locations.

To improve the overall thermal resistance of an enclosure cooling solution the crucial issue for us became the design and location of LHPL condensers. Ultimately, it is the transitions that the rejected heat has to make as it passes across the metal barriers separating the working fluids that make the largest contributions to thermal resistance. Improvements to the condensation channel design include reducing the thermal resistance between the condensation channel itself and the devices used to cool the channel and carry off the heat as well as the location of the condenser. In the case of both air and liquid cooled condensers, placing the condensation channel between a pair of cooling devices, including either a pair of fins or a pair of liquid cooled cold plates, results in the best channel performance by minimizing the distance that the heat has to flow through metal to reach the external coolant.

In the case of a serpentine shaped tubular condensation channel, that means placing the tube at the center of the fins. One of the problems with these designs in particular is the intensity of the heat being rejected by the condensation channel, which can be significantly greater in a two phase device than in single phase heat transfer devices. To help distribute this intense heat in the case of an air cooled condenser the solution includes increasing the amount of metal at the base of a fin set. The designs already presented include finned Aluminum condensers where the metal that made contact with the condenser tubing was beefed up and made to wrap around the tubing. A similar design was added to this disclosure in which inexpensive commodity copper CPU heat sinks had channels machined into their base areas making it possible to surround the condensation channel with the base plates of these condensers. In situations where the pressure loss of a serpentine tubular shaped condensation channel presents a problem, a tubular condenser that employs a manifold to distribute and collect the working fluid can be employed to drive a set of fins.

This disclosure includes planar condensation channels that are both air and liquid cooled and which are also placed at the center of the condenser, making it possible to maximize the heat being extracted from the channel. Studies made of these channels at the authors laboratory show that the liquid condenses out along the edges of the channel. To minimize the pressure loss of the channel which helps reduce thermal resistance by reducing vapor pressure losses between the evaporator and the point in the condensation channel where liquid condensate appears, the channel must be kept clear of obstacles. In the ideal case, the heat flows out through both the top and bottom of the channel to either a set of air cooled fins or a flowing liquid on both sides, whose thermal conductivity has been increased, as the low liquid flow rate needs some form of disruptor to bring it into full contact with the condensation channel walls. In situations where the geometry requires that the condensation channel inlet and outlet are on the same side of the channel, the length of the condensation channel can be increased by simply inserting a barrier down the middle that produces a U shaped channel which enables the condensation channel to have its inlet and outlet on the same side.

The original disclosure included a liquid cooled serpentine condenser channel whose performance was enhanced using the techniques mentioned in the prior paragraph that also eliminated heat conducting thermal shorts between the external coolant inlet and outlet and which also employed a counter-flow geometry to maximize the temperature of the external coolant at the condenser outlet, thereby continuing the reduction in thermal resistance. To further improve the performance of this device, a disruptor made of a wire was wound around the serpentine shaped condensation channel before it was enclosed in a liquid cooling jacket. Where possible, these methods should be applied to all liquid cooled condensers and most of them were incorporated in the two new designs. One of the problems with serpentine shaped condensation channels is that they take up a lot of space. In this disclosure the two new compact liquid cooled condensers combine the properties of both the serpentine shaped condensers already disclosed with the properties of the planar air cooled condensers. The first design employs a cylindrical condensation channel while the second employs a planar channel. On both the inside and outside walls of the cylindrical design we provide another pair of cylindrical channels that carry the external liquid coolant. A similar strategy is employed in the planar design to cool the central condensation channel.

An air cooled planar condenser in which both the top and bottom of the condensation channel was simultaneously cooled by a set of fins was employed to cool a pair of CPUs that were each cooled by LHP evaporators that shared the single high performance miniature condenser. Two types of condenser channels were tested: U shape channels in which the working fluid enters and leaves on the same side, and a design in which the flow passes in a straight line. Prior art for the use of a similar planar condenser that only cooled a single side of a condensation channel was found: the performance of this device when compared with our devices would have been limited by both the evaporator and condensation channel design. However a further reading of that patent reveals that what is actually claimed is not any form of LHPL, but rather an ordinary heat pipe that employs a wick filled liquid return line first patented in 1969 (U.S. Pat. No. 3,543,839). This device is missing the secret ingredient of both LHP's and CPL's, which is an evaporator that produces a high speed vapor flow capable of carrying the working fluid about the loop with a minimal loss in pressure. As a consequence, the vapor flow velocity in the condenser is low, making it possible to insert a disruptor into the working fluid to improve heat transfer, something not needed in either an LHP or CPL condensation channel, but which is useful in the external coolant channel when the external coolant is a liquid. Our condenser design provides the exceptional performance required to justify its manufacture for products which need to reject large amounts of heat in small spaces and it includes the use of CC cooling to improve performance accomplished with a carbon strip to remove heat from the CC and conduct it to the body of the air cooled blower.

The lowest thermal resistance electronic enclosure cooling device yet discovered employed liquid cooled LHPs in conjunction with secondary cooling devices that rejected the heat that they collected to the same external liquid coolant. This disclosure provides an exemplary embodiment that elucidates features discussed or pictured in our initial specification which employs flat planar condensers disclosed in the U.S. Provisional Application 60/923,588 filed Apr. 16, 2007 that serve the same function of the liquid cooled serpentine condensers used in FIGS. 18 and 19 and which provide a more compact method of attaching external cooling lines to liquid cooled condensers. This embodiment also uses a vertical ascending plenum seen in FIGS. 21 through 24 that provides coolant to a stack of chassis using spring loaded doors to isolate the plenum from the air within the rack cabinet when the chassis are removed. In this instance, a similar plenum with spring entry slots that close when a node is removed is used to provide protection from spilled liquid coolant. In addition, this chassis has been broken into two sections, one of which holds the server electronics with the second sitting behind it that is sealed to prevent either LHPL condensers or the pipes which feed them from becoming a hazard. This design can be implemented and is drawn with a separation between the two halves providing an internal plenum that makes it possible to build a hybrid chassis in which air is removed to cool a portion of the components while a liquid is used to cool the primary thermal loads. To further enhance the design with a feature we discussed in the first disclosure, we have included a cold plate beneath the motherboard that has vertical risers that can be used to cool particular components such as DIMM modules. Finally, to control the temperature of the coolant leaving the enclosure that is being passed back to an outside device such as a cooling tower exchanging heat with the outside air, we have included an embedded control that can change external coolant flow rates to guarantee that the rejected heat is hot enough to guarantee it can be rejected without the use of energy wasting devices such as water chillers. This control can also be used to fine tune the performance of the LHPL during turn on, shut down and when running at low power by changing the temperature distribution in the LHPL to guarantee. This task is accomplished using a microcontroller that is part of an embedded computer system that simultaneously monitors the temperatures of the devices being cooled and the outlet temperature of the external coolant while at the same time controlling a circuit which controls a valve that is used to adjust the external coolant flow rate through the LHPL condenser. This device can also be used to manage velocity of air cooled LHPL condensers and can be used to solve start up issues in advanced LHPLs related to the movement of working fluid away from the evaporator. It can accomplish these tasks by either cooling the evaporator and its CC or by heating up some other portion of the cooling circuit, forcing working fluid to flow back into the evaporator.

Another issue that needs to be taken into consideration is how do we manage two different liquid coolant streams that get combined at some point into a single external coolant stream. There are several possible approaches. In many systems, the primary heat load is 60% of the total IT load while the secondary is 40%. Eliminating the fans typically needed, changes this to a 70%/30% ratio. In the situation that we investigated in which we cooled a pair of 100Watt primary loads, given a source of 30° C. external liquid coolant, we had no problem meeting the return temperature of 35° C. required by a cooling tower in Atlanta, Ga. running at the hottest day of the year. In fact, we could return coolant whose temperature was 45° C. This delta T was three times the required amount and provides the headroom required to use the liquid coolant we have preheated cooling secondary components to then reject the heat being released by the LHPL condensers. Alternatively, we could have mixed the two heated liquid coolant streams together, and by reducing the flow rate to the LHPL condenser increased the delta T produced by it, making it possible to increase the mixed outlet temperature to the desired 35° C. level.

The liquid cooled 1 U chassis embodiment shown in FIGS. 32 and 33 help to clarify the idea of using cold plates to cool large surface area devices such as printed circuit boards (PCBs) which in turn remove secondary heat from the chassis. PCBs do much more today than simply provide electrical connections to the components that are attached to them. In situations where semiconductors radiate several Watts, the heat can be easily rejected by employing extra connections between the device's numerous power and ground connections to the internal copper planes within the PCB. These connections are made using vias. Many of the current MOSFETs used in DC/DC converters are designed to reject their heat primarily to the PCBs they sit on. Placing a PCB in contact with a cold plate makes it possible to turn the numerous copper planes within it into a global heat exchanger that not only cools the components soldered to it but can help cool the air flowing over it. This last form of heat transfer can be enhanced by simply thermally attaching finned heat exchangers to the PCB. We have discovered that such an approach not only is effective in improving the performance of devices like MOSFETs, but also makes it possible to help cool the air being circulated within an enclosed partially sealed chassis.

Figure 17:
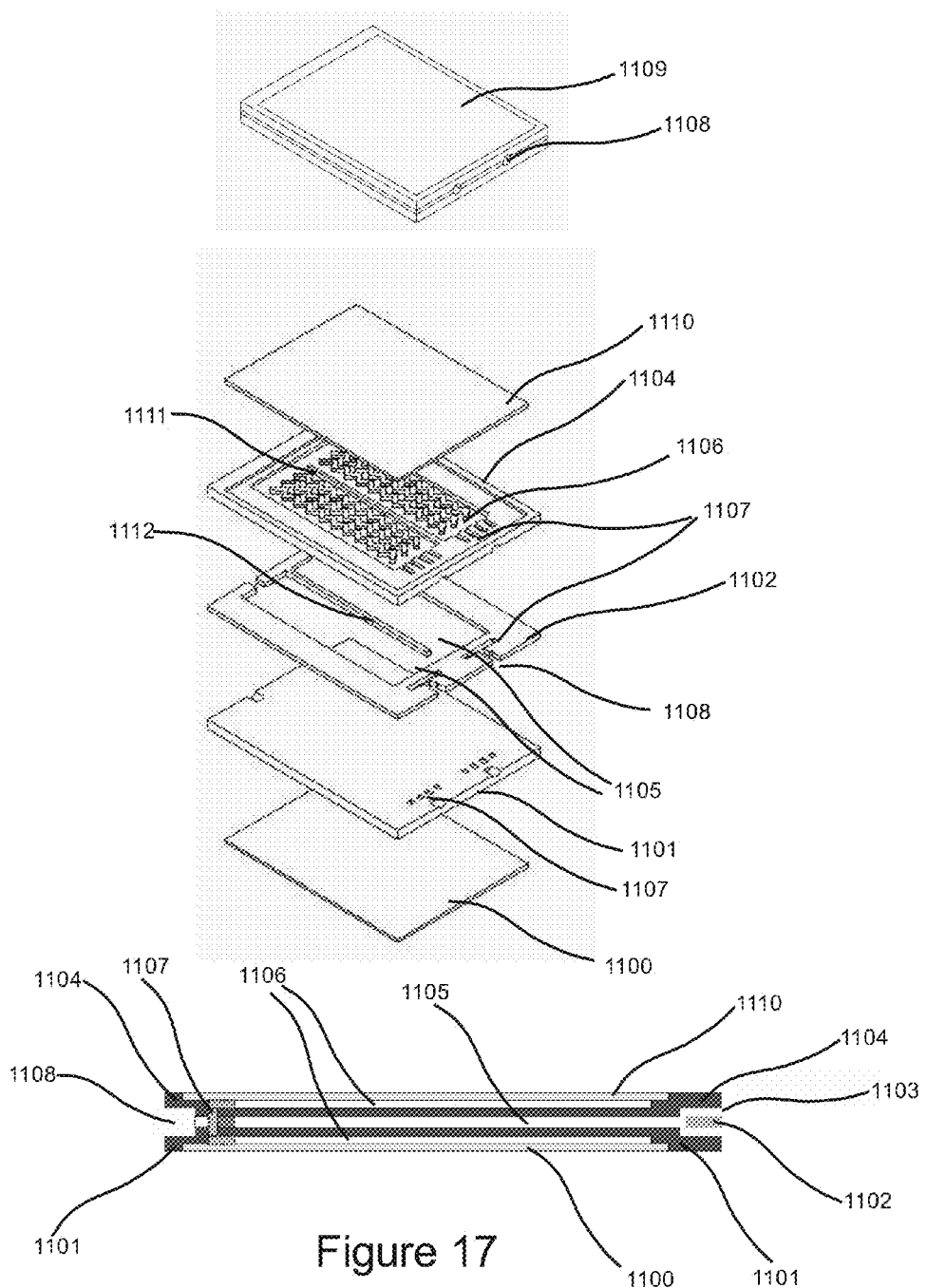
FIG. 17 demonstrates how to create a flat liquid cooled condenser that employs laminar flow disruptors.

FIG. 17 contains an exemplary 3D view of the liquid cooled parallel plate condensers employed in FIGS. 32 and 33. The condenser is made up of five stacked metal plates that are chemically compatible with the working fluid employed. In its design it is similar to the concentric cylinder condenser in FIG. 16, both of which employ laminar flow disruptors which improve mixing between the boundary layer on either side of the condensation channel and the middle of the corresponding flow field. Above and below the condensation channel sit a pair of U shaped condensation channels 1106. Three stacked plates 1101, 1102 and 1104 make this design possible. They are each machined before being joined together about their outer boundaries using an exemplary technique such as soldering or brazing. Once combined into a single object, liquid coolant galleys 1107 are drilled through the joined plates. The middle plate 1102 contains a pair of T shaped galleys on either side that can be seen in the exploded view that enable the external liquid coolant to enter both cooling channels simultaneously, progress around a U shaped channel that is created by a ridge that runs down the middle of 1102 before leaving through the opposite set of galleys. Prior to soldering on the two end caps 1100 and 1110 a four holes get drilled into the side of the structure to link up the cooling lines and LHPL vapor and liquid return lines with their appropriate internal components: the external coolant linking up with the galleys using the holes 1108 and the vapor and liquid return lines linking up with the condensation channel using holes labeled 1103 as seen in the cross sectional view. Looking at the exploded drawing, we can see the two different aspects of the stack components 1101 and 1104, which are identical, except for their orientations, which are opposed. Looking at 1101 in the exploded drawing we can see that it is solid, with the exception of the galley holes 1107. Looking at 1102 in the exploded view we can make out the ridge 1111 going down the middle of the external coolant channel as well as the galley channels 1107 that were cut in the left hand side to create the horizontal portion of the galleys. Going down one layer to 1102 we can see the ridge 1112 that gets sandwiched between 1104 and 1101 and the condensation channel 1105 as well as the galleys 1107 that were machined into this element prior to the coolant galleys being drilled in. The last step in this exemplary design is the attachment of the sealing plates 1100 and 1110. One method of implementing a laminar flow disruptor would be to machine parallel zigzag groves into 1101 and 1104. A less expensive implementation that has the same effect involves molding or sintering a flat planar metal structure with zigzag channels cut into that gets inserted into the cavity that forms the coolant channels before the outer lids are soldered in place. Either approach forces the liquid coolant flowing at small velocities to continuously change directions, improving mixing while at the same time doubling the contact area between the coolant and the thin wall that separates the coolant from the vapor in the condensation channel.

Although the steps of the method of assembling the device illustrated herein may be listed in an order, the steps may be performed in differing orders or combined such that one operation may perform multiple steps. Furthermore, a step or steps may be initiated before another step or steps are completed, or a step or steps may be initiated and completed after initiation and before completion of (during the performance of) other steps.

The preceding description has been presented only to illustrate and describe exemplary embodiments of the methods and systems of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope. The scope of the invention is limited solely by the following claims.

What is claimed is:

1. A cooling device to cool a plurality of heat rejecting components and a plurality of other components, comprising:
   an enclosure housing enclosing the heat rejecting components and the other components; and
   an external heat rejection device including a liquid external coolant that transfers primary heat from a primary cooling system and secondary heat from a secondary cooling system to an environment outside of the enclosure housing, the primary cooling system includes a LHPL device, the primary cooling system cooling a primary heat rejecting component, wherein the primary heat rejecting component is one of the heat rejecting components, the LHPL device includes:
   an evaporator module;
   a condenser module;
   a vapor line;
   a liquid return path; and
   a working fluid having a liquid phase and a vapor phase, wherein the primary heat produced by the primary heat rejecting component being cooled causes the working fluid in the evaporator module to change from the liquid phase to the vapor phase, the vapor phase leaves the evaporator module passing through the vapor line and into the condenser module where the working fluid releases the primary heat absorbed in the evaporator module and returns to the liquid phase, the liquid phase then leaves the condenser module passing through the liquid return path and the working fluid returns to the evaporator module, the evaporator module includes:
   a component evaporator heat spreader;

an evaporator body; and an evaporator component clamp, wherein the component evaporator heat spreader is clamped to the primary heat rejecting component providing thermal contact to transfer the primary heat produced by the primary heat rejecting component being cooled to the evaporator body by reducing the thermal resistance between the primary heat rejecting component and the evaporator body, the evaporator body includes:

an evaporator outer shell;

a working fluid inlet port;

a final compensation chamber;

a working fluid exit port; and an evaporator wick having a plurality of vapor escape channels, wherein the evaporator body receives the working fluid through the working fluid inlet port where the working fluid enters a space between the outer shell, the inlet port and the evaporator wick forming the final compensation chamber before passing by capillary action into the evaporator wick where the working fluid absorbs the primary heat being rejected by one of the heat rejecting components causing the liquid phase of the working fluid to change the vapor phase that carries the primary heat produced by the one of the heat rejecting components out of the evaporator wick through the vapor escape channels into the working fluid exit port, the condenser module includes:

a condenser coolant inlet;

a condenser coolant exit;

a condenser condensation channel;

a condensation channel working fluid inlet;

a condensation channel working fluid exit; and a condensation channel coolant thermal interface that includes a coolant passageway, wherein the working fluid enters the condenser condensation channel through the condensation channel working fluid inlet in the vapor phase, the working fluid changes phase in the condenser condensation channel from the vapor phase back to the liquid phase and leaves the condenser condensation channel through the condensation channel working fluid exit, delivering the primary heat produced by the primary heat rejecting component that was temporarily stored as heat of evaporation within the vapor phase to the external coolant which enters the condenser module through the condenser coolant inlet where the external coolant passes into the coolant passageway, the external coolant then carries away the primary heat produced by the primary heat rejecting component by exiting out of the coolant passageway through the condenser coolant exit, the liquid return path includes:

a liquid tube connected between the condensation channel working fluid exit and the inlet port of the evaporator module;

a gap within the evaporator module between the working fluid inlet port of the evaporator module and an exposed end of the evaporator wick that provides incoming liquid to reach the evaporator wick without a reduction in pressure providing a storage volume thereby resulting in a default compensation chamber;

a plurality of optional compensation chambers located anywhere along the liquid tube;

an optional compensation chamber within the evaporator module between the working fluid inlet port and an exposed surface of the evaporator wick;

a plurality of optional inline chambers located anywhere along the liquid tube within the liquid tube, wherein the liquid phase of the working fluid passes from the condensation channel working fluid exit to the exposed surface of the evaporator wick within the evaporator module with the optional compensation chambers, the optional compensation chamber and the optional inline chambers are located in the evaporator module, attached to the evaporator module, attached to the liquid tube or within the liquid tube providing liquid phase working fluid storage locations, so that when the LHPL device is operating at peak operating power a boundary between the liquid phase of the working fluid and the vapor phase of the working fluid undergoing condensation will approach a point where the liquid phase of the working fluid approaches the condensation channel working fluid exit where the working fluid enters the liquid return path and in cases where the LHPL device with a plurality of different length vapor lines including the vapor line and a plurality of the liquid return paths including the liquid return path are employed in the enclosure housing making it possible to allow a single evaporator module design to work with the different length vapor lines and the liquid return paths, the secondary cooling system includes:

a secondary coolant being a gas circulating through the enclosure housing cooling a secondary heat rejecting component, wherein the secondary heat rejecting component is one of the other components;

a finned heat exchanger in thermal contact with the secondary heat component rejecting its heat to the secondary coolant;

a cold plate through which the external coolant flows that is in thermal contact with one or more secondary components and another finned heat exchanger, and a rotary electric device to direct gas to flow across the finned heat exchanger and the another finned heat exchanger within the enclosure housing, the rotary electric device is within or without the enclosure housing, wherein the secondary heat produced by the secondary heat rejecting component is released to the liquid external coolant by direct thermal contact between the secondary heat rejecting component and the cold plate cooled by the liquid external coolant while simultaneously the secondary coolant circulating through the enclosure housing removes heat from the finned heat exchanger in thermal contact with the secondary heat rejecting component which in turn releases heat of the secondary heat rejecting component to the secondary coolant which is cooled in turn when the heat of the secondary heat rejecting component comes into thermal contact with the finned heat exchanger thermally connected to the cold plate cooled by the liquid external coolant resulting in all of the heat rejected by the heat rejecting secondary component being transferred to the liquid external coolant.

2. The cooling device according to claim 1, wherein the gaseous secondary coolant is air.

3. The cooling device according to claim 1, wherein the condenser module further includes condenser fins, the condenser module is moved to one or more locations where there is more free space within the enclosure housing than exists in either a vicinity or directly above one of the primary heat rejecting components making it possible to employ the condenser module whose fin area is greater than an area available to accommodate the finned heat exchanger mounted directly to the one of the primary components, wherein a velocity of the liquid external coolant over the condenser fins required to get an equivalent amount of cooling to a heat exchanger placed in thermal contact with a primary heat load has been reduced along with a reduction of power required to move the gaseous secondary coolant across the condenser fins while simultaneously improving the reliability of the rotary electric device by reducing a rotational speed of the rotary electric device.

4. The cooling device according to claim 1, wherein the condenser module is situated on a wall of the enclosure housing causing the gaseous secondary coolant leaving the condenser module to exit the enclosure housing without mixing with an ambient coolant within the enclosure housing preventing the gaseous secondary coolant from being heated by the ambient coolant leaving the condenser module wherein the gaseous secondary coolant passing through the condenser module without being pre-heated resulting in a larger temperature difference between ambient air feeding the condenser module and the working fluid passing through the condenser condensation channel which in turn reduces a coolant flow rate required to condense the working fluid further reducing power required to operate the rotary electric device while simultaneously increasing an output temperature of the secondary coolant leaving the condenser module and ultimately increasing a coefficient of performance of a water chiller being used to cool the vapor phase of the working phase being provided to the primary and the secondary cooling systems.

5. The cooling device according to claim 1, wherein the condenser module further includes condenser fins, the one of primary heat rejecting components situated within the enclosure housing further comprises a circuit board that the one of primary heat rejecting components is attached to and which also provides electric power needed to employ the one of primary heat rejecting components while simultaneously providing a mechanism to hold the evaporator module of the LHPL device in thermal contact with the one of primary heat rejecting components along with a method to attach the condenser module of the LHPL device to the enclosure, wherein the evaporator module is thermally clamped to the one of primary heat rejecting components, to mount the condenser module being one of outer walls of the enclosure module, a rotary device mounted either to the condenser module or to one of the walls of the enclosure housing in a position to force gaseous secondary coolant to flow over the condenser fins in the process removing the primary rejected heat from the one of primary heat rejecting components to which the LHPL device is being used to cool.

6. The cooling device according to claim 5, wherein the one of primary heat rejecting components is situated within the enclosure housing further comprising a circuit board that the one of primary heat rejecting components is attached to and which also provides the electric power needed to employ the one of primary heat rejecting components while simultaneously providing a mechanism to hold the evaporator module in thermal contact with the one of primary heat rejecting components along with the condenser module, wherein the evaporator module is thermally clamped to the one of primary heat rejecting components and the rotary device is mounted either to the circuit board or to a nearby structure close enough to the condenser fins to force the gaseous secondary coolant to flow over the condenser fins of the condenser module causing the rejected heat to be deposited in the gaseous secondary coolant flowing through the condenser fins before the gaseous secondary coolant leaves the enclosure housing.

7. The cooling device according to claim 1, wherein the rotary electric device comprises primary and secondary rotary electric devices, the primary and secondary rotary electric devices further comprises a conduit placed at a rear of a rack utilized to hold a chassis out of which the liquid external coolant is removed using a single rotary electric device mounted so as to exhaust the gaseous secondary coolant out of the conduit and provide a coolant flow velocity capable of providing adequate cooling flow to all of the chassis held by the rack and placed in a manner which produces a pressure gradient within the chassis and the conduit that moves the gaseous secondary coolant through the chassis and into the conduit using a plurality of sealed mated holes in both the chassis and the conduit that provide an air tight passageway between the chassis and the conduit wherein the liquid external coolant entering the chassis is pulled through the chassis passing over and through the condenser module and the finned heat exchanger and the another finned heat exchanger within the chassis.

8. The cooling device according to claim 1, wherein the condenser module cooled by the gaseous secondary coolant further comprises one or more heat sinks the condenser condensation channel having a serpentine shape, wherein the serpentine condenser condensation channel is thermally attached to either the one or more heat sinks resulting in the condenser module composed of a single heat sink whose base plate is thermally attached to the condenser condensation channel or the condenser module composed of two or more heat sinks whose base plates are both thermally attached to a condenser condensation channel which is sandwiched between the base plates making it possible to flow the heat between the condenser condensation channel and the base plates of the heat sinks thermally attached to the condenser condensation channel.

9. The cooling device according to claim 1, wherein the condenser module cooled by the gaseous secondary coolant further comprises a multitude of fins each containing a plurality of extruded holes whose spacing matches that of a group of condenser condensation channels including the condenser condensation channel that are part of a network formed by attaching the group of condenser condensation channels to a pair of manifolds, a first manifold of the pair of manifolds of which receives the vapor phase of the working fluid from the line that connects the vapor line to the evaporator module and distributes the vapor phase of the working fluid to the condenser condensation channels attached to the vapor line while a second manifold of the pair of manifolds situated on an opposing side of the network receives the working fluid liquid from the condenser condensation channels attached to it and returns the working fluid to the evaporator module using the liquid return path, wherein the vapor line is created that distributes incoming of the vapor phase of the working fluid to the group of condensation channels which have been thermally attached to the multitude of fins by the extruded holes in the multitude of fins whose spacing makes it possible to stack the multitude of fins over the group of condenser condensation channels creating a thermal transfer mechanism between the group of condenser condensation channels and the multitude of fins that enables a transfer of a heat of condensation from the group of condenser condensation channels to the fins from which the heat of condensation gets passed to the gaseous secondary coolant flowing down the length of the multitude of fins, resulting in the heat being rejected to the gaseous secondary coolant while simultaneously returning the working fluid to liquid phase of the working fluid before the working fluid leaves the condenser module by flowing into an opposing manifold of the pair of manifolds, which is connected to the liquid return path.

10. The cooling device according to claim 1, wherein the primary cooling system further comprises a TEC cooler, a heat spreader and a monitoring and control circuit capable of determining when a power being rejected by the LHPL device falls below a critical level wherein when the power being rejected falls below the critical level, one or more instabilities that occur at low power are avoided by a combination of effects which start with the TEC cooler being turned-on producing a reduction in a temperature of incoming of the liquid phase of the working fluid which reduces a vapor pressure of the liquid phase of the working fluid entering the evaporator module while simultaneously increasing the delta P driving the working fluid around a loop which helps to overcome parasitic heat leaks through the evaporator wick that only occur at low power and which employs the heat spreader that is thermally connected to a side of the TEC cooler which rejects heat being absorbed by the TEC cooler as well as a power utilized to operate the TEC cooler with an end of the evaporator module shell directly above the vapor escape channels which absorbs rejected heat from the device being cooled as well as the heat spreader, and which every Watt of cooling provided by the TEC cooler adds two or more Watts to a load being rejected by the evaporator module which helps to overcome a low power point by increasing a total heat being rejected by the evaporator module.

11. The cooling device according to claim 1, wherein the secondary cooling system further comprises a standard heat pipe and a heat spreader wherein the heat spreader is thermally attached to the secondary heat rejection component and the heat pipe is utilized to conduct heat absorbed by an evaporator of the heat pipe to a location where the heat is exchanged with either the liquid external coolant or a heat receiving end of the evaporator module of the LHPL device.

12. The cooling device according to claim 1, wherein the evaporator module further comprises a flat shell with one or more rounded ends, a pair of end caps with a plurality of holes on opposing ends that accept a vapor tube and the liquid tube and a the evaporator wick within the flat shell which has two sets of the vapor escape channels wherein the pair of end caps are sealed to the flat shell to produce a vacuum tight seal between material utilized to form the flat shell and the end caps as well as between the end caps and the vapor tube and liquid tube and which is also chemically compatible with the working fluid employed, with the vapor escape channels mounted on the opposing ends of the flat shell making it possible to inject heat into either side of the evaporator shell by clamping a surface of the flat shell to heat loads thermally attached to either side.

13. The cooling device according to claim 1, wherein the evaporator module further comprises a heat spreader that encases one or more cylindrical evaporator shells employed to cool a single one of the primary heat rejecting components wherein the heat spreader is made of a thermally conducting material that encases the one or more cylindrical evaporators shells and has a flat surface that is thermally attached to the single one of the primary heat rejecting components being cooled as well as a mounting mechanism pressing the heat spreader against a surface of the single one of the primary heat rejecting components being cooled that rejects the heat being absorbed by the one or more cylindrical evaporators shells.

14. The cooling device according to claim 1, wherein the condenser condensation channel further comprises a laminar flow disruptor employed on either side of the condenser condensation channel that causes a boundary layer flow on either side of the condenser condensation channel to mix with a flow at a center of the condenser condensation channel on whichever side employs a laminar flow disruptor wherein the heat transfer between the working fluid and the liquid external coolant is improved.

15. A cooling device to cool a plurality of heat rejecting components and a plurality of other components, comprising:
an enclosure housing enclosing the heat rejecting components and the other components;
an external heat rejection device including a liquid external coolant that transfers primary heat from a primary cooling system and secondary heat from a secondary cooling system to an environment outside of the enclosure housing, the primary cooling system includes a LHPL device, the primary cooling system cooling a primary heat rejecting component, wherein the primary heat rejecting component is one of the heat rejecting components, the LHPL device includes:
an evaporator module;
a condenser module;
a vapor line;
a liquid return path; and
a working fluid having a liquid phase and a vapor phase, wherein the primary heat produced by the primary heat rejecting component being cooled causes the working fluid in the evaporator module to change from the liquid phase to the vapor phase, the vapor phase leaves the evaporator module passing through the vapor line and into the condenser module where the working fluid releases the primary heat absorbed in the evaporator module and returns to the liquid phase, the liquid phase then leaves the condenser module passing through the liquid return path and the working fluid returns to the evaporator module, the evaporator module includes:
a component evaporator heat spreader;
an evaporator body; and
an evaporator component clamp, wherein the component evaporator heat spreader is clamped to the primary heat rejecting component providing thermal contact to transfer the primary heat produced by the primary heat rejecting component being cooled to the evaporator body by reducing the thermal resistance between the primary heat rejecting component and the evaporator body, the evaporator body includes:
an evaporator outer shell;
a working fluid inlet port;
a final compensation chamber;
a working fluid exit port; and
an evaporator wick having a plurality of vapor escape channels, wherein the evaporator body receives the working fluid through the working fluid inlet port where the working fluid enters the final compensation chamber located within the evaporator body before passing by capillary action into the evaporator wick where the working fluid absorbs the primary heat being rejected by one of the primary heat rejecting components causing the liquid phase of the working fluid to change the vapor phase that carries the primary heat produced by the one of the primary heat rejecting components out of the evaporator wick through the vapor escape channels into the working fluid exit port, the condenser module includes:
a condenser coolant inlet;
a condenser coolant exit;
a condenser condensation channel;

a condensation channel working fluid inlet;
a condensation channel working fluid exit; and
a condensation channel-coolant thermal interface further comprises a coolant passageway; wherein the working fluid enters the condenser condensation channel through the condenser condensation channel working fluid inlet in the vapor phase, the working fluid changes phase in the condenser condensation channel from the vapor phase back to the liquid phase and leaves the condensation channel through the condensation channel working fluid exit, delivering the primary heat produced by the primary heat rejecting component that was temporarily stored as heat of evaporation within the vapor phase to the external coolant which enters the condenser module through the condenser coolant inlet where the external coolant passes into the coolant passageway, the external coolant then carries away the primary heat produced by the primary heat rejecting component by exiting out of the coolant passageway through the condenser coolant exit, the liquid return path includes:
a liquid tube connected between the condensation channel working fluid exit and the inlet port of the evaporator module;
a gap within the evaporator module between the working fluid inlet port of the evaporator module and an exposed end of the evaporator wick that provides incoming liquid to reach the evaporator wick without a reduction in pressure providing a storage volume thereby resulting in a default compensation chamber;
a plurality of optional compensation chambers located anywhere along the liquid tube;
an optional compensation chamber within the evaporator module between the inlet port and an exposed surface of the evaporator wick;
a plurality of optional inline chambers located anywhere along the liquid tube within the liquid tube, wherein the condensed phase working fluid passes from the condensation channel working fluid exit to the exposed surface of the wick within the evaporator module with the optional compensation chambers, the optional compensation chamber and the optional inline chambers are located in the evaporator module, attached to the evaporator module, attached to the liquid tube or within the liquid tube providing liquid phase working fluid storage locations, so that when the LHPL device is operating at peak operating power a boundary between the liquid phase working fluid and the vapor phase of the working fluid undergoing condensation will approach a point where the liquid phase of the working fluid approaches the condensation channel working fluid exit where the working fluid enters the liquid return path and in cases where the LHPL device with a plurality of different length vapor lines including the vapor line and a plurality of the liquid return paths including the liquid return path are employed in the enclosure housing making it possible to allow a single evaporator module design to work with the different length vapor lines and the liquid return paths, the secondary cooling system includes:
a secondary coolant, the secondary cooling system cooling a secondary heat rejecting component, wherein the secondary heat rejecting component is one of the other components;
an air cooled finned heat exchanger that is in thermal contact with the secondary heat rejecting component; and
a rotary electric device for directing air across the air cooled finned heat exchanger and the secondary heat rejecting component to convection cool of the secondary heat rejecting component, wherein the secondary heat produced by the secondary heat rejecting component is released to the secondary coolant, the secondary coolant releases the secondary heat to the air cooled finned heat exchanger, and the air cooled finned heat exchanger releases the secondary heat to the liquid external coolant.

16. The cooling device according to claim 15, wherein the primary cooling system further comprises a TEC cooler, a heat spreader and a monitoring and control circuit capable of determining when a power being rejected by the LHPL device falls below a critical level wherein when the power being rejected falls below the critical level, one or more instabilities that occur at low power are avoided by a combination of effects which start with the TEC cooler being turned-on producing a reduction a temperature of incoming of the liquid phase of the working fluid which reduces a vapor pressure of the liquid phase of the working fluid entering the evaporator module while simultaneously increasing the delta P driving the working fluid around a loop which helps to overcome parasitic heat leaks through the evaporator wick that only occur at low power and which employs the heat spreader that is thermally connected to a side of the TEC cooler which rejects heat being absorbed by the TEC cooler as well as a power utilized to operate the TEC cooler with an end of the evaporator module shell directly above the vapor escape channels which absorbs rejected heat from the device being cooled as well as the heat spreader, and which every Watt of cooling provided by the TEC cooler adds two or more Watts to a load being rejected by the evaporator module which helps to overcome a low power point by increasing a total heat being rejected by the evaporator module.

17. The cooling device according to claim 15, wherein the secondary cooling system further comprises a standard heat pipe and a heat spreader wherein the heat spreader is thermally attached to the secondary heat rejection component and the heat pipe is utilized to conduct heat absorbed by the an evaporator of the heat pipe to a location where the heat is exchanged with either the liquid external coolant or a heat receiving end of the evaporator module of the LHPL device.

18. The cooling device according to claim 15, wherein the evaporator module further comprises a flat shell with one or more rounded ends, a pair of end caps with a plurality of holes on opposing ends that accept a vapor tube and liquid tube and the evaporator wick within the flat shell which has two sets of the vapor escape channels wherein the pair of end caps are sealed to the flat shell to produce a vacuum tight seal between material utilized to form the flat shell and the end caps as well as between the end caps and the vapor tube and liquid tube and which is also chemically compatible with the working fluid employed, with the vapor escape channels mounted on the opposing ends of the flat shell making it possible to inject heat into either side of the evaporator shell by clamping a surface of the flat shell to heat loads thermally attached to either side.

19. The cooling device according to claim 15, wherein the evaporator module further comprises a heat spreader that encases one or more cylindrical evaporator shells employed to cool a single one of the primary heat rejecting components wherein the heat spreader is made of a thermally conducting material that encases the one or more cylindrical evaporators shells and has a flat surface that is thermally attached to the single one of the primary heat rejecting components being cooled as well as a mounting mechanism pressing the heat spreader against a surface of the single one of the primary heat rejecting components being cooled that rejects the heat being absorbed by the one or more cylindrical evaporators shells.

20. The cooling device according to claim 15, wherein the condenser condensation channel further comprises a laminar flow disruptor employed on either side of the condenser condensation channel that causes a boundary layer flow on either side of the condenser condensation channel to mix with a flow at a center of the condenser condensation channel on whichever side employs a laminar flow disruptor wherein the heat transfer between the working fluid and the liquid external coolant is improved.

* * * * *